United States Patent [19]
Komatsuda et al.

[11] Patent Number: 6,049,374
[45] Date of Patent: Apr. 11, 2000

[54] ILLUMINATION APPARATUS, A PROJECTION EXPOSURE APPARATUS HAVING THE SAME, A METHOD OF MANUFACTURING A DEVICE USING THE SAME, AND A METHOD OF MANUFACTURING THE PROJECTION EXPOSURE APPARATUS

[75] Inventors: Hideki Komatsuda, Kawasaki; Kazuo Ushida, Tokyo, both of Japan

[73] Assignee: Nikon Corporation, Tokyo, Japan

[21] Appl. No.: 09/042,434

[22] Filed: Mar. 13, 1998

[30] Foreign Application Priority Data

| Mar. 14, 1997 | [JP] | Japan | 9-061579 |
| Mar. 12, 1998 | [JP] | Japan | 10-061766 |

[51] Int. Cl.$^7$ ............................. G03B 27/54; G03B 27/42
[52] U.S. Cl. ................................. 355/67; 355/53
[58] Field of Search ................. 355/53, 50, 67, 355/71, 77, 68; 356/399, 400, 401; 250/548, 492.2, 49.22; 359/618, 798

[56] References Cited

U.S. PATENT DOCUMENTS

| 4,497,015 | 1/1985 | Konno et al. | 362/268 |
| 4,619,508 | 10/1986 | Shibuya et al. | 353/122 |
| 4,851,978 | 7/1989 | Ichihara | 362/268 |
| 4,918,583 | 4/1990 | Kudo et al. | 362/268 |
| 4,939,630 | 7/1990 | Kikuchi et al. | 362/268 |
| 5,237,367 | 8/1993 | Kudo | 355/67 |
| 5,245,384 | 9/1993 | Mori | 355/67 |
| 5,253,110 | 10/1993 | Ichihara et al. | 359/619 |
| 5,307,207 | 4/1994 | Ichihara | 359/622 |
| 5,329,336 | 7/1994 | Hirano et al. | 355/53 |
| 5,335,044 | 8/1994 | Shiraishi | 355/53 |
| 5,392,094 | 2/1995 | Kudo | 355/67 |
| 5,420,417 | 5/1995 | Shiraishi | 250/205 |
| 5,448,336 | 9/1995 | Shiraishi | 355/71 |
| 5,591,958 | 1/1997 | Nishi et al. | 250/205 |
| 5,594,526 | 1/1997 | Mori et al. | 355/67 |
| 5,615,047 | 3/1997 | Komatsuda et al. | 359/618 |
| 5,646,715 | 7/1997 | Wangler | 355/67 |
| 5,961,944 | 1/1999 | Nishi | 355/68 |

FOREIGN PATENT DOCUMENTS

| 64-42821 | 2/1989 | Japan . |
| 7-183200 | 7/1995 | Japan . |

*Primary Examiner*—Howard B. Blankenship
*Assistant Examiner*—Hung Henry Nguyen
*Attorney, Agent, or Firm*—Eugene Lieberstein; Michael N. Meller

[57] ABSTRACT

An illumination apparatus is provided capable of obtaining identical line widths at all positions in an image surface. A projection exposure apparatus using this illumination apparatus is also provided as well as a method of manufacturing the projection exposure apparatus and a method of manufacturing a device using this apparatus. The illumination apparatus includes a light source system for supplying a light beam, an optical integrator for forming a plurality of light sources based on a light beam from the light source and a condenser optical system for converging beams from the plurality of light sources for illuminating an illuminated surface. The apparatus also has a filter placed in a location that is in an optically conjugate relationship to the illuminated surface. The filter has at least a first area corresponding to a first portion of the plurality of light sources, and a second area corresponding to a second portion of the plurality of light sources other than the first portion. The filter has at least one first filter element having a first transmissivity distribution provided over the entirety of the first area of the filter. The filter also has at least one second filter element having a second transmissivity distribution that is the inverse of the first transmissivity distribution provided over the entirety of the second area of the filter.

40 Claims, 32 Drawing Sheets

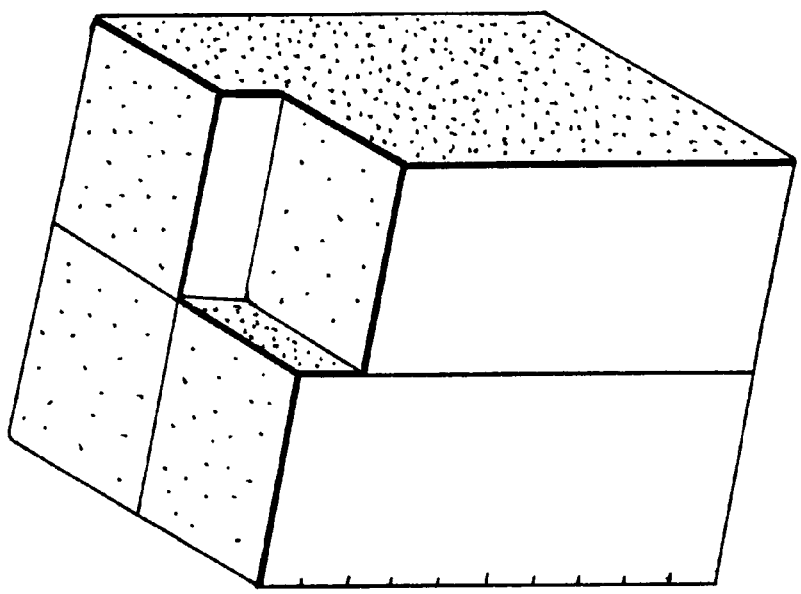
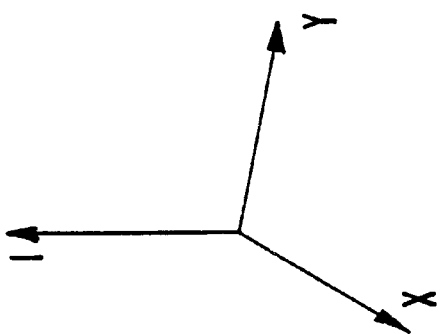
FIG. 3

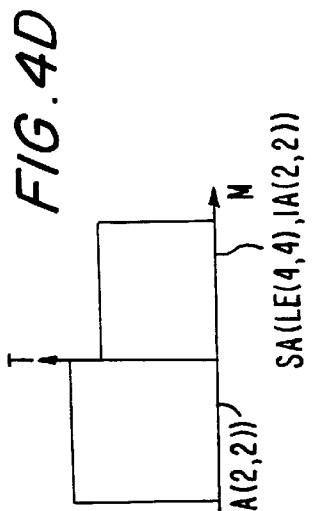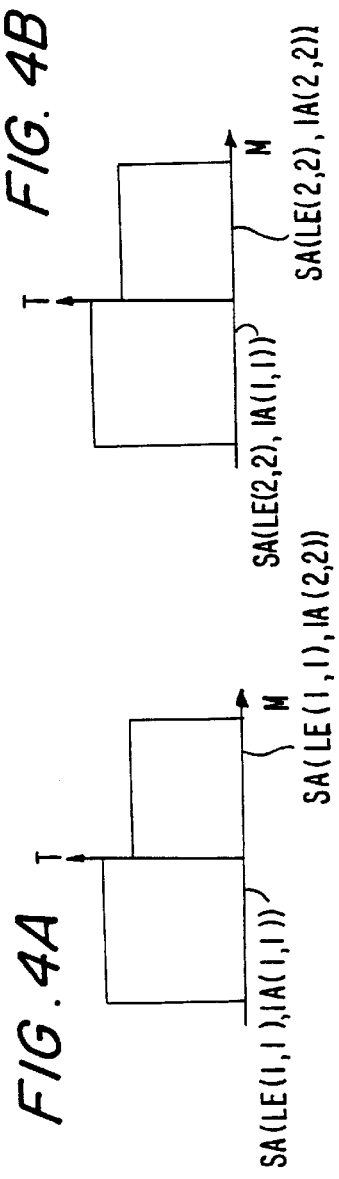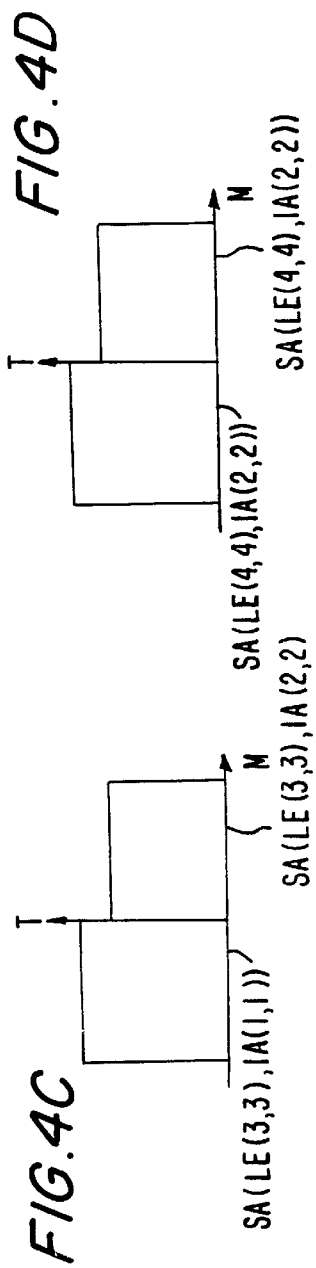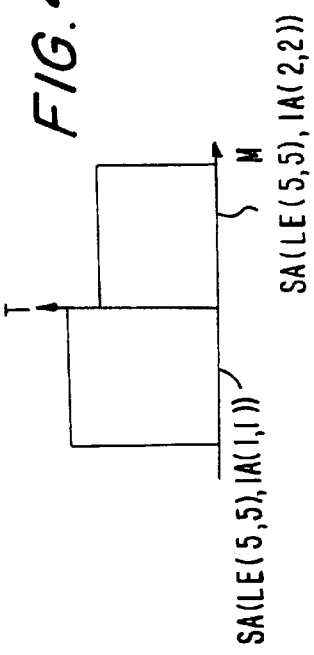

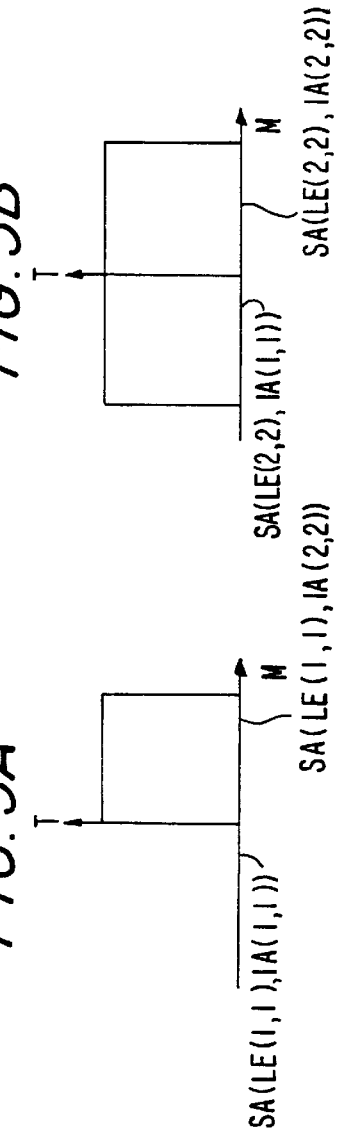
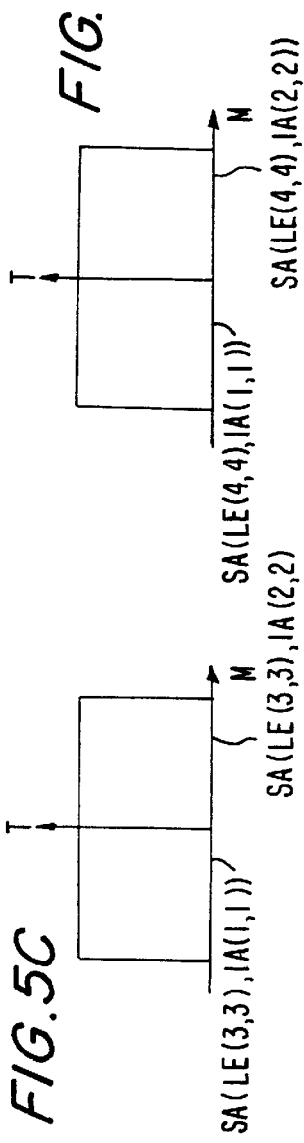
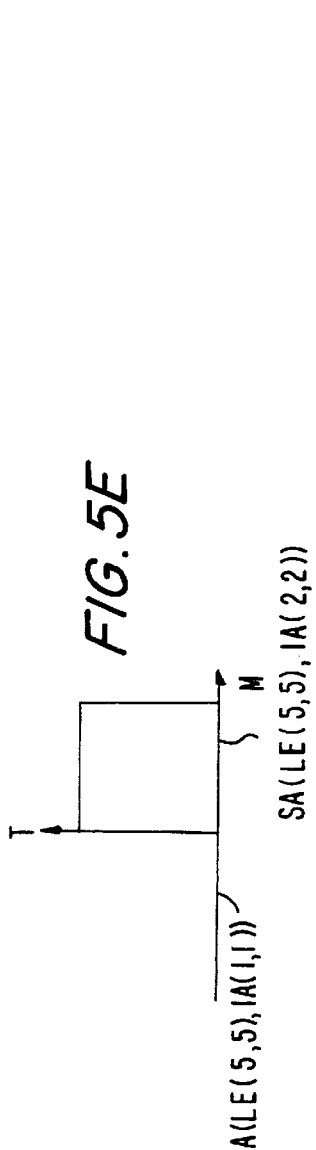

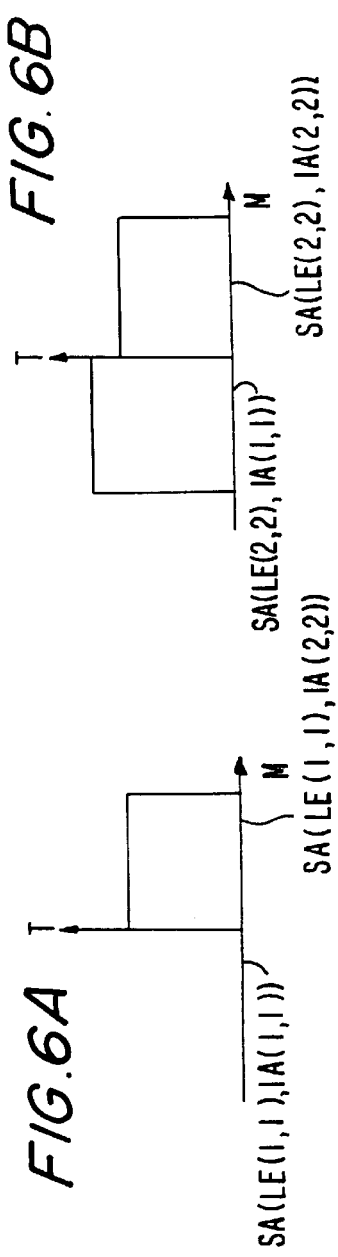
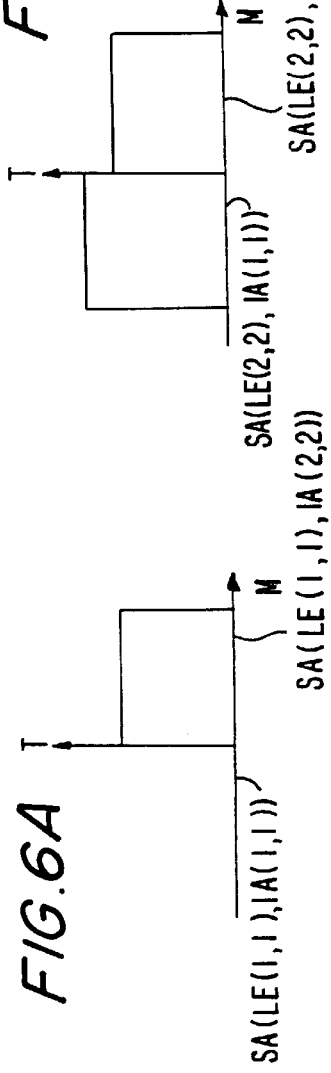
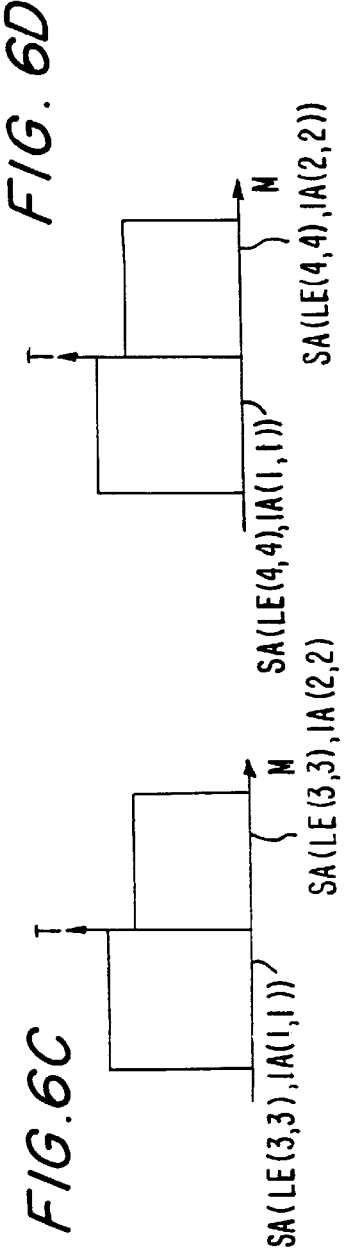
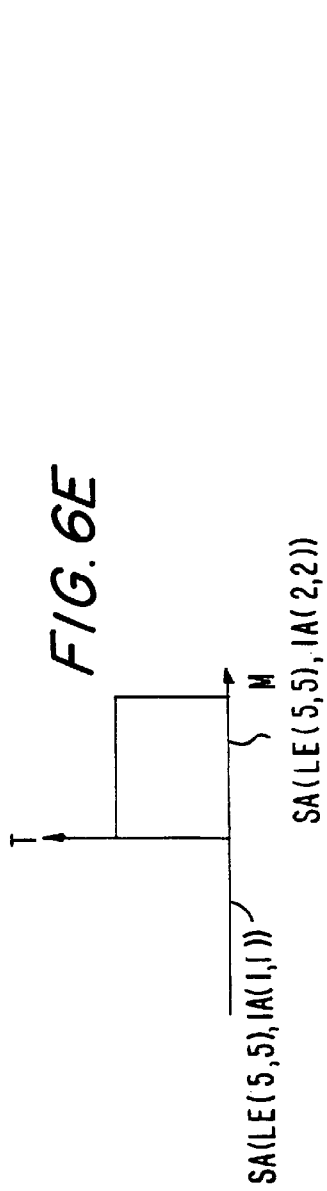

FIG. 19
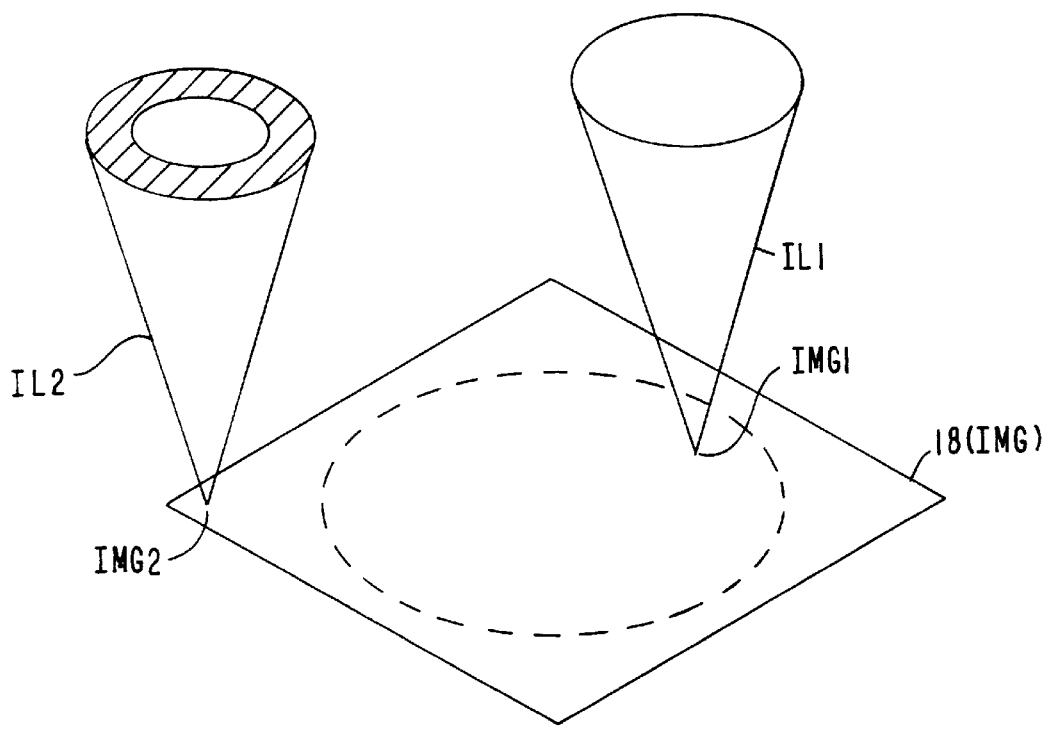
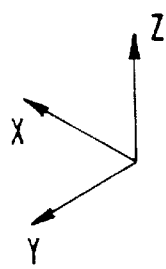
FIG. 20
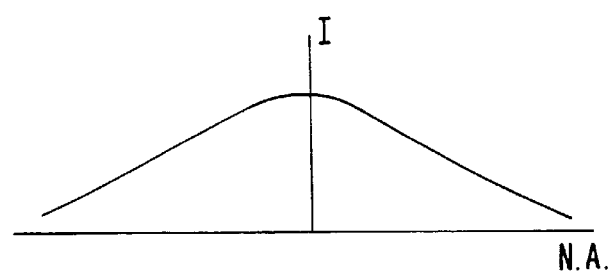

FIG. 25
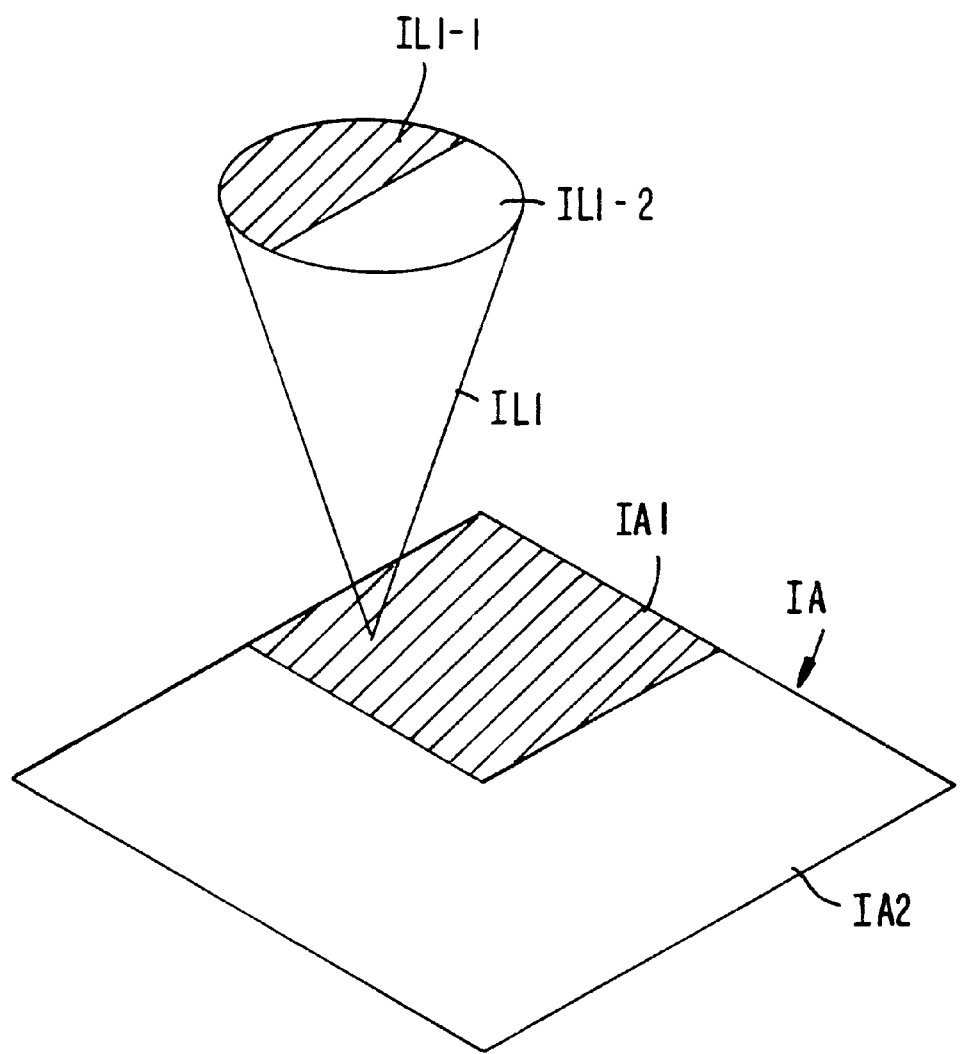
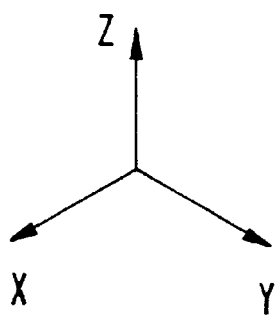

FIG. 28
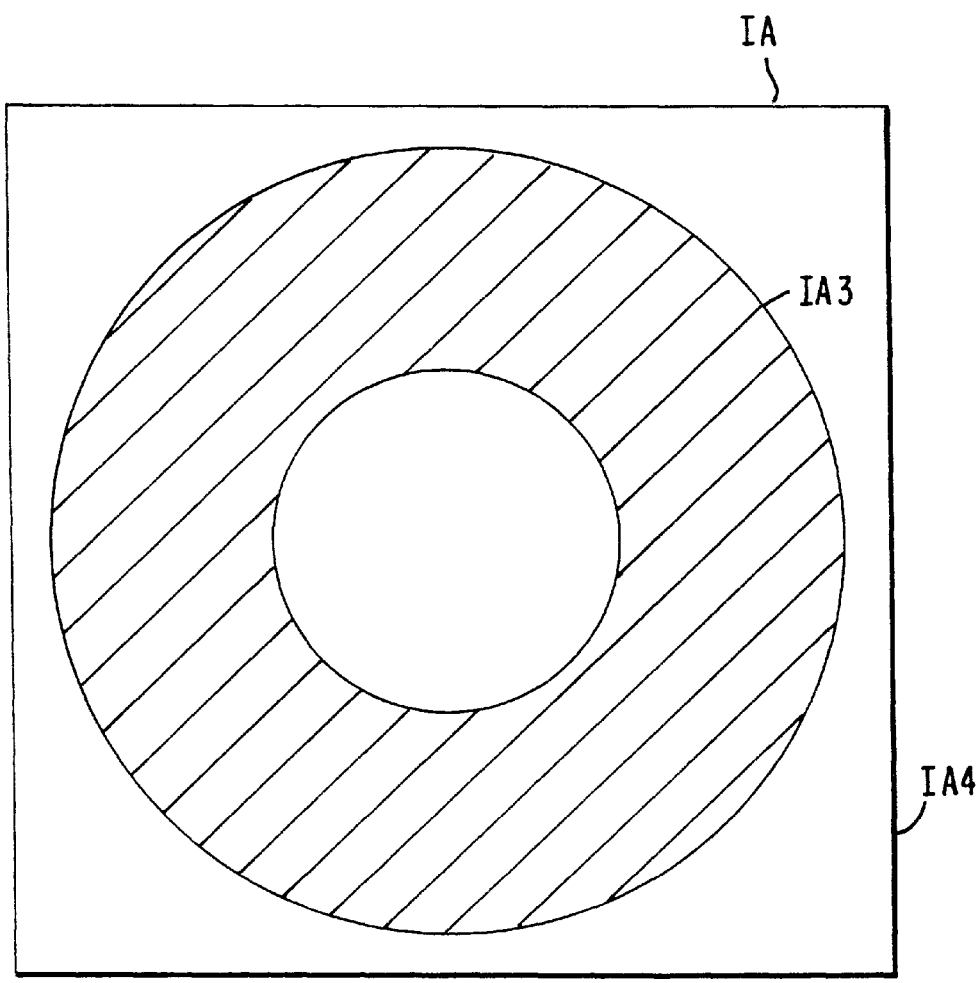
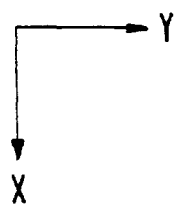

ILLUMINATION APPARATUS, A PROJECTION EXPOSURE APPARATUS HAVING THE SAME, A METHOD OF MANUFACTURING A DEVICE USING THE SAME, AND A METHOD OF MANUFACTURING THE PROJECTION EXPOSURE APPARATUS

BACKGROUND OF THE INVENTION (1) Field of the Invention

In projection exposure apparatus for transferring images of masks, reticles, etc. onto substrates in lithography processes for fabricating semiconductor devices, image pickup devices, liquid crystal display devices, thin-film magnetic heads, etc., the present invention relates to:

an illumination apparatus for illuminating the masks or reticles in the projection exposure apparatus;

a projection exposure apparatus that includes this illumination apparatus;

a method for manufacturing devices using the projection exposure apparatus; and a method for manufacturing the projection exposure apparatus.

(2) Background of the Related Art

Conventional illumination apparatus of the type used in projection exposure apparatus is commonly configured to correct illuminance nonuniformities at the illuminated surface in order to obtain uniform illuminance distribution.

With recent improvements in the precision of resolved images, however, problems have surfaced in that line widths that were supposed to be the same as the original dimensions end up being different. These problems primarily involve image height (or if the image height is the same, differences in the meridional and sagittal directions). When pattern line width differs according to location, this can degrade the value of the devices being fabricated. In a logic circuit, for example, it can reduce the amount of data that can be processed in a given amount of time.

SUMMARY OF THE INVENTION

Accordingly, a first objective of the present invention is to provide an illumination apparatus capable of obtaining identical line widths at all positions in an image surface; a projection exposure apparatus using this illumination apparatus; a method of manufacturing this projection exposure apparatus; and a method of manufacturing a device using this apparatus.

A second objective of the present invention is to provide an illumination apparatus capable of controlling pattern line widths, as desired, at any desired location in the image surface; a projection exposure apparatus using this illumination apparatus; a method of manufacturing this projection exposure apparatus; and a method of manufacturing a device using this apparatus.

To achieve the above objectives, in a first mode of the present invention, the illumination apparatus comprises a light source system for supplying a light beam; an optical integrator for forming a plurality of light sources based on a light beam from said light source; and a condenser optical system for converging beams from said plurality of light sources for illuminating an illuminated surface.

It also has a filter placed in a location that is in an optically conjugate relationship to said illuminated surface, or in the proximity of said location, said filter having at least a first area corresponding to a first portion of said plurality of light sources, and a second area corresponding to a portion of said plurality of light sources other than said first portion.

Here, at least one first filter element having a first transmissivity distribution is provided over the entirety of said first area of said filter; and at least one second filter element having a second transmissivity distribution that is the inverse of said first transmissivity distribution is provided over the entirety of said second area of said filter.

Also, to achieve the above objectives, in a second mode of the invention, the illumination apparatus comprises a light source system for supplying a light beam; an optical integrator for forming a plurality of light sources based on a light beam from said light source; and a condenser optical system for converging beams from said plurality of light sources, for illuminating an illuminated surface.

It also has a filter placed in a location that is in an optically conjugate relationship to said illuminated surface, or in the proximity of said location, said filter having at least a first area corresponding to a first portion of said plurality of light sources, and a second area corresponding to a portion of said plurality of light sources other than said first portion;

Here, at least one first filter element having a first transmissivity distribution is provided over the entirety of said first area of said filter; and at least one second filter element having a second transmissivity distribution is provided over the entirety of said second area of said filter.

Here, said first and second filter elements are set up to transform to a prescribed light intensity distribution, independently for light converging at prescribed points on said illuminated surface, the light intensity distribution in the Fourier transform planes of microsurfaces constituting said illuminated surface, while maintaining substantially unchanged, the relative illuminance distributed over said illuminated surface.

Also, to achieve the above objectives, in a third mode of the present invention, the illumination apparatus comprises a light source system for supplying a light beam; an optical integrator for forming a plurality of light sources based on a light beam from said light source; and a condenser optical system for converging beams from said plurality of light sources for illuminating an illuminated surface.

It also has a first filter, placed in a location that is in an optically conjugate relationship to said illuminated surface, or in the proximity of said location, said filter having transmissivity distribution such as to transform, independently, for light (converging at prescribed points on said illuminated surface, the light intensity distribution in the Fourier transform planes of microsurfaces constituting said illuminated surface, to prescribed light distributions; and a second filter, placed in a location that is in an optically conjugate relationship to said illuminated surface, or in the proximity of said location, said filter having transmissivity distribution for correcting at least nonuniformity of relative illumination distributed over said illuminated surface caused by the transmissivity distribution of said first filter.

Also, in this third mode of the present invention, it is preferable that said first filter and said second filter be provided in a single unit.

Also, to achieve the above objectives, a projection exposure apparatus in a fourth mode of the present invention, for transferring to a substrate, a prescribed pattern provided on a projection plate, comprises:

a light source system for supplying a light beam;

an optical integrator for forming a plurality of light sources based on a light beam from said light source;

a condenser optical system for converging beams from said plurality of light sources for illuminating said mask or reticle;

a projection optical system for projecting onto said substrate placed at an image surface, said prescribed pattern on said mask or reticle; and a filter, placed in a location that is in an optically conjugate relationship to said image surface, or in the proximity of said location, said filter having at least a first area corresponding to a first portion of said plurality of light sources, and a second area corresponding to a portion of said plurality of light sources other than said first portion;

wherein, at least one first filter element having a first transmissivity distribution is provided over the entirety of said first area of said filter; and at least one second filter element having a second transmissivity distribution that is the inverse of said first transmissivity distribution is provided over the entirety of said second area of said filter.

Also, to achieve the above objectives, a projection exposure apparatus in a fifth mode of the present invention, for transferring to a substrate, a prescribed pattern provided on a mask or reticle, comprises:

a light source system for supplying a light beam;

an optical integrator for forming a plurality of light sources based on a light beam from said light source;

a condenser optical system for converging beams from said plurality of light sources for illuminating said mask or reticle;

a projection optical system for projecting onto said substrate placed at an image surface, said prescribed pattern on said mask or reticle; and a filter, placed in a location that is in an optically conjugate relationship to said image surface, or in the proximity of said location, said filter having at least a first area corresponding to a first portion of said plurality of light sources, and a second area corresponding to a portion of said plurality of light sources other than said first portion;

wherein, at least one first filter element having a first transmissivity distribution is provided over the entirety of said first area of said filter; and at least one second filter element having a second transmissivity distribution that is the inverse of said first transmissivity distribution is provided over the entirety of said second area of said filter;

or at least one first filter element having a first transmissivity distribution is provided over the entirety of said first area of said filter;

at least one second filter element having a second transmissivity distribution is provided over the entirety of said second area of said filter; and said first and second filter elements transform to a prescribed light intensity distribution, independently for light converging at prescribed points on said image surface, the light intensity distribution in the Fourier transform planes of microsurfaces constituting said image surface, while maintaining substantially unchanged, the relative illuminance distributed over said image surface.

Also, to achieve the above objectives, a projection exposure apparatus in a sixth mode of the present invention, for transferring to a substrate, a prescribed pattern provided on a mask or reticle, comprises:

a light source system for supplying a light beam;

an optical integrator for forming a plurality of light sources based on a light beam from said light source;

a condenser optical system for converging beams from said plurality of light sources for illuminating said mask or reticle;

a projection optical system for projecting onto said substrate placed at an image surface, said prescribed pattern on said mask or reticle;

a first filter, placed in a location that is in an optically conjugate relationship to said image surface, or in the proximity of said location, said filter having transmissivity distribution such as to transform, independently, for light converging at prescribed points on said image surface, the light intensity distribution in the Fourier transform planes of microsurfaces constituting said image surface, to prescribed light intensity distributions; and a second filter, placed in a location that is in an optically conjugate relationship to said image surface, or in the proximity of said location, said filter having transmissivity distribution for correcting at least nonuniformity of relative illumination distributed over said illuminated surface caused by the transmissivity distribution of said first filter.

Also, in this sixth mode of the present invention, it is preferable that said first filter and said second filter be provided in a single unit.

Also, to achieve the above objectives, in a seventh mode of the present invention, a method of manufacturing a projection exposure apparatus for projecting, onto a substrate, a prescribed pattern formed on a mask or reticle, the method comprises the following steps:

a first step of guiding a light beam from a light source through an optical integrator for forming a plurality of light sources based on said light beam, a condenser optical system for converging light from said optical integrator, for illuminating said mask or reticle, a projection optical system for forming, on a prescribed image surface, an image of said pattern on said mask or reticle, and onto the image surface of said projection optical system;

a second step of measuring the relative illuminance distributed on said image surface, and measuring, in the Fourier transform planes of the microsurfaces that constitute said image surface, the light intensity distributions for light converging at at least two points on said image surface;

a third step of placing in a location that is in an optically conjugate relationship to said image surface, or in the proximity of said location, a filter having at least a first area corresponding to a first portion of said plurality of light sources, and a second area corresponding to a portion of said plurality of light sources other than said first portion; and a fourth step of providing, over the entirety of said first area of said filter, at least one first filter element having a first transmissivity distribution, while also providing, over the entirety of said second area of said filter, at least one second filter element having a second transmissivity distribution;

wherein, in said fourth step, said first and second transmissivity distributions are set so as to maintain said relative illuminations distributed in said image surface substantially uniform, while transforming said light intensity distributions, independently, to prescribed light intensity distributions.

Also, to achieve the above objectives, in an eighth mode of the present invention, a method of manufacturing a projection exposure apparatus for projecting, onto a substrate, a prescribed pattern formed on a mask or reticle, the method comprises the following steps:

a first step of simulating the guiding of a light beam from a light source through
   an optical integrator for forming a plurality of light sources based on said light beam,
   a condenser optical system for converging light from said optical integrator, for illuminating said mask or reticle,
   a projection optical system for forming, on a prescribed image surface, an image of said pattern on said mask or reticle, and
   onto the image surface of said projection optical system;

a second step of computing the relative illuminations distributed on said image surface, and computing the light intensity distribution in the Fourier transform planes of the microsurfaces that constitute said image surface, for light converging at at least two points on said image surface, based on the results obtained in said simulation of said first step;

a third step of setting in a location that is in an optically conjugate relationship to said image surface, or in the proximity of said location, a filter having at least a first area corresponding to a first portion of said plurality of light sources, and a second area corresponding to a portion of said plurality of light sources other than said first portion; and a fourth step of setting, over the entirety of said first area of said filter, at least one first filter element having a first transmissivity distribution, while also setting, over the entirety of said second area of said filter, at least one second filter element having a second transmissivity distribution;

wherein, in said fourth step, said first and second transmissivity distributions are set so as to maintain said relative illuminations distributed on said image surface substantially uniform, while transforming said light intensity distributions, independently, into prescribed light intensity distributions.

BRIEF DESCRIPTION OF THE DRAWINGS

FIG. 3 is a diagram showing the illuminance distribution occurring on an illuminated surface when localized numerical aperture correction is performed;

FIG. 4 shows transmissivity distribution for canceling the illumination distribution of FIG. 3, with FIGS. 4A, 4B, 4C, 4D, and 4E, respectively, showing the transmissivity distributions for lens elements LE(1,1), LE(2,2), LE(3,3), LE(4,4), and LE(5,5);

FIG. 5 shows transmissivity distribution for performing localized numerical aperture corrections, with FIGS. 5A, 5B, 5C, 5D, and 5E, respectively, showing the transmissivity distributions for lens elements LE(1,1), LE(2,2), LE(3,3), LE(4,4), and LE(5,5), respectively;

FIG. 6 shows transmissivity distribution for performing localized numerical aperture corrections while maintaining the illumination distribution in the illuminated surface unchanged, with FIGS. 6A, 6B, 6C, 6D, and 6E, respectively, showing the transmissivity distributions for lens elements LE(1,1), LE(2,2), LE(3,3), LE(4,4), and LE(5, 5), respectively;

FIG. 19 is a drawing for describing the states of beams incident to an image surface;

FIG. 20 shows a desired light intensity distribution to be obtained within the aperture of a beam;

FIG. 25 is a drawing used to describe the state of a beam incident to the image surface;

FIG. 28 is a drawing used to describe a desired image surface illuminance distribution;

DETAILED DESCRIPTION OF THE PREFERRED EMBODIMENTS

Figure 1:
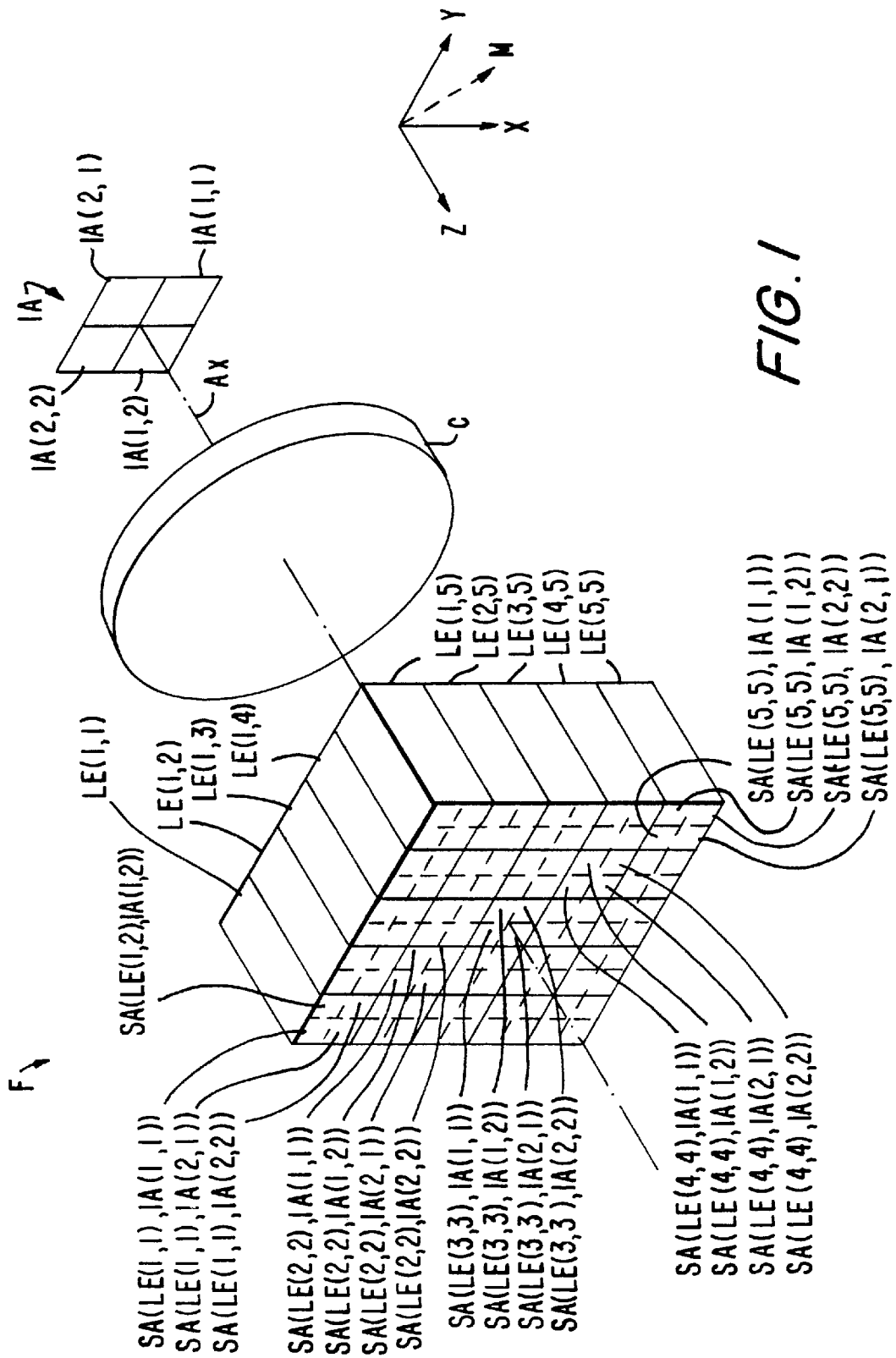
FIG. 1, a drawing to explain the principles of the present invention, is an oblique view with the arrangement of the optics shown horizontally.
Figure 2:
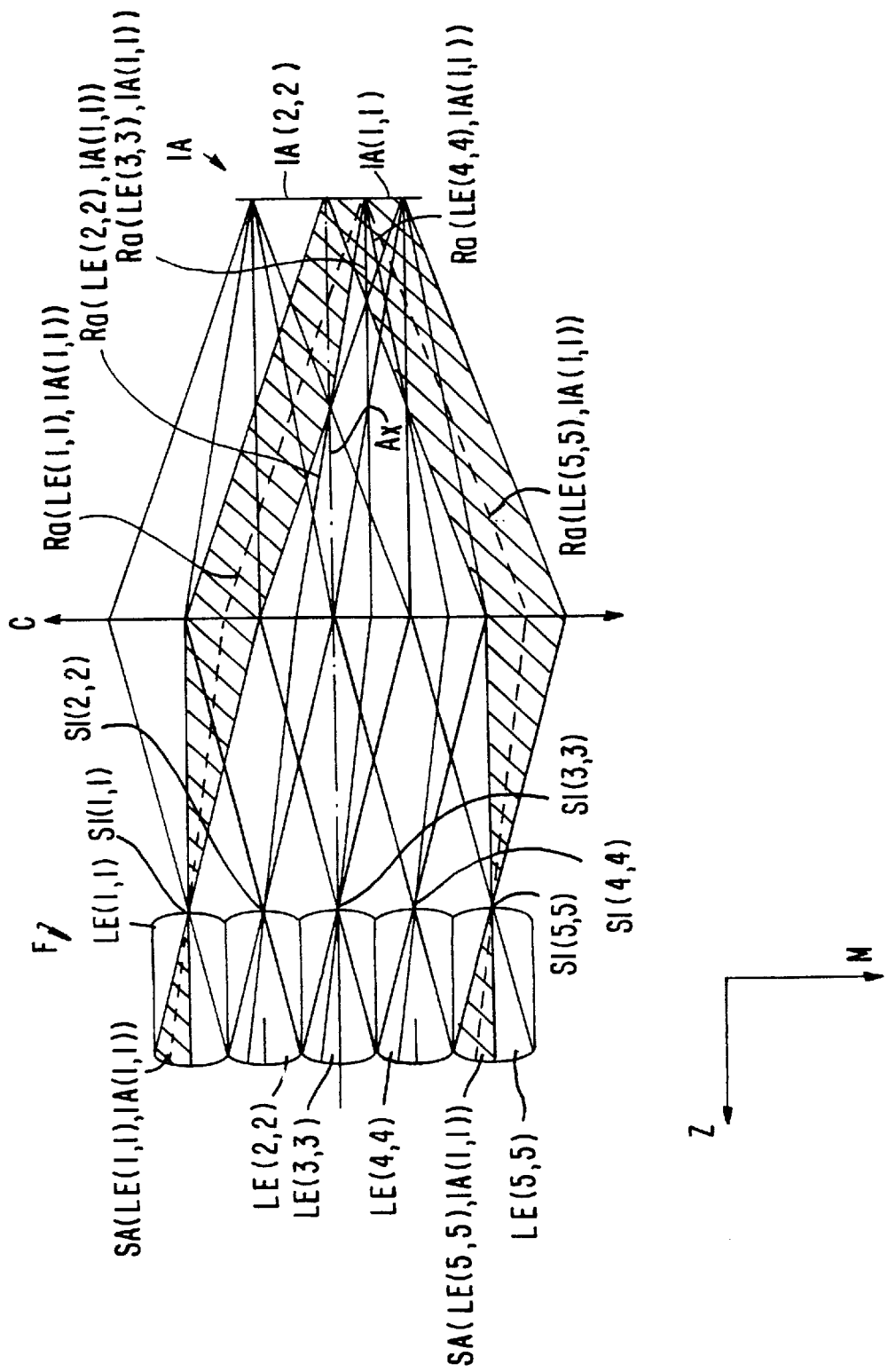
FIG. 2 is a light path diagram showing the light paths in the optical arrangement of FIG. 1.

First, the principles of the above-described inventions will be explained. FIG. 1 is an oblique view of the basic optical configuration of the optical system of the present invention, depicted horizontally. FIG. 2 is a diagonal cross-section showing the light paths of the system in FIG. 1; i.e., a cross-section taken in the direction 45 degrees displaced from the X and Y directions (hereinafter referred to as the M direction). A diagonal line drawn between the upper left and lower right corners of the fly-eye lens F, as shown in FIG. 1, is drawn in the M direction. In FIG. 1, the fly-eye lens F, used as an optical integrator, is constructed by integrating a plurality of lens elements LE(1,1) through LE(5,5), in the XY plane. The fly-eye lens F in the example of FIG. 1 consists of a 5×5 matrix of lens elements. Incident upon the fly-eye lens F is a light beam from a light source system (not illustrated), placed in the -Z direction of FIG. 1. As shown in FIG. 2, the lens elements LE(1,1) through LE(5,5), that constitute the fly-eye lens F, converge light beams from the light source system, forming a plurality of source images, SI(1,1) through SI(5,5), respectively, at their exit ends.

A condenser lens system C is positioned so that its front focus is located at the multiple source image position. This condenser lens C converges light from the multiple source images to superimposingly illuminate the illuminated surface IA. In this optical configuration, each of the entrance surfaces of the lens elements LE(1,1) through LE(5,5) that make up the fly-eye lens F is in an optically conjugate relationship with the illuminated surface IA. Also, the surface in which the multiple source images are formed is an optical Fourier transform plane for the illuminated surface IA.

Returning to FIG. 1, for the purposes of the following description, the illuminated surface IA is divided into the four areas IA(1,1), IA(1,2), IA(2,1), and IA(2,2). Also for the following description, the entrance surface of each of the lens elements LE(1,1) through LE(5,5) making up the fly-eye lens F is also subdivided into four subareas. The entrance surface of lens element LE(1,1), for example, is subdivided into the four subareas SA(LE(1,1),IA(1,1)), SA(LE(1,1),IA(1,2)), SA(LE(1,1),IA(2,1)), and SA(LE(1,1),IA(2,2)).

Here, for area IA(1,1) of illuminated surface IA, there are 25 conjugate subarea locations (the upper left subarea of each lens element, as seen in FIG. 1):

subarea SA(LE(1,1),IA(1,1)) of the entrance surface of lens element LE(1,1), subarea SA(LE(1,2),IA(1,1)) of the entrance surface of lens element LE(1,2), . . .

subarea SA(LE(2,2),IA(1,1)) of the entrance surface of lens element LE(2,2), . . .

subarea SA(LE(3,3),IA(1,1)) of the entrance surface of lens element LE(3,3), . . .

subarea SA(LE(4,4),IA(1,1)) of the entrance surface of lens element LE(4,4), . . .

subarea SA(LE(5,5),IA(1,1)) of the entrance surface of lens element LE(5,5).

As shown in FIG. 2, the beams passing through the subareas in each of these 25 locations pass through the condenser lens C to arrive at area IA(1,1) of the illuminated surface IA. Because FIG. 2 shows a cross-section, it shows only the beams for the lens elements located along the M direction diagonal: LE(1,1), LE(2,2), LE(4,4) and LE(5,5). Also, for simplicity, the following description will address the M direction only.

Rays incident to the area IA(1,1) of the illuminated surface IA are as follows:

the ray Ra(LE(1,1),IA(1,1)), which passes through the subarea SA(LE(1,1),IA(1,1)) of the entrance surface of lens element LE(1,1) and the source image SI(1,1) formed by lens element LE(1,1);

the ray Ra(LE(2,2),IA(1,1)), which passes through the subarea SA(LE(2,2),IA(1,1)) of the entrance surface of lens element LE(2,2) and the source image SI(1,1) formed by lens element LE(2,2);

the ray Ra(LE(3,3),IA(1,1)), which passes through the subarea SA(LE(3,3),IA(1,1)) of the entrance surface of lens element LE(3,3) and the source image SI(1,1) formed by lens element LE(3,3);

the ray Ra(LE(4,4),IA(1,1)), which passes through the subarea SA(LE(4,4),IA(1,1)) of the entrance surface of lens element LE(4,4) and the source image SI(1,1) formed by lens element LE(4,4); and the ray Ra(LE(5,5),IA(1,1)), which passes through the subarea SA(LE(5,5),IA(1,1)) of the entrance surface of lens element LE(5,5) and the source image SI(1,1) formed by lens element LE(5,5).

Now, if the subarea SA(LE(1,1),IA(1,1)) of the entrance surface of lens element LE(1,1) and the subarea SA(LE(5,5),IA(1,1)) of the entrance surface of lens element LE(5,5) are shaded (shielded from), the rays Ra(LE(1,1),IA(1,1)) and Ra(LE(5,5),IA(1,1)) will not be incident in the area IA(1,1) of the illuminated surface IA. Only the rays Ra(LE(2,2),IA(1,1)), Ra(LE(3,3),IA(1,1)), and Ra(LE(4,4),IA(1,1)) will be incident therein. This means that the area IA(1,1) of the illuminated surface IA is being illuminated based on light from the secondary light source made up of multiple source images SI(2,2), SI(3,3), and SI(4,4).

Also, returning to FIG. 1, the subareas that are conjugate with the area IA(1,2) of the illuminated surface IA, are as follows:

subarea SA(LE(1,2),IA(1,2)) of the entrance surface of lens element LE(1,1) through subarea SA(LE(5,5),IA (1,2)) of the entrance surface of lens element LE(5,5);

the subareas that are conjugate with the area IA(2,1) of the illuminated surface IA are subarea SA(LE(1,1),IA(2, 1)) of the entrance surface of lens element LE(1,1) through subarea SA(LE(5,5),IA(2,1)) of the entrance surface of lens element LE(5,5), and the subareas that are conjugate with the area IA(2,2) of the illuminated surface IA are subarea SA(LE(1,1),IA(2, 2)) of the entrance surface of lens element LE(1,1) through subarea SA(LE(5,5),IA(2,2)) of the entrance surface of lens element LE(5,5).

Therefore, even if the subarea SA(LE(1,1),IA(1,1)) of the entrance surface of lens element LE(1,1) and the subarea SA(LE(5,5),IA(1,1)) of the entrance surface of lens element LE(5,5) are shaded as described above, because; in the beams incident to areas IA(1,2), IA(2,1), and IA(2,2), respectively, of illuminated surface IA, there are no light beams that have passed through the above subareas SA(LE (1,1),IA(1,1)) and SA(LE(1,1),IA(5,5)); the areas IA(1,2), IA(2,1) and IA(2,2) of the illuminated surface IA are illuminated based on light from the secondary light source made up of multiple source images SI(1,1), SI(2,2), SI(3,3), SI(4, 4), and SI(5,5).

In other words, area IA(1,1) of illuminated surface IA is illuminated by a secondary light source made up of the multiple source images SI(2,2), SI(3,3), and SI(4,4); and the areas IA(1,2), IA(2,1) and IA(2,2) of the illuminated surface IA are illuminated by a secondary light source made up of the multiple source images SI(1,1), SI(2,2), SI(3,3), SI(4,4), and SI(5,5). In this manner, the light intensity distribution in the secondary light source location for light beams incident to area IA(1,1) of illuminated surface IA (the light intensity distribution in the Fourier transform plane of the illuminated surface IA) can be made to be different from the light intensity distribution in the secondary light source location for the beams incident to the other areas of illuminated surface IA, IA(1,2), IA(2,1), and IA(2,2).

As shown in FIG. 3, which is a graph showing the illuminance distribution in illuminated surface IA, when the subarea SA(LE(1,1),IA(1,1)) of the entrance surface of lens element LE(1,1) and the subarea SA(LE(5,5),IA(1,1)) of the entrance surface of lens element LE(5,5) are shaded, the illuminance I(IA(1,1)) in area IA(1,1) of illumination surface IA is lower than the illuminances I(IA(1,2)), I(IA(2,1)), and I(IA(2,2)) in the other areas IA(1,2), IA(2,1), and IA(2,2)), making the illuminance distribution on the illuminated surface IA nonuniform.

Because, as discussed above, illuminated surface IA is in an optically conjugate relationship with the entrance surfaces of the lens elements LE(1,1) through LE(5,5), transmissivity distributions adapted to cancel the illuminance distribution nonuniformity shown in FIG. 3 can be established at the entrance surfaces of each of the lens elements LE(1,1) through LE(5,5). For the following description, refer to FIGS. 4 through 6.

FIG. 4 shows the transmissivity distributions that would be required to cancel the illuminance distribution nonuniformity of FIG. 3. In FIG. 4, FIGS. 4A, 4B, 4C, 4D, and 4E, respectively, show the transmissivity distribution required to be established at locations in the M direction of the entrance surface of lens element LE(1,1), LE(2,2), LE(3,3), LE(4,4), and LE(5,5).

As shown in FIG. 4, because, in the light intensity distribution of illuminated surface IA, the light intensity in area IA(1,1) is lower than that in area IA(2,2), transmissivity distribution should be established at the entrance surface of the lens elements LE(1,1) through LE(5,5), such that the transmissivity in the subareas corresponding to area IA(2,2) (that is, SA(LE(1,1),IA(2,2)), SA(LE(2,2),IA(2,2)), SA(LE (3,3),IA(2,2)), SA(LE(4,4),IA(2,2)) and SA(LE(5,5),IA(2, 2))), will be lower than that in the subareas corresponding to area IA(1,1), (that is, SA(LE(1,1),IA(1,1)), SA(LE(2,2),IA (1,1)), SA(LE(3,3),IA(1,1)), SA(LE(4,4),IA(1,1)) and SA(LE(5,5),IA(1,1))). Also, although not shown in FIG. 4, the transmissivity of the subareas corresponding to areas IA(1,2) and IA(2,1) would be made equal to that in the subareas corresponding to area IA(2,2).

Also, to change the light intensity distribution in the Fourier transform plane of the illuminated surface, for beams incident to multiple locations on illuminated surface IA, since subareas SA(LE(1,1),IA(1,1)) and SA(LE(5,5),IA (1,1)) in the entrance surface of lens element LE(1,1) and lens element LE(5,5) are shaded, the transmissivity distribution in this shaded state for each of the lens elements LE(1,1) through LE(5,5), would be as shown in FIG. 5.

FIG. 5 shows graphs of the transmissivity distributions at entrance surfaces of each of the lens elements LE(1,1) through LE(5,5), with subarea SA(LE(1,1),IA(1,1)) at the entrance surface of lens element LE(1,1) and subarea SA(LE (5,5),IA(1,1)) at the entrance surface of lens element LE(5, 5) shaded; with FIGS. 5A, 5B, 5C, 5D, and 5E showing the transmissivity distribution in the M direction of the entrance surface of lens element LE(1,1), LE(2,2), LE(3,3), LE(4,4), and LE(5,5), respectively.

As shown in FIG. 5, the transmissivity of subareas SA(LE(1,1)IA(1,1)) and SA(LE(5,5),IA(1,1)) is 0%, and the transmissivity of all other subareas is 100%.

Actually, the transmissivity distribution required to be established at the entrance surfaces of each of the lens elements LE(1,1) through LE(5,5) of the fly-eye lens F is the product (the multiplication result) of the distributions shown in FIGS. 4 and 5. This transmissivity distribution is shown in FIG. 6. FIG. 6 shows the transmissivity distribution obtained by combining the transmissivity distributions of FIGS. 4 and 5, with FIGS. 6A, 6B, 6C, 6D, and 6E showing the transmissivity distributions in the M direction at the entrance surfaces of lens elements LE(1,1), LE(2,2), LE(3, 3), LE(4,4), and LE(5,5), respectively.

FIGS. 6A and 6E show that the transmissivity distribution at the entrance surfaces of lens elements LE(1,1) and LE(5, 5) is such that transmissivity increases in the +M direction, while FIGS. 6B, 6C, and 6D show that the transmissivity distribution at the entrance surfaces of lens elements LE(2, 2), LE(3,3) and LE(4,4) is such that transmissivity decreases in the +M direction. Thus the transmissivity distribution at the entrance surfaces of lens elements LE(1,1) and LE(5,5) is the inverse of that at lens elements LE(2,2), LE(3,3), and LE(4,4).

Assume now, that at an optically conjugate position relative to the illuminated surface IA, we establish, as described above, a first area, which consists of the area made up of the entrance surfaces of lens elements LE(1,1) and LE(5, 5), corresponding to one portion (that is, IS(1,1) and IS(5,5)) of the multiple illumination sources IS(1,1) through IS(5,5) formed by the fly-eye lens F; and a second area, which consists of the area made up of the entrance surfaces of lens elements LE(2,2), LE(3,3) and LE(4,4), corresponding to a different portion (that is, IS(2,2), IS(3,3), and IS(4,4)), of the many illumination sources IS(1,1) through IS(5,5) formed by the fly-eye lens F.

Further assume that two filter elements having a first transmissivity distribution as shown in FIGS. 6A and 6E are provided over the entirety of said first area; and that three filter elements having a second transmissivity distribution changing in the opposite direction relative to said first transmissivity distribution, as shown in each of FIGS. 6B through 6D, are provided over the entirety of said second area.

In a system configured according to the above assumptions, then, it will be possible not only to maintain uniform illuminance over the illuminated surface IA, but also to independently control the light intensity distribution at each of the secondary light source locations for beams incident to each of multiple locations on the illuminated surface IA (the light intensity distribution in the Fourier transform plane for the illuminated surface IA). Consequently, it will also be possible to control the pattern line width at desired locations within the image surface.

The above description used an example in which the desired transmissivity distribution was established directly at the entrance surfaces of the lens elements LE(1,1) through LE(5,5) that constitute the fly-eye lens F. The same result may be accomplished, however, by providing a filter with the prescribed transmissivity distribution in the proximity of this entrance surface (in the proximity of a location conjugate to the illuminated surface). The advantage of doing it this way is that it eliminates some of the working of the entrance surfaces of lens element LE(1,1) through LE(5,5) of the fly-eye lens F, thus making the system easier to manufacture. Another way to obtain the desired transmissivity distribution would be to use a multilayer dielectric film having the prescribed transmissivity distribution characteristic, provided either on the entrance surfaces of the lens elements LE(1,1) through LE(5,5), or on the filter. It would also be feasible to provide an aggregate of microdots (an aggregate of microdots in a dense pattern) with a density distribution that provides the prescribed shading or transmissivity distribution on the above entrance surfaces or filters.

Also, while the above example involved only one direction, the present invention is not limited to a single direction.

Next, an example will be described in which the light intensity distribution within the apertures of the beams incident to the measurement points is measured at multiple measurement points arranged in a matrix on the illuminated surface, and (corrections are made, based on the measurement results, to make the light intensity distribution within the aperture constant across the multiple aperture points.

In this system, the light intensity distribution within the apertures of beams incident at prescribed points on the illuminated surface will correspond to the light intensity distribution of the light beams at the optical Fourier transform plane for the illuminated surface. If the optical system that exists between the above Fourier transform plane and the illuminated surface (the condenser optical system) is an ideal system with an $f_{sin\theta}$ projection function: a system free of aberrations other than distortion, and in which transmissivity is always (constant, regardless of the light path, there will be a one-to-one correspondence between the above light intensity distribution within the aperture, and in the Fourier transform plane.

Figure 7:
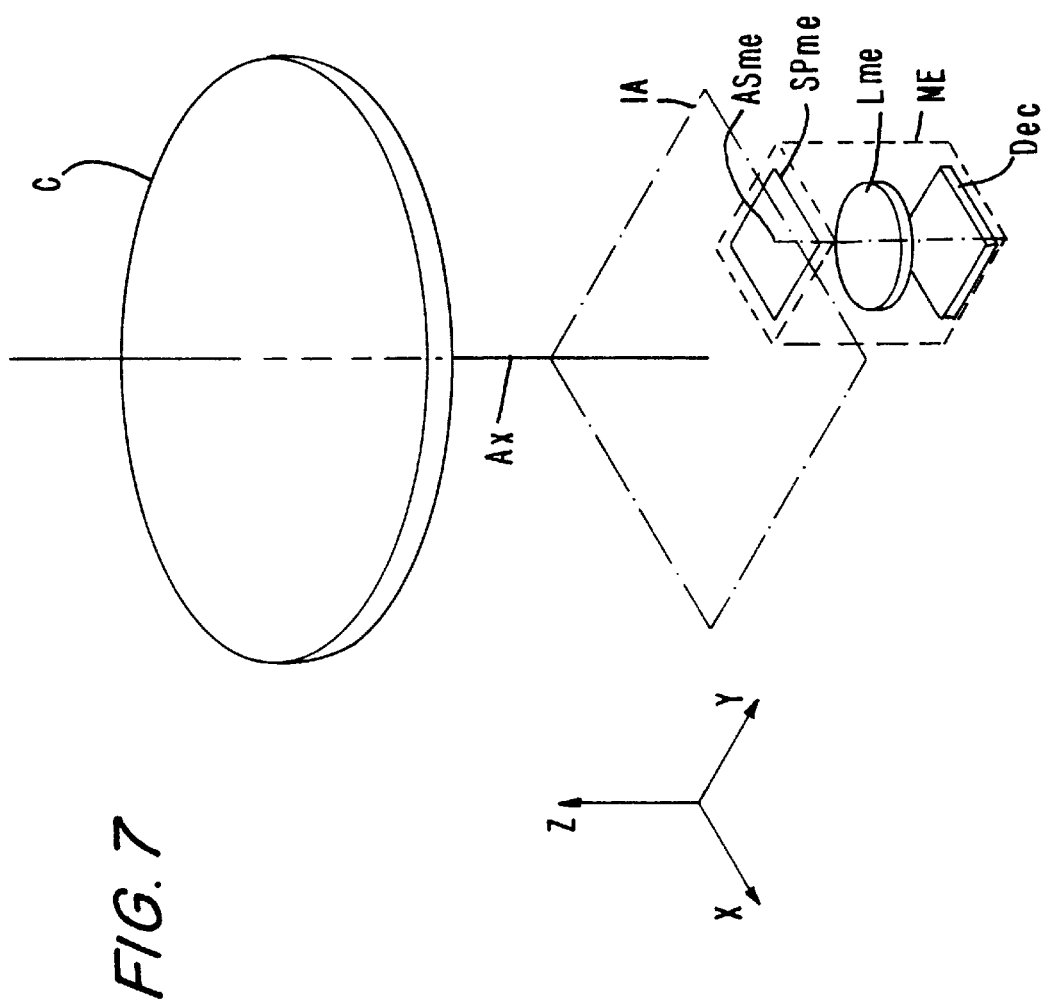
FIG. 7 is an oblique view of a configuration for measuring the light intensity distributions within the apertures of beams converging at an illuminated surface.
Figure 8A:
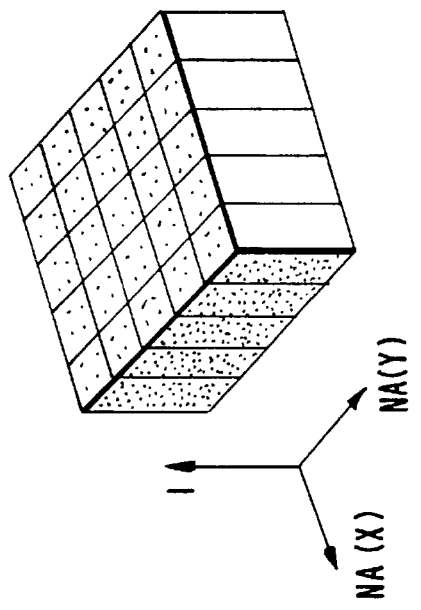
FIG. 8 shows an example of measurement results obtained by the measurement system of FIG. 7, with FIGS. 8A, 8B, 8C, and 8D showing the light intensity distributions in the apertures of beams incident in areas IA(1,1), IA(1,2), IA(2,1), and IA(2,2), respectively, of an illuminated surface IA.
Figure 8B:
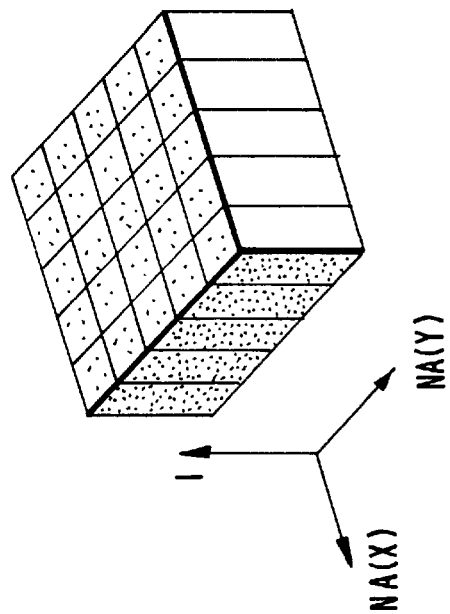
Figure 8C:
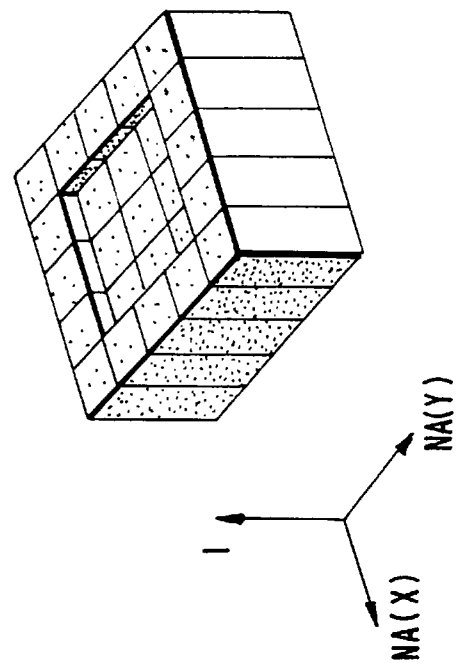
Figure 8D:
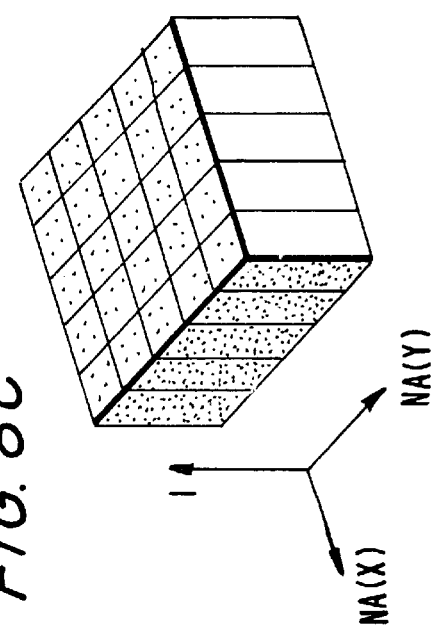

First, FIG. 7 will be used to describe an optical configuration for performing the above measurements. In FIG. 7, the measurement system ME consists of a shade plate $SP_{me}$ with the pinhole aperture $AS_{me}$, which is placed on the illuminated surface IA; a convergence optical system $L_{me}$, placed such that its front focus will be located at the aperture $AS_{me}$; and a detector $D_{ec}$, which is made up of a photoelectric conversion device (e.g., a two-dimensional CCD), placed at the rear focal point of the convergence optical system $L_{me}$. The shade plate $SP_{me}$, convergence optical system $L_{me}$, and detector $D_{ec}$ are supported as a single unit that is movable in the XY directions of FIG. 7. The sense point of the measurement system ME is located at the pinhole aperture $AS_{me}$. It is therefore possible to take measurements at multiple locations in the illuminated area IA by repeatedly moving the measurement system ME in the XY directions and taking measurements.

It is preferable, then, that an ideal $f_{sin\theta}$ optical system be used: the measurement system ME, should be free of aberrations other than distortion, have constant transmissivity in any light path, and satisfy the ideal $f_{sin\theta}$ projection relation.

With respect to the optical system formed by combining the convergence optical system $L_{me}$ with condenser optical system C, the detector $D_{ec}$ is in a conjugate relationship with multiple light sources (not illustrated) positioned at the forward focus of condenser optical system C. Therefore, formed on this detector $D_{ec}$ will be an image (multiple light source image) of the beam passing through the aperture $AS_{me}$ in shade plate $SP_{me}$ (the measurement system sense point). This image will have a light intensity distribution equivalent to the light intensity distribution in the Fourier transform plane of the illuminated surface IA. Now, if the convergence optical system $L_{me}$ is not the ideal $f_{sin\theta}$ optical system described above, the light intensity distribution sensed by the detector $D_{ec}$ may not correspond to that of the light beam incident to the sense point (the light intensity distribution within the aperture). For a nonideal system, then, the amount of deviation from the ideal state should be measured in advance, and a correction to account for this deviation added as an offset to the sense output of the detector $D_{ec}$.

In the example of FIG. 7, the placement of the optics so as to position the aperture of the shade plate $SP_{me}$ at the front focus of the convergence optical system $L_{me}$ makes it possible to eliminate the influence of angular characteristics of the detector $D_{ec}$.

Also, although the above example used a two-dimensional CCD as the detector $D_{ec}$, the same thing could have been accomplished by providing, in the position of this detector, a pinhole aperture with a photoelectric conversion device (e.g., a photomultiplier) behind it. In this case, the pinhole aperture provided at the rear focus of the convergence optical system $L_{me}$ would be made movable in directions normal to the optical axis of the convergence optical system $L_{me}$ (movable within the XY surface of the drawing). A one-dimensional (single point) CCD could also have been provided, in which case the CCD would be made movable.

Thus by performing measurements at multiple points in the illuminated surface IA as described above, the light intensity distribution within the apertures of the light beams converging at these points on the illuminated surface can be measured.

FIG. 8 shows an example of measurement results obtained using the measurement system ME of FIG. 7, with FIGS. 8A, 8B, 8C, and 8D showing the light intensity distribution within the aperture of the beams incident to the areas IA(1,1), IA(1,2), IA(2,1), and IA(2,2), respectively, of the illuminated area IA. In each of FIGS. 8A through 8D, light intensity I is shown on the vertical axis, while the two horizontal axes have the numerical aperture of the beam in the X direction NA(X) on the X axis, and the numerical aperture of the beam in the Y direction NA(Y) on the Y axis. These numerical apertures NA(X) and NA(Y) correspond to beam aperture angles in crossections taken along the X and Y axes, respectively. In FIG. 8, the numerical apertures NA(X) and NA(Y) are each divided by 25 to form a three-dimensional bar graph having 25 square bars, each of which corresponds to one of the 25 lens elements LE(1,1) through LE(5,5) that make up the fly-eye lens F of FIG. 1.

In the measurement results example shown in FIG. 8, for a beam incident to the area IA(1,1) of the illuminated surface IA (FIG. 8A), the light intensity distribution within the aperture is such that the light intensity around the outside of the area is higher that it is in the center. Within the apertures of the beams incident to the areas IA(1,2), IA(2,1), and IA(2,2) of the illuminated surface IA, the light intensity distributions are uniform.

With light intensity distributions such as these, the effective numerical aperture of a beam converging in the area IA(1,1) of the illuminated surface will be different from the effective numerical apertures of the beams converging in the other areas (that is IA(1,2), IA(2,1), and IA(2,2)). If an optical system with this light intensity distribution were in the illumination apparatus used for projection-exposing circuit patterns on wafers, for example, the width of a circuit pattern line could be different depending on where the line is located in the pattern.

We will therefore describe below, for a system having measurement results as shown in FIG. 8, an example in which the illumination distribution of the illuminated surface IA is made flat, and the light intensity distribution in the apertures of beams incident to the area IA(1,1) of the illuminated surface IA is made uniform.

Figure 9:
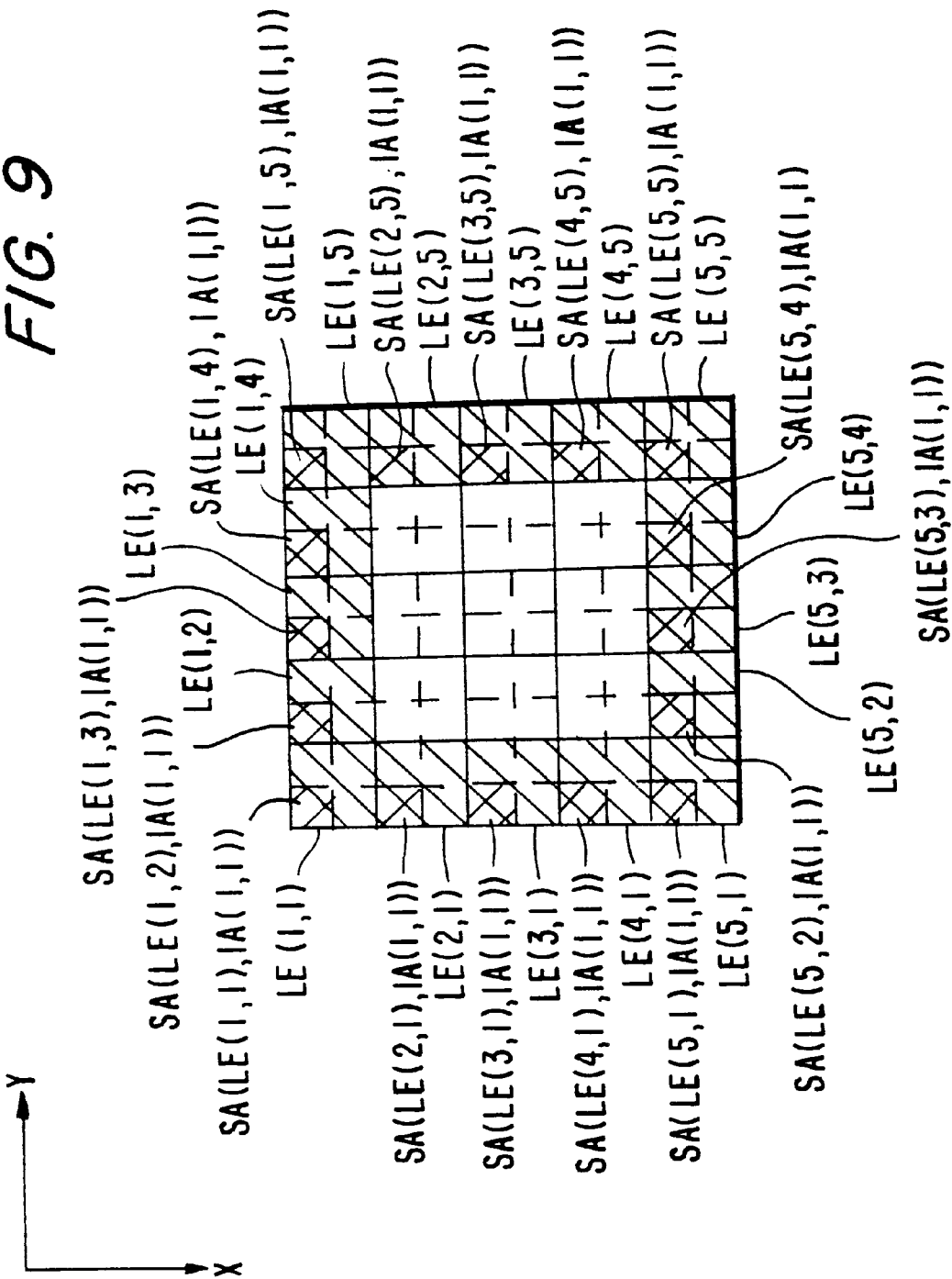
FIG. 9 is a plan view of a fly-eye lens F viewed from the entrance surface end.

FIG. 9 is a plan view of the fly-eye lens F as seen from its entrance end. The portions of FIG. 8 that have higher light intensity are indicated by the cross-hatching in FIG. 9. As shown in FIG. 9, this portion corresponds to the beams passing through the lens elements LE(1,1), LE(1,2), LE(1, 3), LE(1,4), LE(1,5), LE(2,1), LE(2,5), LE(3,1), LE(3,5), LE(4,1), LE(4,5), LE(5,1), LE(5,2), LE(5,3), LE(5,4), and LE(5,5). Since area IA(1,1) is the only area on the illuminated surface IA in which the light intensity distribution within the light beam aperture is nonuniform, the desired result may be obtained by reducing by a prescribed amount, the light intensity of the beams passing through the subareas of the areas in the entrance surfaces of the lens elements LE(1,1), LE(1,2), LE(1,3), LE(1,4), LE(1,5), LE(2,1), LE(2, 5), LE(3,1), LE(3,5), LE(4,1), LE(4,5), LE(5,1), LE(5,2), LE(5,3), LE(5,4), and LE(5,5) that are optically conjugate to area IA(1,1). This can be accomplished by reducing the transmissivity of these subareas. In FIG. 9, these subareas are SA(LE(1,1),IA(1,1)), SA(LE(1,2),IA(1,1)), SA(LE(1,3), IA(1,1)), SA(LE(1,4),IA(1,1)), SA(LE(1,5),IA(1,1)), SA(LE(2,1),IA(1,1)), SA(LE(2,5),IA(1,1)), SA(LE(3,1),IA (1,1)), SA(LE(3,5),IA(1,1)), SA(LE(4,1),IA(1,1)), SA(LE (4,5),IA(1,1)), SA(LE(5,1),IA(1,1)), SA(LE(5,2),IA(1,1)), SA(LE(5,3),IA(1,1)), SA(LE(5,4),IA(1,1)), and SA(LE(5, 5),IA(1,1)).

Figure 10:
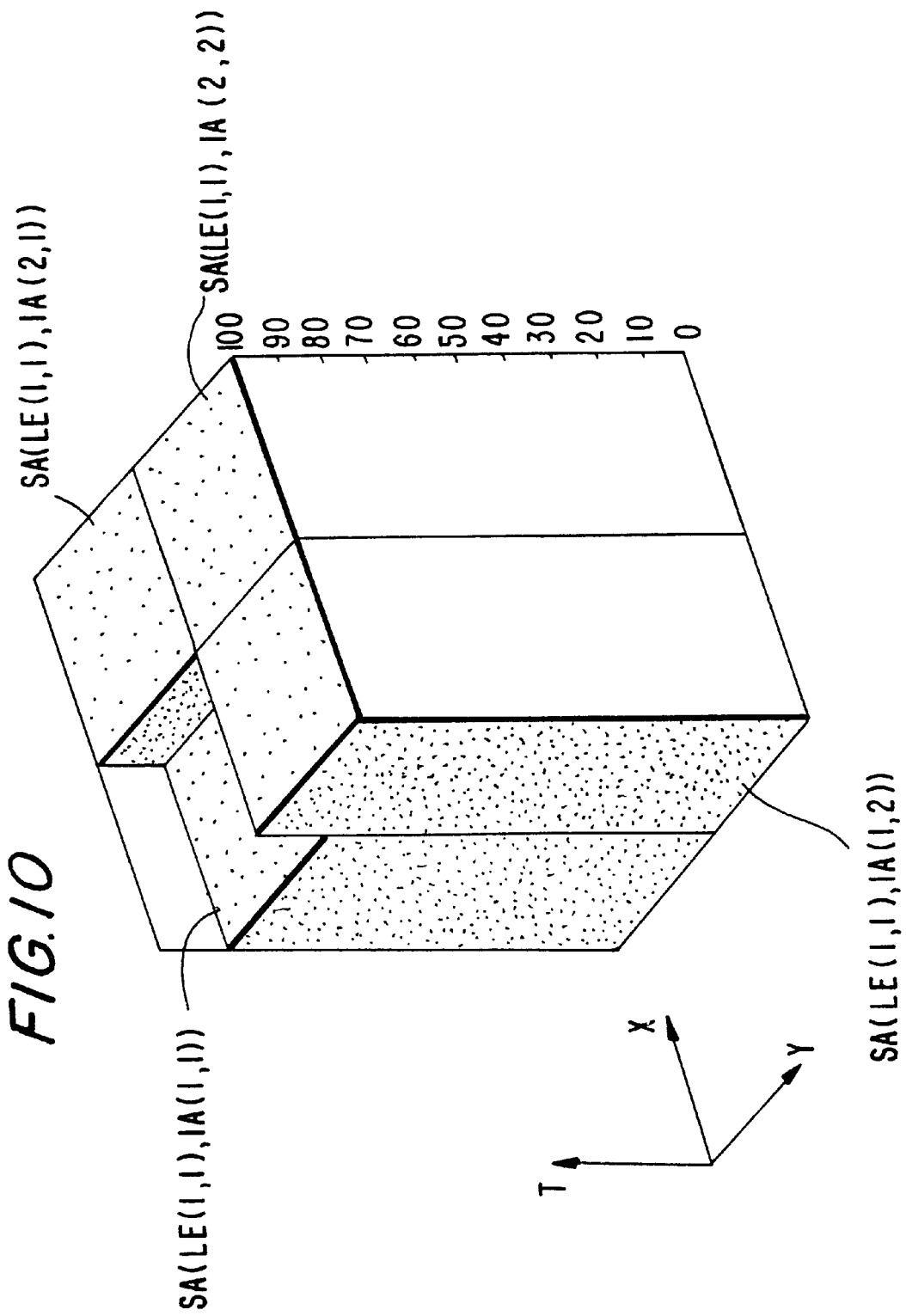
FIG. 10 shows the transmissivity distribution to be provided at the entrance surface of the lens element LE(1,1)

FIG. 10 shows the transmissivity distribution that must be established at the entrance surface of lens element LE(1,1) in order to do this. In FIG. 10, transmissivity T is shown on the vertical axis, and the X and Y axes are shown horizontally. As shown in FIG. 10, the transmissivity is lower in subarea SA(LE(1,1),IA(1,1)) than it is in the other subareas (LE(1,1),IA(1,2), SA(LE(1,1),IA(2,1), and SA(LE(1,1),IA (2,2)). The same transmissivity distribution as that shown in FIG. 10 must also be established at the entrance surface of lens elements LE(1,2), LE(1,3), LE(1,4), LE(1,5), LE(2,1), LE(2,5), LE(3,1), LE(3,5), LE(4,1), LE(4,5), LE(5,1), LE(5, 2), LE(5,3), LE(5,4), and LE(5,5).

FIG. 11 shows the light intensity distributions within the apertures of beams incident to each of the areas of the illuminated surface IA (IA(1,1) through IA(2,2)) when the transmissivities in subareas SA(LE(1,1),IA(1,1)) through SA(LE(5,5),IA(1,1)), only, are reduced as described above. FIGS. 11A, 11B, 11C, and 11D show the light intensity distributions within the apertures of beams incident to areas IA(1,1), IA(1,2), IA(2,1), and IA(2,2), respectively, of the illuminated surface IA. In each of FIGS. 11A through 11D, light intensity I is shown on the vertical axis, while the two horizontal axes have the numerical aperture of the beam in the X direction (NA(X)) on the X axis, and the numerical aperture of the beam in the Y direction (NA(Y)) on the Y axis.

Figure 11A:
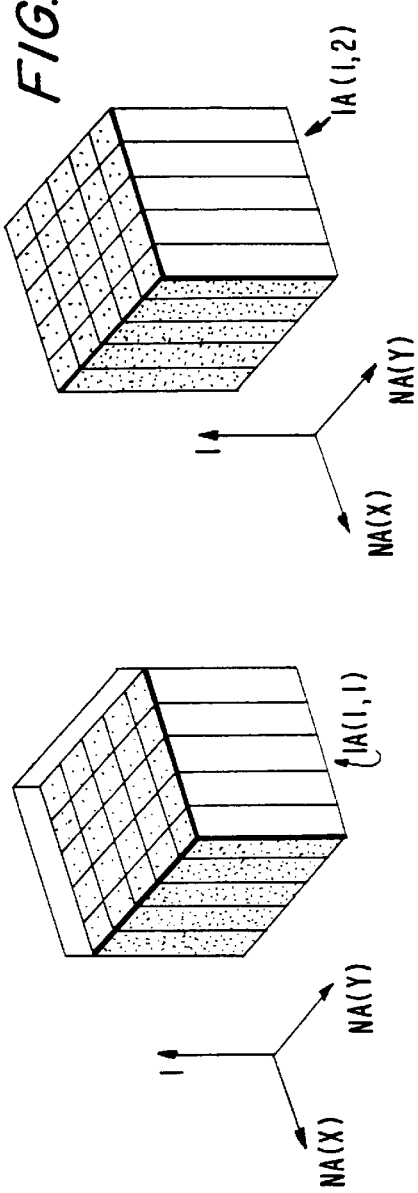
FIG. 11 shows the light intensity distribution occurring in an illuminated surface when localized numerical aperture correction is performed, with FIGS. 11A, 11B, 11C, and 11D showing the light intensity distributions in the apertures of beams incident in areas IA(1,1), IA(1,2), IA(2,1), and IA(2, 2), respectively, of an illuminated surface IA.
Figure 11B:
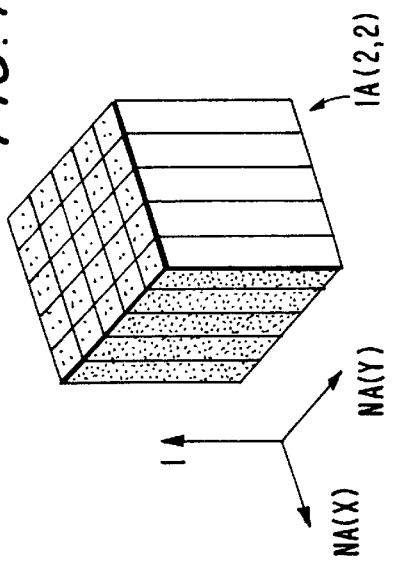
Figure 11C:
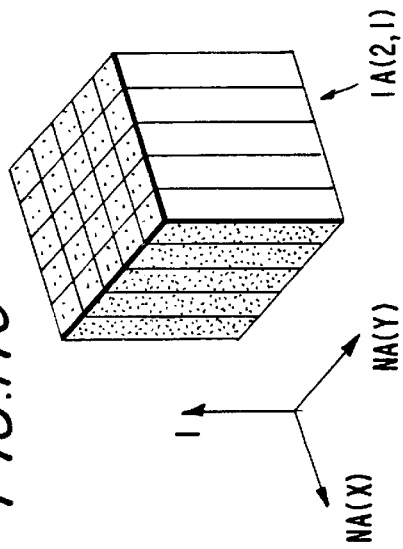
Figure 11D:
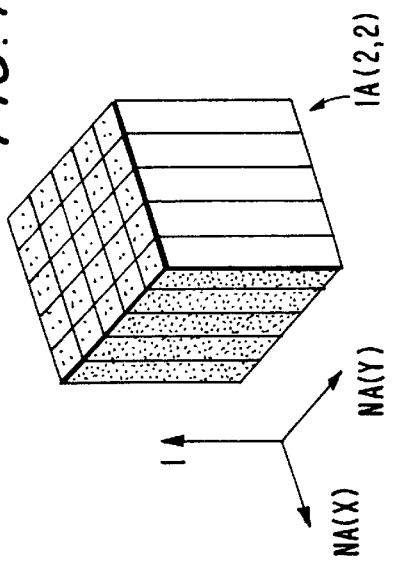

Moreover, in FIGS. 11A through 11D, the amount of light energy in the light beams incident to areas IA(1,1) through IA(2,2) is proportional to the integral of the light intensity distributions of those beams. Accordingly, the amount of light energy in the beams incident to the area IA(1,1), as shown in FIG. 11A is less than the amount of light energy of the beams incident to the areas IA(1,2), IA(2,1), and IA(2,2), as shown in FIGS. 11B, 11C, and 11D, respectively. We see, then, that the illuminance distribution of the illuminated surface IA is one in which the illuminance of area IA(1,1) is less than that of the other areas.

Thus if the transmissivity is decreased only in subareas SA(LE(1,1),IA(1,1)) through SA(LE(5,5),IA(1,1)), then as shown in FIG. 11, even though the light intensity distribution in the apertures of the beams incident to each of the areas IA(1,1) through IA(2,2) of the illuminated surface IA is uniform, the illuminance distribution will not be flat over the entire illuminated surface IA. Here too, if this were the illumination apparatus in a system for projection exposing circuit patterns on wafers, for example, the width of a circuit pattern line could differ depending on where in the pattern the line is located.

To obtain uniform illuminance distribution over the entire illuminated surface, a match between the amount of light energy in the beams incident to areas IA(1,2), IA(2,1), and IA(2,2) and the amount of energy in the beams incident to area IA(1,1) must be effected. Here, since the entire illuminated surface IA is optically conjugate to the entrance surfaces of each of the lens elements LE(1,1) through LE(5,5), this can be accomplished by giving each of these entrance surfaces a transmissivity distribution that changes in the direction opposite to that of the light energy distribution of the illuminated surface IA (which corresponds to the illuminance distribution). Moreover, for cases in which the transmissivity of the fly-eye lens F and condenser optical system C combination per se is constant for any light path, the transmissivity distribution given to each of the entrance surfaces will be the inverse of the illuminance distribution of the illuminated surface IA. Also, when the transmissivity of the fly-eye lens F and condenser optical system C is different for various light paths through them, these transmissivities should be taken into account when determining the transmissivity distribution to be applied to each of the entrance surfaces of the fly-eye lens F. Note that in this example, to keep the description simple, it was assumed that the transmissivity of the fly-eye lens F/condenser optical system C combination, per se, was constant for any light path.

Figure 12:
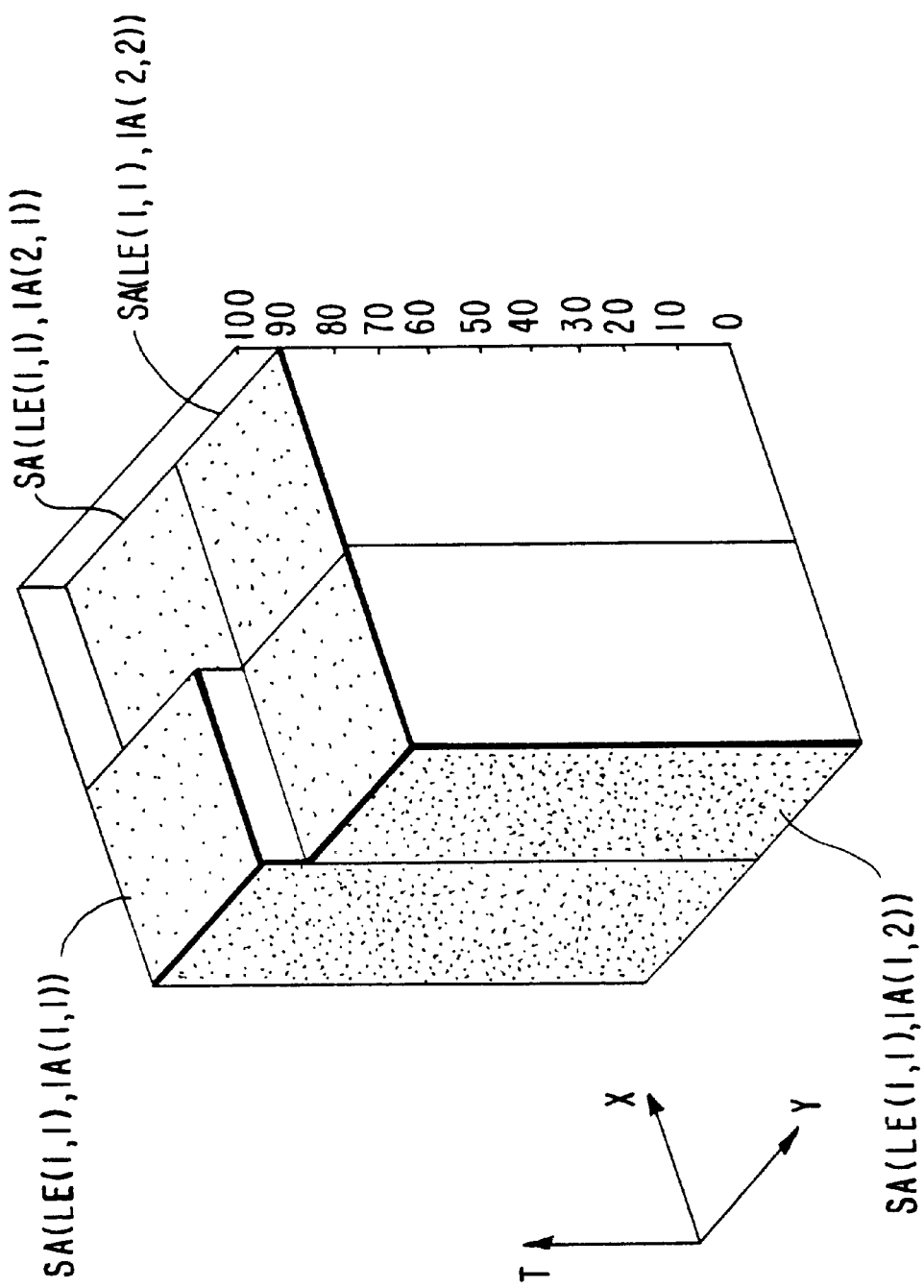
FIG. 12 shows a transmissivity distribution that can be applied to the entrance surfaces of the fly-eye lens F.

FIG. 12 is a chart showing the transmissivity distribution applied to the entrance surfaces of fly-eye lens F. As was the case in FIG. 10, transmissivity T is shown on the vertical axis, and the X and Y axes are shown horizontally. Since transmissivity distribution required to correct the illuminance distribution on the illuminated surface IA is the same for each of the entrance surfaces, the transmissivity distribution shown in FIG. 12 is that required at the entrance surface of the lens element LE(1,1) of the fly-eye lens F. As shown in FIG. 12, in this transmissivity distribution, the transmissivity T in the subarea SA(LE(1,1),IA(1,1)), which is conjugate to the area IA(1,1) of the illuminated surface IA, is 100%, while those of the other subareas, SA(LE(1,1),IA(1,2)), SA(LE(1,1),IA(2,1)), and SA(LE(1,1),IA(2,2)), which are conjugate to areas IA(1,2), IA(2,1), and IA(2,2), respectively, are less than 100%.

Now if the product (multiplication result) of the transmissivity distribution required to obtain constant light intensity distributions in the apertures of the beams incident to the illuminated surface IA (that shown in FIG. 10) and the transmissivity distribution required to correct the nonuniformity of the illuminance distribution on the illuminated surface IA caused by the transmissivity distribution shown in FIG. 10 (that shown in FIG. 12) is obtained (if FIG. 10 is multiplied by FIG. 12), and the resulting distribution established at the entrance surfaces of the fly-eye lens F, then uniformity of illuminance distribution over the illuminated surface IA will be maintained, and the light intensity distributions within the apertures of the beams incident to the multiple locations on the illuminated surface IA will also be uniform.

Figure 13B:
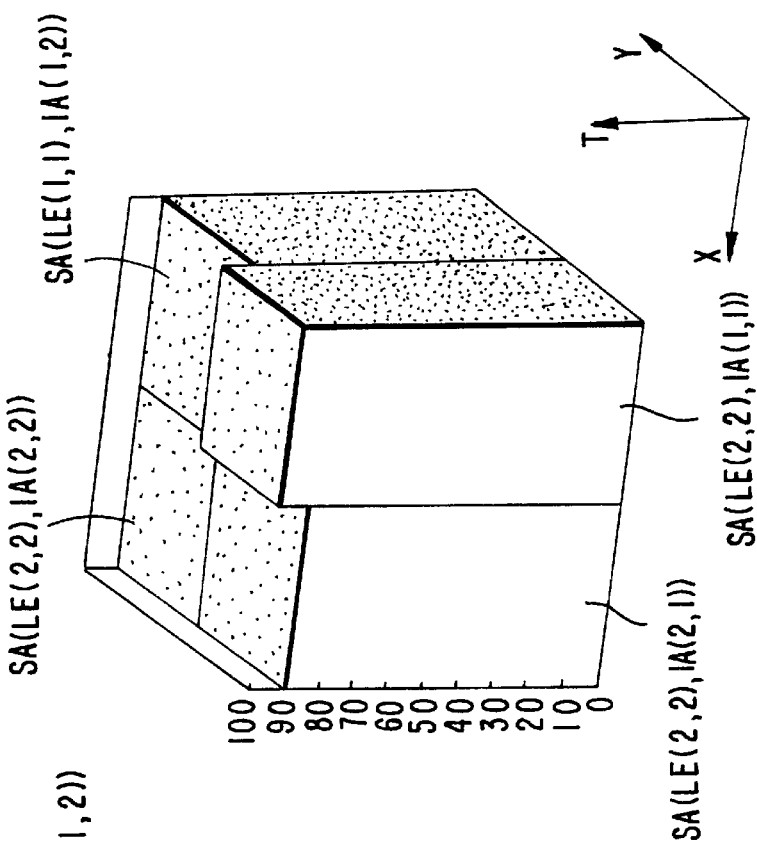
FIG. 13 shows transmissivity distributions for performing localized numerical aperture correction while maintaining the illumination distribution in the illuminated surface unchanged, with FIGS. 13A and 13B showing transmissivity distributions that can be applied at the entrance surfaces of lens elements placed in a first area, and a second area, respectively.
Figure 13A:
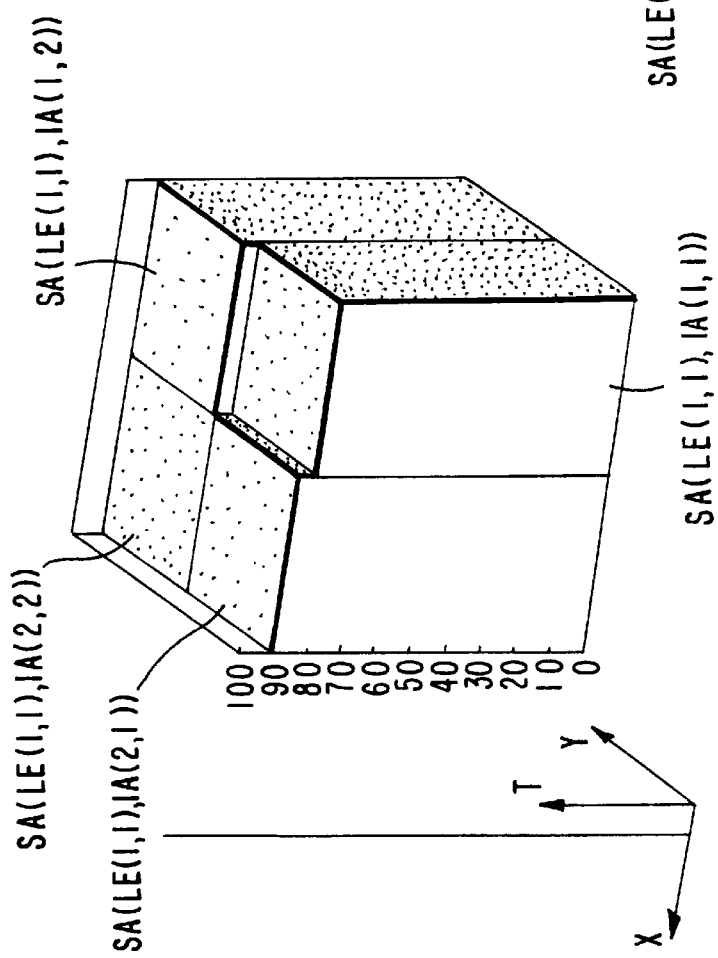

FIG. 13 shows the results of multiplication of the transmissivity distribution of FIG. 10 by that of FIG. 12. FIG. 13A shows the transmissivity distribution (hereinafter, the first transmissivity distribution) established at the entrance surfaces of the lens elements positioned in the crosshatched locations of FIG. 9 (hereinafter, the first area). These first area lens elements are the lens elements LE(1,1), LE(1,2), LE(1,3), LE(1,4), LE(1,5), LE(2,1), LE(2,5), LE(3,1), LE(3,5), LE(4,1), LE(4,5), LE(5,1), LE(5,2), LE(5,3), LE(5,4), and LE(5,5). FIG. 13B shows the transmissivity distribution (hereinafter, the second transmissivity distribution) established at the entrance surfaces of the lens elements positioned in the area other than the above first area (hereinafter, the second area). These second area lens elements are the lens elements LE(2,2), LE(2,3), LE(2,4), LE(3,2), LE(3,3), LE(3,4), LE(4,2), LE(4,3), and LE(4,4). In FIGS. 13A and 13B, transmissivity T is shown on the vertical axis, and the X and Y axes are shown horizontally, the same as in FIGS. 10 and 12.

A number of possible methods might be considered for establishing the desired transmissivity distribution at the entrance surfaces of the lens elements LE(1,1) through LE(5,5) of the fly-eye lens F. For example, one might provide on these entrance surfaces themselves, multilayer dielectric films having the prescribed transmissivity distribution; or light-shielding/transmitting microdot aggregates (formed, for example, by chromium vapor deposition, etc.), having a density distribution that provides the prescribed transmissivity distribution. Such additional working of the fly-eye lens F lens elements themselves to obtain the desired transmissivity distribution, however, might present problems for manufacturing. If this is a problem, the same result can be obtained, for example by providing, on a transparent plane-parallel plate, in areas of the plate in one-to-one correspondence with the above subareas, multilayer dielectric films having the prescribed transmissivity distribution, or light-shielding/transmitting microdot aggregates with density that will provide the prescribed transmissivity distribution; and placing this plate in close proximity to the lens elements of the fly-eye lens F.

Moreover, when the fly-eye lens F entrance surfaces themselves are worked, the worked portion (multilayer dielectric film, thin film of microdots, etc.) can be considered the filter of the present invention. Also, when the desired transmissivity distribution is provided by adapting the density distribution of a microdot aggregate, it is preferable to use the second of the above methods (wherein a separate part is used to establish the transmissivity distribution of the fly-eye lens F) so that the microdot image will be in a defocused state at the illuminated surface IA.

Assume now, that in a location (or in the proximity of a location) that is in a conjugate relationship to the illuminated surface IA, we establish, as described above:

a first area, corresponding to a portion of the multiple light sources formed by the fly-eye lens F (the area made up of the entrance surfaces of the lens elements LE(1,1) LE(1,2), LE(1,3), LE(1,4), LE(1,5), LE(2,1), LE(2,5), LE(3,1), LE(3,5), LE(4,1), LE(4,5), LE(5,1), LE(5,2), LE(5,3), LE(5,4), and LE(5,5)), and a second area, corresponding to a portion of the multiple light sources formed by the fly-eye lens F other than the above portion (the area made up of the entrance surfaces of the lens elements LE(2,2), LE(2,3), LE(2,4), LE(3,2), LE(3,3), LE(3,4), LE(4,2), LE(4,3), and LE(4,4)).

Further assume that 16 filter elements having a first transmissivity distribution as shown in FIG. 13A are provided over the entirety of said first area; and that 9 filter elements having a second transmissivity distribution changing in the opposite direction relative to said first transmissivity distribution, as shown in FIG. 13B, are provided over the entirety of said second area.

Then in a system configured according to the above assumptions, not only will it be possible to maintain uniform illuminance over the illuminated surface IA, but also to independently control the light intensity distribution at each of the secondary light source locations for beams incident to each of a plurality of locations on the illuminated surface IA (the light intensity distribution in the Fourier transform plane for the illuminated surface IA). In the above example, this control is performed to effect uniform distribution. Consequently, it will also be possible to control the pattern line width at desired locations in the image surface.

In the above example, the transmissivity distribution shown in FIG. 12 was devised to correct only for nonuniformity in the illuminance distribution of the illuminated surface IA due to the transmissivity distribution of FIG. 10. However, components could also have been added to the transmissivity distribution of FIG. 12 to correct for preexisting nonuniformities in the illuminance distribution at the illuminated surface IA.

Also in the above example, corrections for two kinds of transmissivity distribution were provided on one optical member: the transmissivity distribution shown in FIG. 10, which was provided to make the light intensity distribution within the apertures of beams incident to each of the areas on the illuminated surface IA constant; and the transmissivity distribution shown in FIG. 12, which was provided to correct for nonuniformity in the illuminance distribution on the illuminated surface IA caused by the transmissivity distribution shown in FIG. 10. These two different transmissivity distribution corrections, however, could have been provided on members placed in separate locations. For example, the transmissivity distribution shown in FIG. 10 could also be provided in (or in the proximity of) the entrance surface of fly-eye lens F, with the transmissivity distribution shown in FIG. 12 provided in another location separate from the fly-eye lens F but conjugate to the illuminated surface IA.

Figure 14:
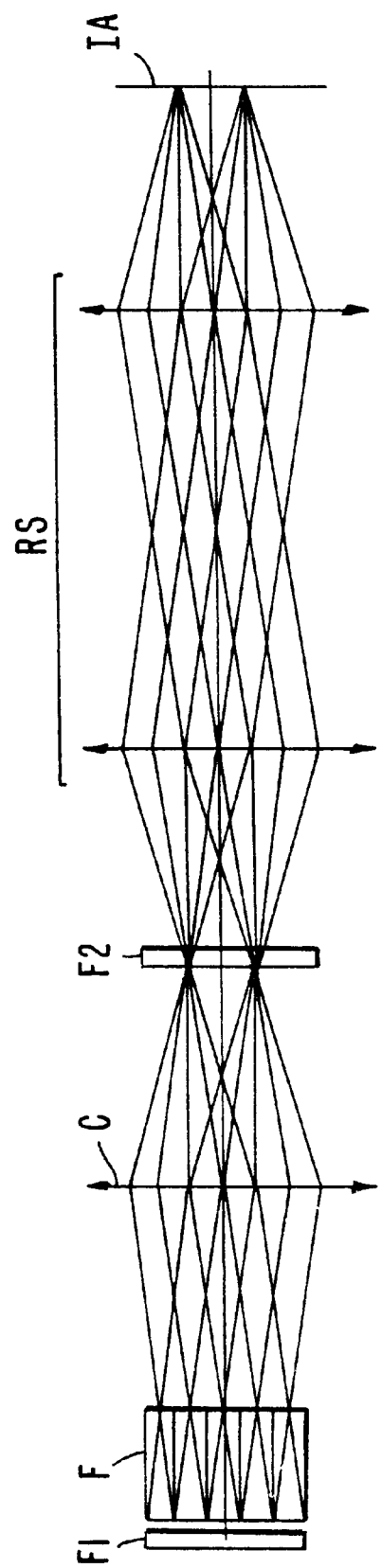
FIG. 14 ,hows a modified version of the optical placement shown in FIG. 1.

FIG. 14 shows an example in which provided, in addition to the configuration of FIG. 1, is a relay optical system RS, which has the position of the illuminated surface of FIG. 1 as a field stop FS, and which reforms the image of this field stop FS on the illuminated surface IA. In this configuration, the transmissivity distribution of FIG. 10, can be provided in a filter F1, which is placed at, or in the proximity of, the entrance surface of the fly-eye lens F. The transmissivity distribution for correcting the nonuniformity of the illuminance distribution over the surface of the illuminated surface IA (caused by the filter F1) can be provided in a filter F2, placed in the position of (or proximity of) the field stop FS of FIG. 14. In this case, the transmissivity distribution of FIG. 10 would be established in that area of the filter F1 corresponding the cross-hatching in FIG. 9; i.e., the area corresponding to the entrance surfaces of the lens elements LE(1,1), LE(1,2), LE(1,3), LE(1,4), LE(1,5), LE(2,1), LE(2, 5), LE(3,1), LE(3,5), LE(4,1), LE(4,5), LE(5,1), LE(5,2), LE(5,3), LE(5,4), and LE(5,5). The filter F2 would then be given the transmissivity distribution to correct the nonuniformity in the illuminance distribution over the illuminated surface IA (nonuniformity caused by the filter F1). In this case, the filter F2 could be given a combination of transmissivity distribution components to correct for any pre-existing nonuniformity in the illuminance distribution in addition to that caused by the filter F1.

Also, although the illuminated area was divided into four areas in the above example, there is no reason to limit the number of areas to four. Similarly, the fly-eye lens need not necessarily be made up of 25 lens elements arranged in a 5×5 matrix.

Figure 15:
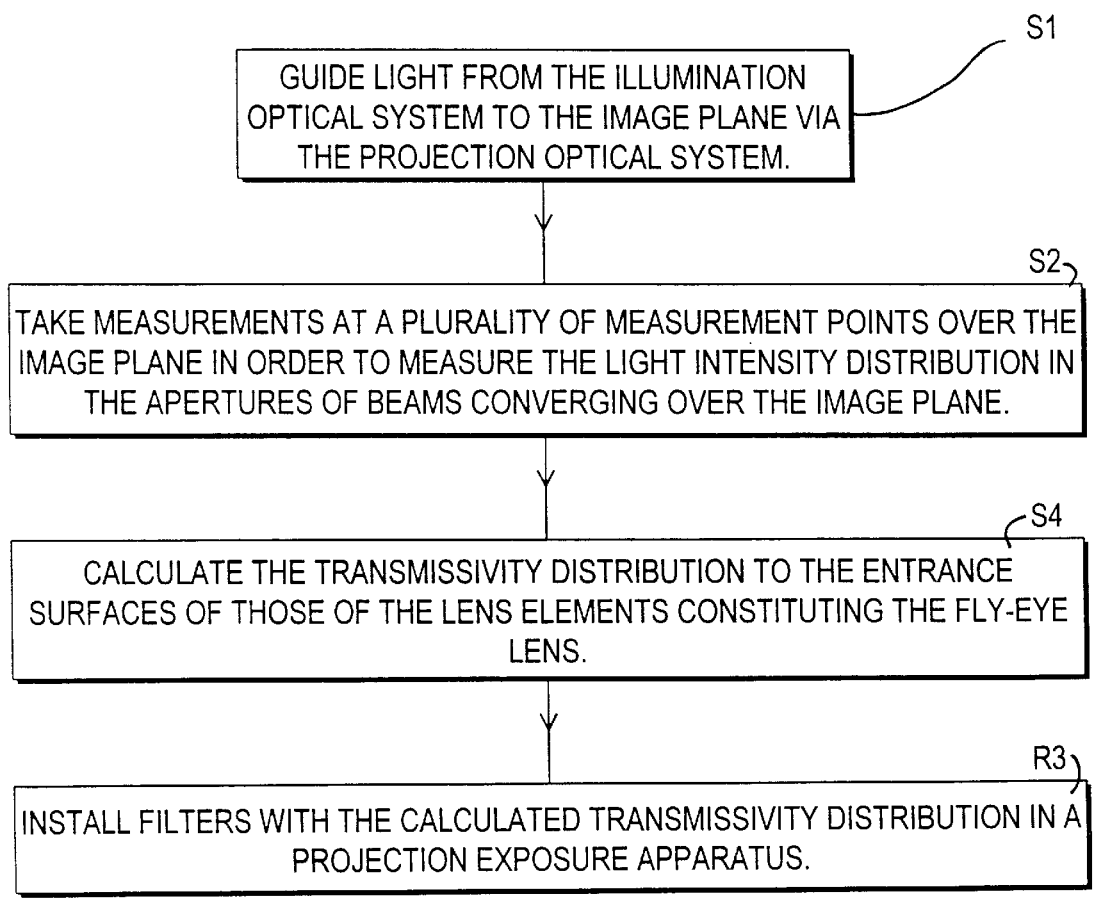
FIG. 15 is an example of a flowchart for a filter manufacturing method.

In the above example, the process of guiding light from the light source to the measurement system ME of FIG. 7 is the equivalent of a first step of a process, or step S1 in the example of FIG. 15. Similarly, the process of using the measurement system ME to take measurements at a plurality of measurement points (areas) on the illuminated surface, in order to measure the light intensity distribution in the apertures of beams converging in those areas (the light intensity distribution over the surface that is the Fourier transform plane for those measurement points) is the equivalent of a second step (S2). Moreover, in the above example by measuring the light intensity distribution in the apertures of beams converging at multiple measurement points in the illuminated surface, the illuminance at those points is also measured. Also, the process of applying, based on the applicable measurement results, a first transmissivity distribution to the entrance surfaces of those of the lens elements constituting the fly-eye lens F that reside in a first area; and applying a second transmissivity distribution to the entrance surfaces of those of the lens elements constituting the fly-eye lens F that reside in a second area, in order to maintain uniform illuminance distribution over the illuminated surface IA, while also making the light intensity distribution in the apertures of beams incident to the plurality of measurement points in the illuminated surface IA uniform between beams, corresponds to a fourth step (S4). The process of installing filters obtained in the course of performing the above fourth step in an illumination apparatus (projection exposure apparatus) corresponds to a third step (S3).

Also, in the above example, actual measurements of the light intensity distribution within the apertures of beams converging on the illuminated surface IA were performed. Instead of performing actual measurements, however, this information could have been obtained by simulation. When this approach is taken, techniques such as the following might be used:

(1) A technique in which the intensity distribution within the apertures of light beams at the illuminated surface, and the illuminance distribution on the illuminated surface are computed and controlled.

(2) A technique in which the resist pattern line width deviance value for a resist pattern formed in the photoresist (photosensitive material) applied to a substrate is controlled.

In the technique of (1), above, instead of performing actual measurements using the measurement system ME of FIG. 7, the following information is computed, using illumination simulation software:

the light intensity distribution in the apertures of light beams on the illuminated surface (with uniform transmissivity distribution at, or in the proximity of, the entrance surface of fly-eye lens F), and the illuminance distribution on the illuminated surface.

Then, based on the results of these computations, the transmissivity distribution to be established at, or in the proximity of, the entrance surface of the fly-eye lens F is computed by the above technique. Moreover, when these computations are performed, it is preferable, during simulation, to also simulate aberrations, transmissivity characteristics, etc. of the condenser optical system C (and when installed in a relay optical system RS or a projection optical system, aberrations, transmissivity characteristics, etc. in these systems as well).

Figure 16:
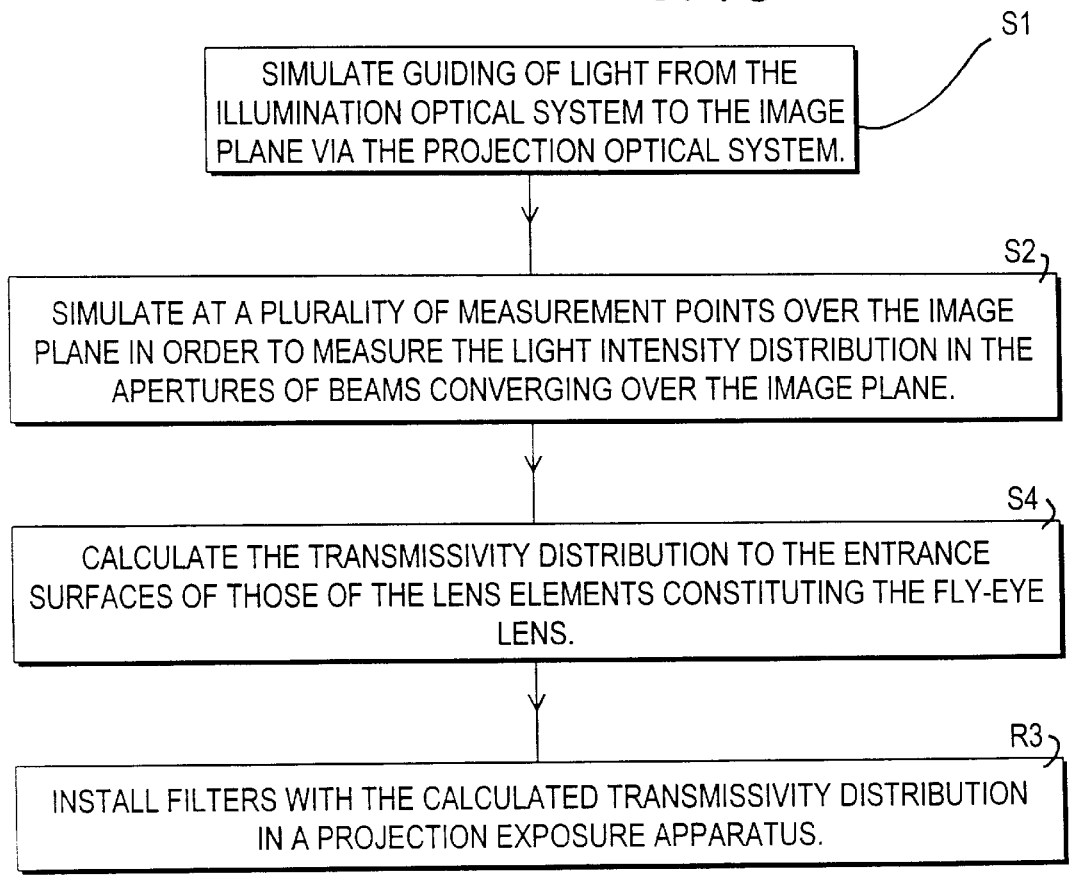
FIG. 16 is an example of a flowchart for a different filter manufacturing method.

In this case, as shown, for example, in FIG. 16, the process of simulating the light intensity distribution in the apertures of beams incident to multiple locations within the illuminated surface (or image surface), and the illuminance distribution on the illuminated surface is equivalent to a first and a second step (S1 and S2 in FIG. 16).

Also, the process of applying, based on the applicable simulation results, a first transmissivity distribution to the entrance surfaces of those of the lens elements constituting, the fly-eye lens F that reside in a first area; and applying a second transmissivity distribution to the entrance surfaces of those of the lens elements constituting the fly-eye lens F that reside in a second area, in order to maintain uniform illuminance distribution over the illuminated surface IA, while also making the light intensity distribution in the apertures of beams incident to the plurality of measurement points in the illuminated surface IA uniform between beams, corresponds to a fourth step (S4). The process of installing filters obtained in the course of performing the above fourth step in an illumination apparatus (projection exposure apparatus) corresponds to a third step (S3).

The technique described in (2), above, as indicated in FIG. 16, requires a configuration in which a reticle 13 having a prescribed pattern is placed at the illuminated surface IA, and an image of this reticle 13 pattern is projected onto a photoresist-coated substrate, using a projection optical system PL. The imaging simulation software used is a system capable of computing the resist pattern line width deviance value (the amount by which the resist line width differs from the design line width) from parameters such as, for example, the type of pattern on the reticle 13 (line-and-space or isolated pattern), the photosensitivity characteristics of the resist, the exposure conditions (localized exposure dose, localized σ value), and the aberration and transmissivity characteristics of the projection optical system PL. Then, all of the above parameters other than the exposure conditions are held constant, and the transmissivity distribution at the entrance surface of the fly-eye lens F (which is adapted to the above exposure condition parameters) is optimized, with the above line width deviance value as the performance function. Here, the transmissivity distribution that gives the best performance function for line-and-space patterns may be different, for example, from the distribution that gives the best performance function for isolated-type patterns. The transmissivity distribution used, however, should be one that gives the lowest line width deviance value for both types of patterns. Also, for the above optimization, a number of techniques such as slope/least squares methods, simulated annealing, genetic algorithms, etc. may be applied.

Figure 17:
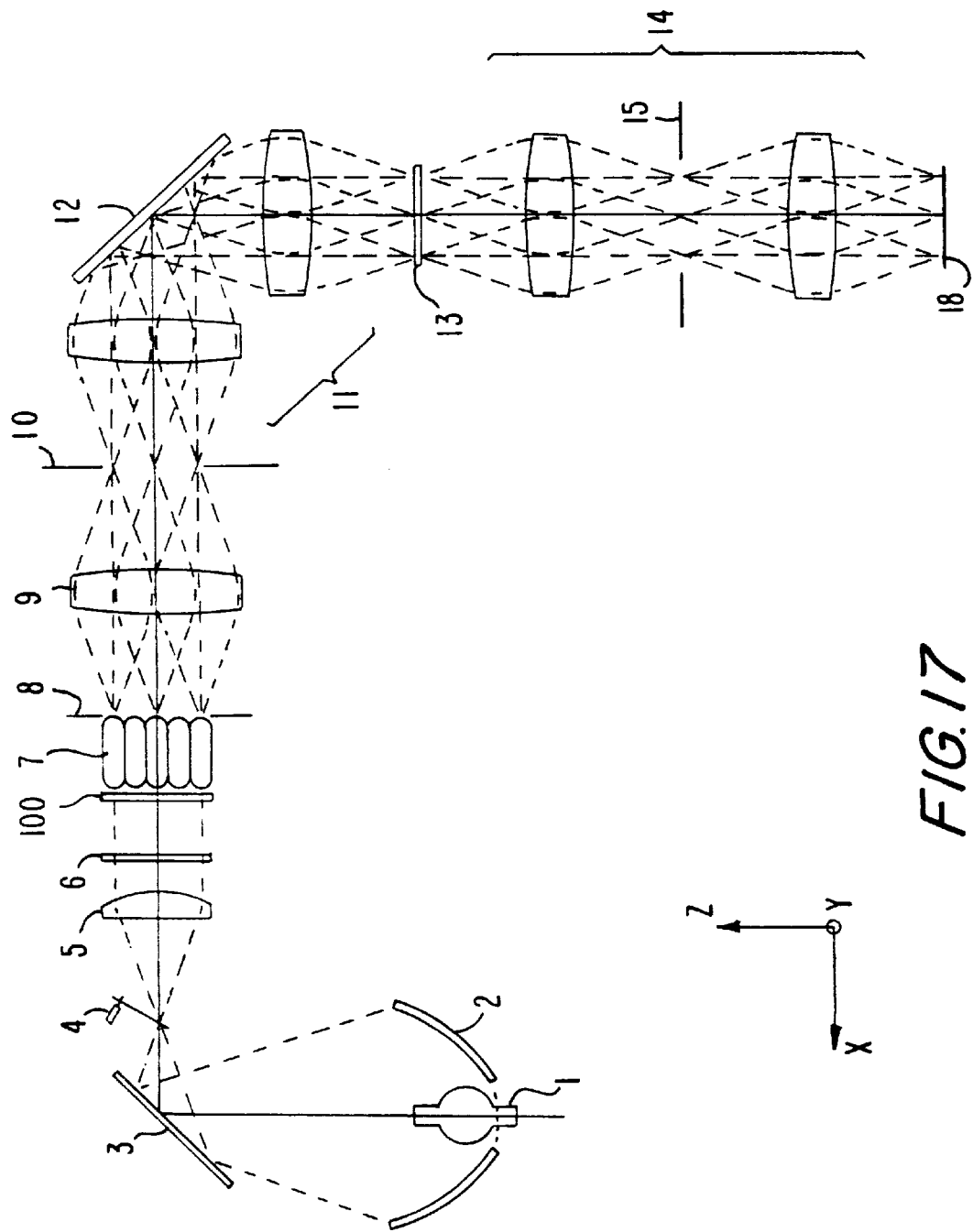
FIG. 17 is a simplified diagram of the configuration of a projection exposure apparatus in one embodiment of the present invention.

FIG. 17 is a simplified diagram of an overall projection exposure apparatus according to the present invention. This apparatus will be described with reference to FIG. 17. The light source 1, (typically a mercury lamp), is placed at the first focal point of a converging reflector 2, whose surface is in the shape of an ellipsoid of revolution. The beam emitted from the light source 1, reflected by a mirror 3, is once converged at the second focal point of the converging reflector 2. After passing through a shutter 4 near this second focal point, the beam is converted to a substantially parallel beam by a collimator 5, for selection, by a bandpass filter 6, of the exposure wavelength (mercury emission lines 436 nm (g line), 365 nm (i line), etc.). The light source system is made up of the light source 1, the converging reflector 2, the collimator 5, and the bandpass filter 6. For the light source 1, instead of the mercury vapor lamp, it also possible to use a laser (in particular, a KrF, ArF, or $F_2$ laser). Illumination optical systems using laser light sources such as these are disclosed, for example, in U.S. Pat. Nos. 4,939,630 and 5,253,110 incorporated herein by reference.

Having passed through the bandpass filter 6, the beam becomes incident to the fly-eye lens 7, an optical integrator constructed by integrating multiple lens elements. Formed on the exit end surface of this fly-eye lens 7, are a large number of primary light source images (secondary light sources).

An aperture stop 8 is provided at the location of the secondary light sources. The diverging beams emerging from the secondary light sources, with diameters restricted by the aperture stop 8, proceed toward a first condenser lens group 9. Placed in the proximity of the rear focal point of this first condenser lens group 9 is a field stop 10. The beams from the secondary light sources superimposingly illuminate the field stop 10. The beams passing through this field stop 10 proceed on through a second condenser lens group 11 to illuminate a reticle 13 (mask) on which is inscribed the pattern to be projection-exposed. Here, the second condenser lens group 11 is configured to place the field stop 10 and the pattern surface of the reticle 13 in an optically conjugate relationship. Accordingly, field stop 10 has the function of defining the illumination range (the boundary of the illuminated area) on reticle 13 (the illuminated surface). Also, placed within the second condenser lens group 11, is a light-path-folding-mirror 12, for deflecting the light path. First and second condenser lens groups 9 and 11 correspond to the condenser optical system.

Hence based on light from the illumination optical system (1 through 12) described above, the projection optical system 14 projects the pattern inscribed on the reticle 13, at the prescribed reduction ratio, onto a wafer (photosensitive substrate) positioned in the image plane of the projection optical system 14.

We will now consider the conjugate relationships that exist in the system. First, the surfaces that are conjugate to the reticle 13 are the wafer 18, the field stop 10, and entrance surface 71a of each of the plurality of lens elements 70 (not indicated in FIG. 17) that constitute the fly-eye lens 7. A conjugate relationship also exists between the light source 1, the second focal point of the elliptical reflector 2, the secondary light source formed by fly-eye lens 7 (aperture stop 8), and the aperture stop 15 in the projection optical system 14.

Next, we will describe a configuration for controlling the pattern line width at different locations in the image surface (e.g. the center and peripheral portions of the image surface).

First, referring to FIG. 18, we will consider how pattern line width is affected by the manner in which the beams converge on the surface of the wafer 18.

Figure 18A:
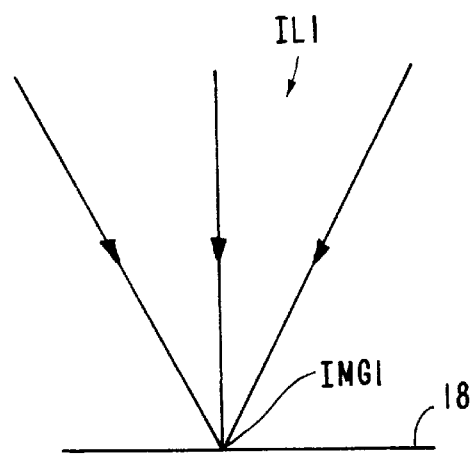
FIG. 18 shows the relationship between the numerical apertures of light beams converging at a surface, and the pattern images formed by those beams, with FIGS. 18A and 18B showing the states of convergence of the beams, and FIGS. 18C and 18D showing cross-sections of the patterns formed by them.
Figure 18B:
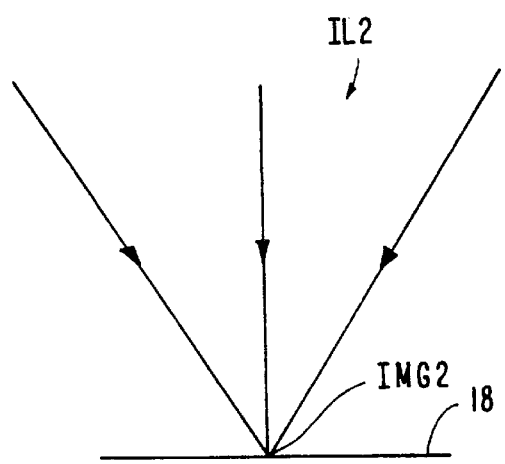

FIGS. 18A and 18B show beams converging on the surface of the wafer 18 (in the image surface IMG), with FIG. 18A corresponding to the center portion of the exposed area on the wafer 18 (IMG1, the center portion of the image surface IMG), and FIG. 18B corresponding to a peripheral portion of the exposed area on the wafer 18 (IMG2, a peripheral portion of the image surface IMG).

Figure 18C:
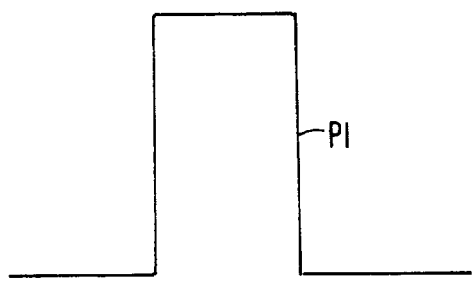
Figure 18D:
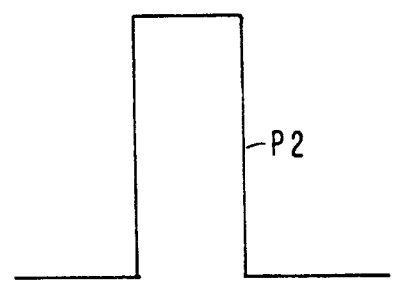

We are considering the case, as shown in FIGS. 18A and 18B, in which NA2, the numerical aperture of IL2, a beam converging at IMG2, the image surface periphery (NA2= $n*\sin \theta 2$, where n is the index of refraction of the ambient atmosphere of the wafer 18) is larger than NA1, the numerical aperture of IL1, a beam converging in IMG1, the image surface center (NA1=$n*\sin \theta 1$, where n is the index of refraction of the ambient atmosphere of the wafer 18). Here, we will assume that the light intensity distributions of the light beams IL1 and IL2 are uniform. Generally speaking, when isolated line pattern images are being formed, a beam with a larger numerical aperture (larger $\sigma$ value) is capable of forming pattern images having narrower line widths. Accordingly, as shown in FIGS. 18C and 18D, the line width formed by the beam IL2, represented by P2 in FIG. 18D, is narrower than that formed by the beam IL1, represented by P1 in FIG. 18C. Thus if there is numerical aperture nonuniformity in beams incident to wafer 18 (image surface IMG) (if the beams have different numerical apertures), this condition can give rise to line width nonuniformity, even though there is illuminance uniformity within the exposure area on wafer 18 (within the image surface IMG).

In other words, if there are localized differences between the angular orientations (numerical aperture orientations) of multiple beams incident within the exposure area of the wafer 18 (within the image surface IMG) the line widths of the pattern images formed by these beams will be nonuniform.

In the present embodiment, for the beams IL1 and IL2 converging at the prescribed points IMG1 and IMG2 on the image surface IMG (the illuminated surface), the light intensity distributions within the apertures of these beams can be made essentially equal by independently adjusting the intensity distribution within the apertures (by independently adjusting the light intensity distribution in the Fourier transform plane of the illuminated surface, for points in the illuminated surface).

In order to do this, in the present embodiment, a filter 100 is provided at (or in the proximity of) a surface that is optically conjugate to the illuminated surface, for independently adjusting the light intensity distribution within the cross-section of each of the light beams corresponding to the multiple light sources formed by the fly-eye lens 7.

With conventional filtering technology, a filter has the same effect on the center of the image plane as it has on the periphery of the image plane. In the present embodiment, however, even when, for example, only one filter is used, different filtering effects can be obtained at the center and the periphery of the image plane. In the present embodiment, to accomplish this, a filter is placed in a position that is in (or in the proximity of) a location that is conjugate to the illuminated surface, and that corresponds spatially with the multiple light sources formed by the optical integrator. If the optical integrator is the above fly-eye lens, the filter is preferably placed at the entrance surface of the fly-eye lens.

A filter example will now be described with reference to FIG. 19. FIG. 19 is a drawing to describe the convergence states of beams incident to the exposure area of the wafer 18 (the image surface IMG of optical system 14).

In the example to be described (FIG. 19), only the light intensity distribution in the aperture of the beam IL2, which converges in the peripheral portion of the image surface IMG (the point IMG2), is changed. The light intensity distribution in the aperture of the beam IL1, which converges at the center portion of the image surface IMG (the point IMG1), is left as it is. FIG. 20 shows the light intensity distribution in the aperture of the light beam IL2 (the light intensity distribution to be changed). In FIG. 20, light intensity I is shown on the vertical axis, with the beam IL2 numerical aperture NA shown on the horizontal axis. This light intensity distribution within the aperture of the beam IL2 corresponds to the light intensity distribution at surfaces located such that they are optical Fourier transform planes for the image surface IMG (the aperture stops 8 and 14).

Figure 21:
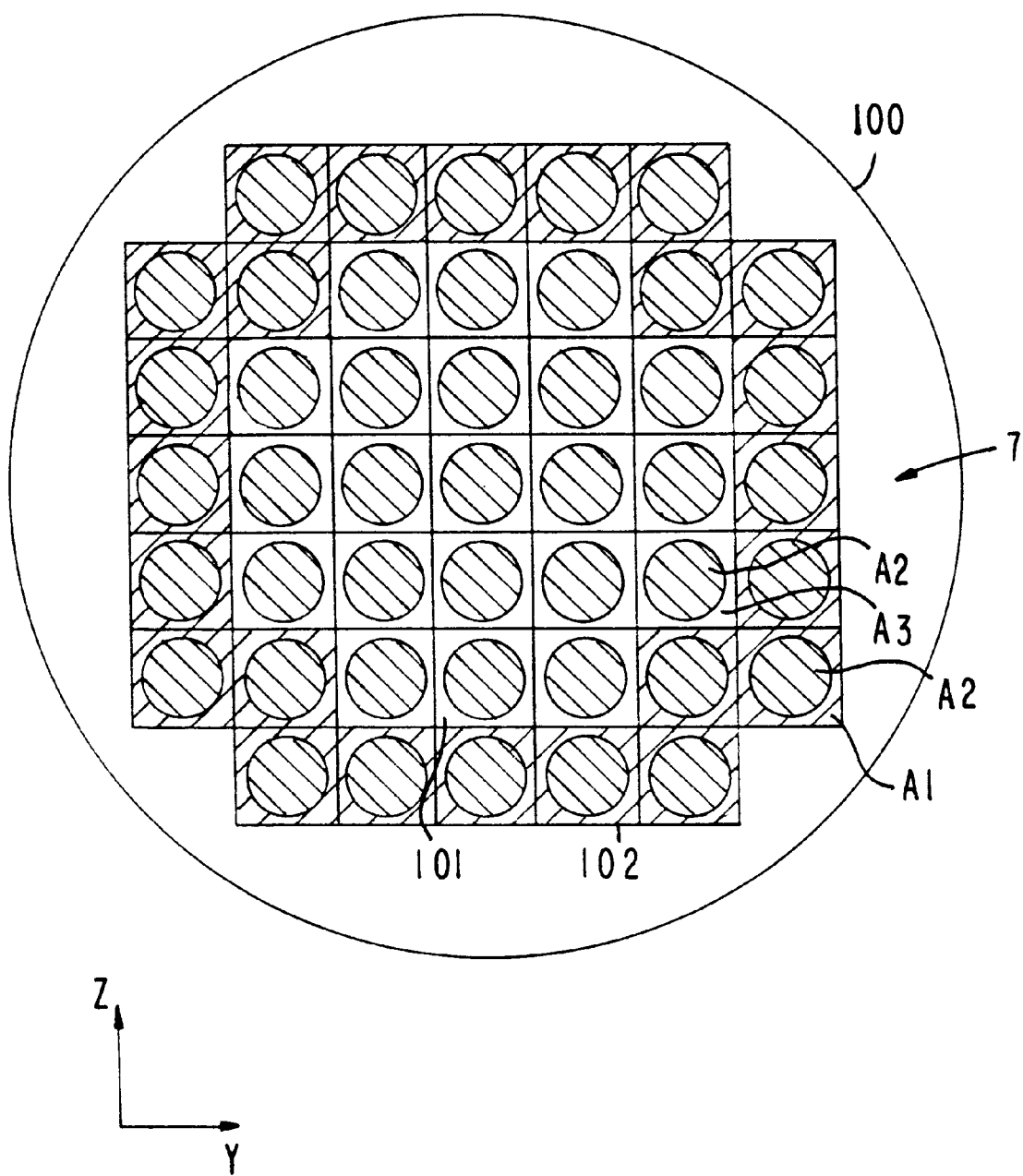
FIG. 21 shows the configuration of a filter to obtain the light intensity distribution in the aperture of a beam shown in FIG. 20.

A configuration for obtaining beams as shown in FIGS. 19 and 20 will now be described. FIG. 21 is a plan view, as viewed from the +X direction, of the filter 100, placed in (or in the proximity of) a location that is conjugate to the illuminated surface (the image surface IMG).

As shown in FIG. 21, filter 100 has multiple filter elements 101 and 102 arranged in a matrix. Moreover, each of these filter elements 101 and 102 is placed in an area that corresponds to one of the multiple lens elements that make up the fly-eye lens 7. This also means that each of these multiple filter elements 101 and 102 is placed in a position that corresponds to one of the multiple light sources formed by the fly-eye lens 7. As shown in FIG. 21, the first filter elements 101 reside in the center portion of the filter 100, and the second filter elements 102 reside in the peripheral portion of the filter 100. In other words, the first filter elements 101 correspond to those of the multiple light sources formed by the fly-eye lens 7 that are located in the center portion, and the second filter elements 102 correspond to those of the multiple light sources formed by the fly-eye lens 7 that are located in the peripheral portion.

In FIG. 21, in the filter elements 101 and 102, the areas A1, which are indicated by dark shading, are the areas with the lowest transmissivity. The areas A3, which are not shaded, have the highest transmissivity. The areas A2, indicated by light shading (coarse diagonal lines), have higher transmissivity than the areas A1, but lower transmissivity than the areas A3. Each of the filter elements 101 has an A2 area and an A3 area, and each of the filter elements 102 has an A1 area and an A2 area.

Each of the entrance surfaces of the fly-eye lens 7 is conjugate to the illuminated surface. Since each of the filter elements 101 and 102 is adjacent to one of these entrance surfaces, locations in each of the filter elements 101 and 102 necessarily correspond to locations in the illuminated surface (the image surface IMG).

For example, rays incident to location IMG1, in the center portion of the image surface, have passed through the center (areas A2) of each of the filter elements 101 and 102. Since all such rays pass through areas of the filter having the same transmissivity (A2), there will be no difference in intensity from ray to ray. Therefore, at IMG1, in the center portion of the image surface, the light intensity distribution will be the same for any position within the aperture of the beam (for any angular aperture).

On the other hand, rays incident to a location IMG2 in the upper right periphery portion of the image surface, for example, have passed though the upper right corners of each of the filter elements 101 and 102 (areas A1 and A3). In this case, because the transmissivity in the upper right corner (area A3) of a first filter element 101, located in the center portion of the filter 100, is high, a high level of intensity will be maintained in the inner portion of the beam IL2 of FIG. 19 (the portion having the smaller aperture). Conversely, because the transmissivity in the upper right corner (area A1) of a second filter element 102, located in the peripheral portion of the filter 100 is low, the intensity in the outer portion of the beam IL2 (the portion having the larger aperture) will be low. In other words, within the aperture of the beam IL2, we can obtain the light intensity distribution shown in FIG. 20, with high intensity in the center and low intensity at the periphery.

Here, as shown in FIG. 21, the transmissivity distribution for a first filter element 101 located in the center portion of the filter 100 is the inverse of the transmissivity of a second filter element 102 located in the peripheral portion. To control the only light intensity distribution in the aperture of each of the light beams (IL1 and IL2) incident at multiple locations in the illuminated surface (the image surface IMG), we need only provide the areas A1 in the second filter elements 102. If only these areas A1 were placed in the filter 100, however, beams directed at locations IMG2 in the peripheral portion of the illuminated surface (the image surface IMG) would be attenuated as they pass through areas A1 having the prescribed transmissivity. Beams directed at locations in the center portion of the illuminated surface (the image surface IMG), however, would experience no attenuation at all. This would reduce the illuminance at peripheral locations IMG2 relative to central locations IMG1. For this reason, in this example, a prescribed transmissivity is given to filter areas A2, through which all of the beams incident to the illuminated surface (the image surface IMG) pass, so that the illuminance will be constant for all locations (both central locations IMG1 and peripheral locations IMG2) of the illuminated surface (the image surface IMG). The result of this is that the transmissivity distribution characteristic of the first filter elements 101 is the inverse of that of the second filter elements 102.

As described above, then, the light intensity of a surface that is a Fourier transform plane for an illuminated surface can be changed independently for each point in the illuminated surface. This can be done by providing a filter at (or in the proximity of) a location that is conjugate to the illuminated surface, positioned in spatial correspondence with multiple light sources.

Figure 22:
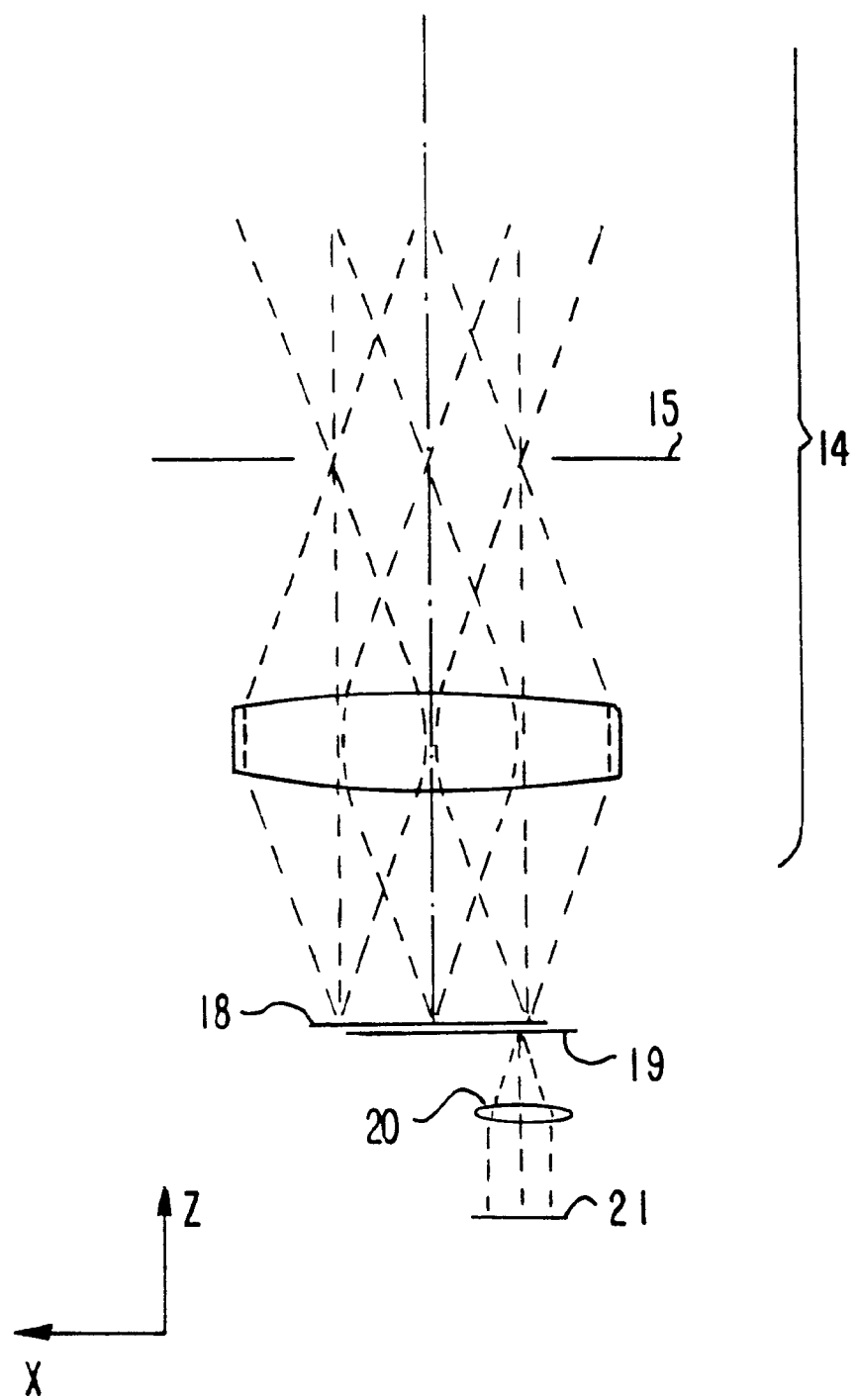
FIG. 22 shows a configuration for measuring the light intensity distribution of beams converging at an image surface.

The process of setting of the transmissivity distribution of the filter 100 will now be described with reference to FIG. 22. First, the light intensity distribution of light beams converging at the image surface IMG is measured with the filter 100 removed from the light path. In FIG. 22, a shade plate 19, which has a pinhole in it, is placed at the position of the wafer 18 (the image surface position), below which is placed a converging optical system 20. The shade plate 19 is placed so that its pinhole will be positioned at the front focal point of the converging optical system 20. The illuminance distribution of the rear focal plane 21 of the converging optical system 20 is then measured. This measurement may be performed two-dimensionally by placing a photoelectric conversion device such as a CCD at the rear focal plane 21. Another way to perform this measurement is to provide a pinhole member that is movable in the X and Y directions of the rear focal plane 21, and a sensor that senses the amount of light that passes through the pinhole member; and sensing while scanning this pinhole member-sensor combination (as a single unit) in the X and Y directions of the rear focal plane 21.

The ideal performance specifications for this converging optical system 20 call for aberration-free optics, except for distortion, and for the projection relation only, $f_{sin\ \theta}$ (instead of the normally ideal $f_{tan\ \theta}$), with 100% transmissivity, regardless of location or orientation. Since in reality, however, an ideal optical system is difficult to obtain, the measurement results may be corrected to account for deviations from the ideal system specifications of the converging optical system 20 actually used.

The reason for placing a pinhole at the front focus of the converging optical system 20 is to eliminate the effects of angular characteristics of the sensor. The reason for performing the measurement at the rear focal plane 21 is that this position is conjugate to the pupil (aperture stop). By performing the measurement at various points in the exposure objective surface 18 (the image surface IMG) we can measure the light intensity distribution in the apertures of beams converging at various points in the image surface.

Next, filter transmissivity initial settings are performed. Once the locations (in aperture angle values) to be corrected within the apertures of the converging beams have been determined, the corresponding ones of the multiple lens elements of the fly-eye lens 7 will be known; and once locations, on the image surface, of those beams are known, their positions in the entrance surface of the lens elements will be known. Then, once values required to correct the light intensity of the rays (beams) at those aperture angles have been determined, the transmissivity to be given to the above positions (areas) in the entrance surface of the lens elements will be known.

Here, by making the transmissivity of the filter 100, in areas corresponding to the portions (beam aperture angular direction and orientation in the image surface) at which higher than desired light intensities were measured such that the intensity will be reduced to the prescribed level, the light intensity distribution of beams converging at multiple points in the image surface IMG (on wafer 18) can be changed to obtain the desired distribution in beams at those points.

In the present example, the filter obtained in this manner will be referred to as an "initial settings" filter.

Next, this initial settings filter is installed in the system in the proximity of the entrance surface of the fly-eye lens 7, and the illuminance distribution over the image surface IMG (wafer 18) measured. This measurement can be performed using the configuration of FIG. 22.

Since the results obtained in this measurement represent the image surface IMG illuminance distribution with the initial settings filter installed, a correction must now be made to correct for the difference between the measured illumination distribution and the desired illumination distribution. To do this, the transmissivity distribution for filter 100 that will be required to provide this corrected illuminance distribution is computed. The applicable transmissivity distribution is found individually for each of the areas of the filter 100 corresponding to each of the lens elements of the fly-eye lens 7.

Now if the transmissivity distribution thus determined is multiplied by the transmissivity distribution of the above initial setting filter for each area of filter 100 corresponding to each of the lens elements of the fly-eye lens 7, the transmissivity distribution of the filter 100 for the proper areas (corresponding to the first and second filter elements 101, and 102, respectively) can be obtained, and consequently, the overall transmissivity distribution for the filter 100 can be established.

Moreover, the above description used an initial settings filter for convenience of explanation. In reality, however, it is preferable to perform computations equivalent to the process of fabricating an initial settings filter and using it to measure illuminance variances, as the initial filter transmissivity settings are made. This is preferable because it avoids errors that are likely to be introduced during fabrication of the initial settings filter.

We will now describe another simple filter transmissivity setting example. The following technique can be used when you know the approximate light intensity distribution of the beams converging on the illuminated surface, and the only thing that needs to correct for is the localized line width deviance in patterns formed on the wafer, due to line width nonuniformity at the reticle, for the same pattern type (line and space or isolated pattern).

First, using a reticle with the prescribed pattern, a wafer is exposed and developed. The transmissivity of a filter 100 is then set, using imaging simulation, so that the desired image will be obtained for the resulting wafer pattern. This provides an advantage in that since both the effective a value and illuminance at desired locations in the image surface (IMG) can be controlled independently, it is possible to correct for line width deviance problems that are not caused by the optics in the projection exposure system.

The above discussion stipulated that the projection exposure system use a single fly-eye lens, as in FIG. 17. It is also possible, however, to use a "double fly-eye lens" configuration. An illumination optical system that uses such a double fly-eye lens configuration is disclosed, for example, in U.S. Pat. Nos. 4,497,015, and 5,253,110. are incorporated herein by reference.

Briefly, in such illumination optical systems using a double fly-eye lens, a substantially parallel beam is supplied from a light source system, and a first fly-eye lens is inserted in this substantially parallel beam. This first fly-eye lens forms multiple light sources. The light from these multiple light sources formed by the first fly-eye lens is fed through an intermediate optical system to a second fly-eye lens. Here, the intermediate optical system superimposingly illuminates the entrance surface of the second fly-eye lens based on light from the multiple light sources formed by the first fly-eye lens. Then, based on the light from the first fly-eye lens, which it receives through the intermediate optical system, the second fly-eye lens forms additional multiple light sources. Here, images of the multiple light sources formed by the first fly-eye lens are formed at the exit surface of each of the multiple lens elements of the second fly-eye lens. The beams from the multiple light sources formed by the second fly-eye lens are then converged in a condenser optical system, to superimposingly illuminate the illuminated surface.

In such a system, when a filter 100 is provided at (or in the proximity of) the entrance surface of the second fly-eye lens (i.e., when the auxiliary optical integrator and auxiliary condenser optical system are placed between the light source system and optical integrator) the illuminance distribution on the entrance surface of the second fly-eye lens will be comparatively uniform. For example, even if there are fluctuations in the position of the calescence point of the mercury vapor lamp being used as the light source, any resulting fluctuations in the illumination distribution at this point will be minor. Accordingly, even in cases where the filter transmissivity must be set with the illuminance distribution (luminance distribution) at the entrance surface of the second fly-eye lens in the prescribed state, since any change in illuminance distribution from this prescribed state will be minor, it is possible to minimize the influence of this illuminance distribution fluctuation on the illuminance distribution in the illuminated surface (image surface), and on the states of the beams.

When the filter 100 is provided at (or in the proximity of) the entrance surface of the first fly-eye lens (i.e., when the auxiliary optical integrator and auxiliary condenser optical system are placed between the optical integrator and the condenser optical system) it is possible to supply, to the lens elements that constitute the second fly-eye lens, light beams in which the illuminance and luminance distribution are controlled. This makes it possible to independently control the images of the multiple light sources of the first fly-eye lens that are formed on the exit surface of each lens element of the second fly-eye lens, which in turn enables extremely fine control of the light intensity distribution in the apertures of beams converging on the illuminated surface.

It is also possible to use two filters 100, with one filter placed at the entrance surface of each of the two fly-eye lenses. This configuration allows both of the above advantages to be realized at the same time.

Figure 23:
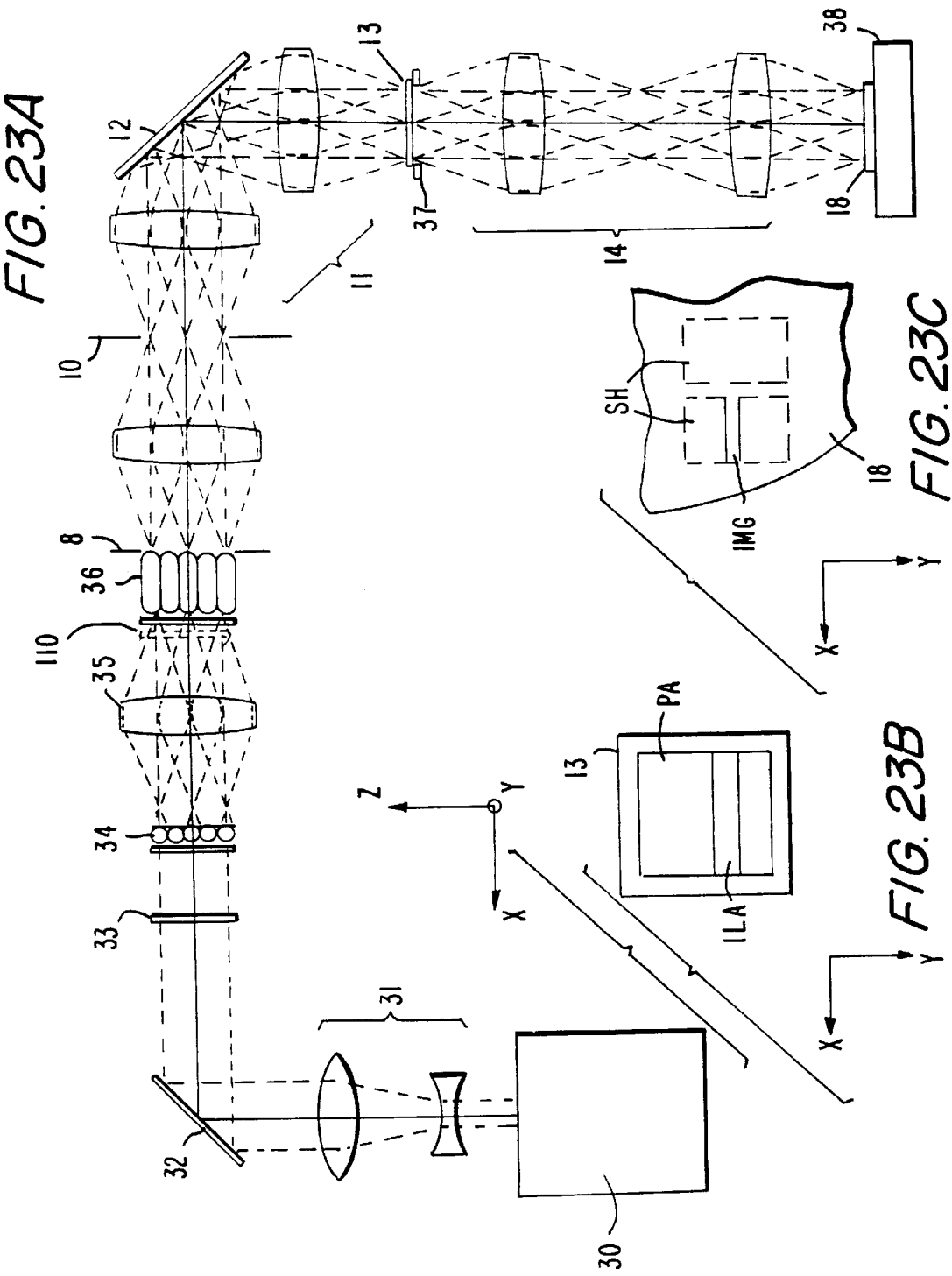
FIG. 23 shows the configuration of the projection exposure apparatus of a different embodiment of the present invention, with FIG. 23A showing the overall system, FIG. 23B showing illumination area placement, and FIG. 23C showing the relationship between an image and the shot areas on a wafer.

A scanning ("step-and-scan") type of projection exposure system is one in which the projection original (the pattern mask) and substrate are both scanned relative to the projection optical system, as the exposure is performed. A scanning projection exposure system will be discussed next, with reference to FIG. 23. FIG. 23A shows an example of a scanning projection exposure system, FIG. 23B is a drawing of the illuminated area as formed on the reticle 13, and FIG. 23C shows the placement of shot areas SH and the image surface IMG of the optical system 14, formed on the wafer 18.

In FIG. 23A, the light source 30 is an excimer laser light source that supplies laser light of a prescribed wavelength (e.g., a KrF laser, $\lambda$=248 nm). An ArF ($\lambda$=193 nm) or $F_2$ ($\lambda$=157 nm) excimer laser may also be used for light source 30. Light from this light source 30 passes through a beam shaping optical system 31 (comprising a beam expander, anamorphic optics, etc.) which performs beam shaping as required to obtain a beam of the prescribed cross-sectional shape, after which it becomes incident, via a light path deflection mirror 32, to a birefringent prism member 33. Here, for the beam-shaping optics, the system disclosed, for example, in Japanese Patent Kokai (laid open application) No. H8-293461 (U.S. patent application Ser. No. 08/626,382, filed Mar. 29, 1996), in which the applicant is the same as in this application, may be used. Also, for the birefringent prism member, one such as disclosed in Japanese Patent Kokai No. H3-16114 or H3-254114 (U.S. Pat. No. 5,253,110) in which the applicant is the same as in this application, may be used. The above U.S. patent application Ser. No. 08/626,382 is incorporated herein by reference.

Having passed through the birefringent prism member 33, the light beam then becomes incident to a first fly-eye lens 34, which is constructed by integrating a number of lens elements. Multiple light source images are formed in space at the exit end of the first fly-eye lens 34. The light from each of these multiple source images is converged by the intermediate optical system 35 to arrive in a superimposed state at the entrance surface of a second fly-eye lens 36, placed immediately following the intermediate optical system 35. The second fly-eye lens 36 is a lens constructed by integrating multiple lens elements having entrance cross-sections that are geometrically similar in shape to an illumination area ILA formed on the reticle 13. This second fly-eye lens 36 forms, at its exit end, multiple light source images, based on light, from the first fly-eye lens 34, that has passed through the intermediate optical system 35. An aperture stop ($\sigma$ stop) 8 is placed near the position of the multiple light source images formed by the second fly-eye lens 36. The aperture of this aperture stop 8 is made so that its shape can be adapted to correspond to the shape required in the illumination method used to illuminate the reticle 13 (ring-band illumination, four-pole deformation illumination, small $\sigma$ illumination, large $\sigma$ illumination, etc.). After passing through the aperture of the aperture stop 8, the light is converged by a first condenser lens group 9, to superimposingly illuminate a field stop 10, positioned at the rear focus of the first condenser lens group 9. The shape of the aperture of this field stop 10 is geometrically similar to the shape of the illumination area ILA on the reticle 13 (FIG. 23B). After passing through the field stop 10, the light passes through a second condenser lens group 11, to illuminate the area within the boundary of the illumination area ILA on the reticle 13. In the example of FIG. 23, a light path deflection mirror 12 is installed within the second condenser lens group 11.

The reticle 13 is loaded on a reticle stage 37, which, during a scan exposure operation, moves, for example, in the +Y direction of the drawing. This causes the illumination area ILA to be scanned in the Y direction of FIG. 23B (which shows the placement of the illumination area ILA on the reticle 13) across the pattern area PA of reticle 13 (the area in which the circuit pattern is formed).

Returning now to FIG. 23A, after passing through the illumination ILA on reticle 13, the light passes through a projection objective lens 14 to become incident upon a wafer 18, placed on a wafer stage 38. As shown in FIG. 23C (which shows the placement of the shot areas SH), an image of the pattern in the illumination area ILA is formed on the image surface IMG, which is in a conjugate relationship with the illumination area ILA.

During scan exposure, the wafer stage 38 moves in the −Y direction of FIG. 23. On the wafer 18, this causes the image area IMG to scan relative to the wafer 18. A shot area SH is formed on the wafer 18 by this scanning. The pattern in the entire pattern area PA of the reticle 13 is exposure-transferred to this shot area. Once the scan-exposure of one shot area SH is complete, the wafer stage 38 is moved in, for example, the +X direction, and a scan-exposure of a separate shot area is performed.

We will now consider the case wherein, in a step-and-scan projection exposure system such as the above, the intensity distributions within the apertures of the beams converging at the image surface IMG at a number of points along the scan direction (±Y direction) of the image surface IMG are different.

Here, since the pattern image actually transferred is formed by the superimposition of the beams along the scan direction, the amount of influence of the different intensity distributions on the pattern image actually transferred corresponds to the integral of these beams. Therefore to employ the above embodiment of the present invention in a scan-type exposure system, the transmissivity distribution of the filter 100 would be set such that the distribution obtained by taking the integral of the light intensity distributions in the apertures of the beams converging at multiple locations along the scan direction of the image surface IMG over the length of the image surface IMG in the scan direction (the length as regulated by the field stop, which in FIG. 23C is the length of the image surface IMG in the Y direction) corresponds to (matches) the desired light intensity distribution.

The light intensity distributions of beams converging at points along the direction transverse to the scan direction (the ±X direction in the drawing) of the image surface IMG may also be set independently, the same as in the embodiment discussed earlier.

In a scanning projection exposure system such as that shown in FIG. 23, to provide the capability to adjust the intensity distribution within the apertures of beams incident to multiple locations on the image surface while maintaining the illuminance distribution at the image surface unchanged, a filter or filters 100 (100A) may be placed in the proximity of the entrance surface of at least one of the second fly-eye lens 36 or the first fly-eye lens 34.

In the above configuration, the exit surface of the fly-eye lens 36 is considered a virtual light source (referred to earlier as a secondary light source) of a Koehler illumination system. Here again, if we view the exit surface of the fly-eye lens 36 as a light source, we also see that this is equivalent to having a horizontal-vertical array of as many primary light sources as there are lens elements in the fly-eye lens.

The intensity ratios of the individual primary light sources that constitute this light source can be set as desired by changing the transmissivities of the respective constituent elements. Since doing this by working the lens elements themselves involves substantial manufacturing effort, it is preferable to use a configuration in which the transmissivity distribution is changed by a luminance correction filter 110 placed in the proximity of either the entrance surface or exit surface of the fly-eye lens 36.

Here, if we consider the fact that the entrance surface of each of the lens elements of the fly-eye lens 36 is conjugate to both the reticle 13 and the wafer 18, and that each individual point in the entrance surfaces of the lens element has a corresponding individual point in the image surface IMG, then if an illuminance correction filter 110 is placed in the proximity of the entrance surface of the fly-eye lens 36, the light intensity distribution of beams converging at the image surface can be controlled independently for each point in the image surface. This illuminance correction filter 110 may also be provided combined with the above filter 100 as a single unit. When this is done, the transmissivity distribution provided by the filter 100 corresponds to the product of its transmissivity distribution and that of the illuminance correction filter 110.

Moreover, in a projection exposure apparatus for step-and-repeat exposure (full-field exposure projection exposure apparatus), in particular, it is preferable to make the light intensity distribution within the Fourier transform plane for the illumination surface rotation symmetrical about the optical axis.

Moreover, in the projection exposure apparatus shown in FIG. 17 and FIG. 23, when the aperture shape of the aperture stop 8 is caused to be changed, there are two possible options with respect to the filter 100:

(1) Prepare a number of filters 100, each filter having the optimum characteristics for a different aperture stop aperture shape, and then inserting in the light path, the proper filter 100 for the selected shape, each time the aperture shape is changed.

(2) Set the transmissivity distribution of the filter 100 to obtain the best possible characteristics for all shapes (so as to provide average effect for each different aperture shape), and leave that filter 100 stationary in the light path regardless of the aperture shape being used.

When the first option is used, there need not necessarily be a one-to-one correspondence between filters 100 and aperture stop aperture shapes. The different aperture shapes may instead be divided into groups, and a one-to-one correspondence then established between filters 100 and groups.

For example, four-pole (eight-pole) deformation illumination aperture stops and ring-band illumination aperture stops could be considered one group, the transmissivity distribution that represents the best compromise (the best average effects for both types) determined, and this transmissivity distribution applied to a filter to be designated for use with this one group.

Also, in the above examples, a fly-eye lens formed by integrating a number of lens elements was used as the optical integrator. It would also be possible, however, to use a rod-type optical integrator (light tunnel) having a minimum of four flat inside reflective surfaces essentially parallel to the optical axis, and having uniform cross-section with respect to the direction of the optical axis. An illumination optical systems using such a rod-type integrator is disclosed, for example, in U.S. Pat. Nos. 4,918,583 and 5,646,715 which are incorporated herein by reference.

In the above illumination apparatus (exposure apparatus) described in the Official Gazette of the U.S. Patent and Trademark Office, multiple light source virtual images (multiple light sources) are formed in the proximity of the exit surface of a rod-type optical integrator by the inside reflective surfaces of the rod-type optical integrator, with placement such that the exit surface of the rod-type optical integrator is essentially conjugate with the illuminated surface. When the present invention is used in this type of illumination apparatus (exposure apparatus) that uses a rod-type optical integrator, a thin film, having transmissivity distribution according to the angle of incidence (where the transmissivity varies with the angle of incidence), may be provided in the location of (or in the proximity of) the exit surface of the rod-type optical integrator, or in (or in the proximity of) a location conjugate to that exit surface, for controlling the light intensity distribution within the apertures of beams incident to multiple locations on the illuminated surface. Here, at (or in the proximity of) a location that is conjugate to the illuminated surface, multiple light source position data are converted to angle data. That is, at (or in the proximity of) a location conjugate to the illuminated surface, the various light beams emitted from the multiple light sources become incident beams with different angles of incidence. Now, if multiple types of thin film having different angular characteristics are provided in multiple areas of a surface at (or in the proximity of) a location conjugate to the illuminated surface, the light intensity distribution within the apertures of the multiple beams incident to the areas of the illuminated surface, corresponding to each of the multiple areas at the conjugate location can thereby be independently controlled.

There may be cases in which such controlling of the light intensity distribution within the apertures of the multiple light beams causes a change in the illumination distribution of the illuminated surface. In such cases, a filter having transmissivity distribution so as to cancel out this change in illumination distribution (not associated with angular characteristics) may be placed at (or in the proximity of) a location that is conjugate to the location of the illuminated surface, as was done in the above examples. This filter may either be provided separately, or as part of a unit that includes the above angular characteristic thin film. Thus the transmissivity distribution of the present invention includes not only distributions that have no angular characteristics, but also angle-dependent transmissivity distributions.

Figure 24:
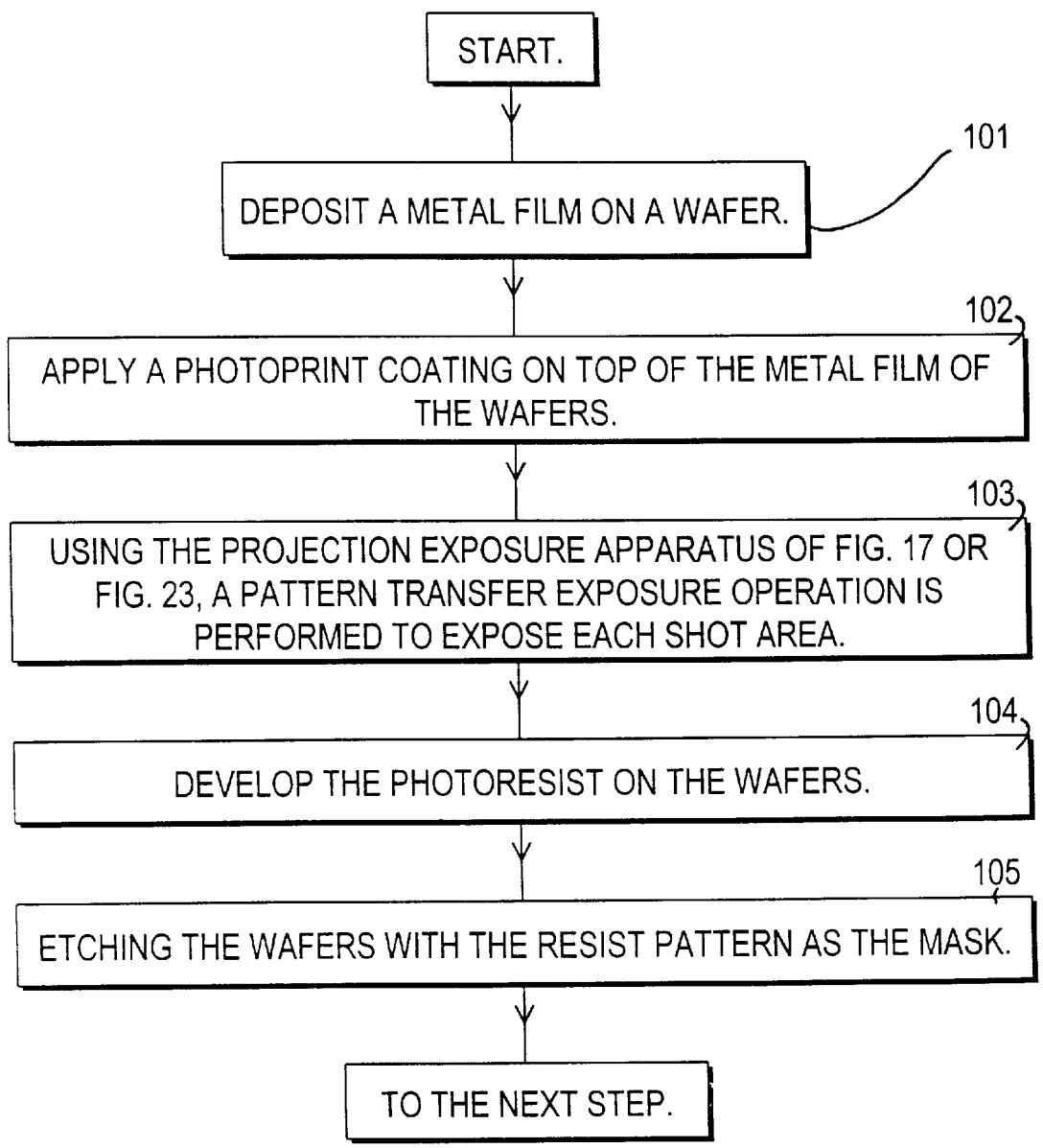
FIG. 24 is a flowchart for one example of a device manufacturing method.

In the foregoing, we have described an illumination apparatus and a projection exposure apparatus. Next, we will describe a method for manufacturing this projection exposure apparatus, with reference to the flowchart of FIG. 24.

First, in step 101, a metal film is deposited on the wafers in one lot. In the next step, step 102, a photoresist coating is applied on top of the metal film of the wafers in that one lot. Then in step 103, using the projection exposure apparatus of FIG. 17 or FIG. 23, a pattern transfer exposure operation is performed to expose each shot area, one after the other, of the wafers in the lot. Step 103 comprises the following sub-steps.

Process execution first goes to a focusing sub-step, in which the wafer stage 38, which holds the wafer 18, is moved in the direction of the optical axis of the projection optical system 14 to match the surface of the photosensitive substrate with the imaging plane of the projection optical system. After completion of the focusing sub-step, the process goes to an exposure sub-step (photolithography process). This exposure sub-step comprises a reticle setup process in which the reticle 13 is set in the objective surface of the projection optical system 14;

a substrate setup process in which the wafer 18 (the photosensitive substrate) is set in the image surface IMG of the projection optical system 14;

an alignment process in which the reticle 13 is aligned with the wafer 18; and, following the alignment process, an image transfer process in which the reticle 13 is illuminated by the illumination optical system to projection-transfer the image of the pattern of the reticle 13 through the projection optical system 14 onto the wafer 18, as the photosensitive substrate.

Next, in step 104, after developing the photoresist on the wafers of the lot, in step 105, the etching of the wafers of the lot is performed, with the resist pattern as the mask, after which resist removal is performed.

A circuit pattern corresponding to the pattern on the reticle 13 is thus formed in each shot area of each wafer. Thereafter, additional layers of circuit patterns are formed on top of the layer just formed, by repeating the above steps to complete the wafer process. In an actual fabrication process, once the wafer process is completed, dicing is performed to divide the wafer into separate chips, each with one multilayer printed circuit. Bonding is then performed to provide connections to external circuitry, and microelectronics packaging processes are performed on each chip to finalize the fabrication of the packaged (VLSI, etc.) semiconductor device.

The above description is simply one example of a wafer process that includes photolithography using exposure apparatus to fabricate semiconductor devices such as VLSI chips. Such photolithography processes using exposure apparatus may also be applied, however, in the fabrication of semiconductor devices such as liquid crystal display devices, thin-film magnetic heads, and image pickup devices (CCDs, etc.).

Two filter transmissivity setting examples will be described below as first and second working examples. To make the examples easier to understand, simplified forms of illumination distribution adjustment values and converging beam light intensity adjustment values are used. In reality, however, it is possible to generate (complex illumination distributions and converging beam light intensity distributions.

First Working Example

In the first working example, we will describe the provision of a filter to adjust the light intensity distribution of a beam IL1 (FIG. 25), incident in an area IA1 that occupies the upper left quadrant of an illuminated surface IA, by reducing the light intensity in the left half of the beam. (In the drawing, this is the half located in the −Y direction from the XZ plane including the beam center; i.e., the crosshatched portion of the beam IL1.)

First, referring to FIG. 25, we will consider the reduction of intensity of the partial beam IL1-1 of the beam IL1. The set of rays that form this partial beam IL1-1 pass through the following subareas of the fly-eye lens (the crosshatched areas of FIG. 26): SA(LE(1,2),IA1), SA(LE(1,3),IA1), SA(LE(2,1),IA1), SA(LE(2,2),IA1), SA(LE(2,3),IA1), SA(LE(3,1),IA1), SA(LE(3,2),IA1), SA(LE(3,3),IA1), SA(LE(4,1),IA1), SA(LE(4,2),IA1), SA(LE(4,3),IA1), SA(LE(5,1),IA1), SA(LE(5,2),IA1), SA(LE(5,3),IA1), SA(LE(6,2),IA1), and SA(LE(6,3),IA1).

Figure 26:
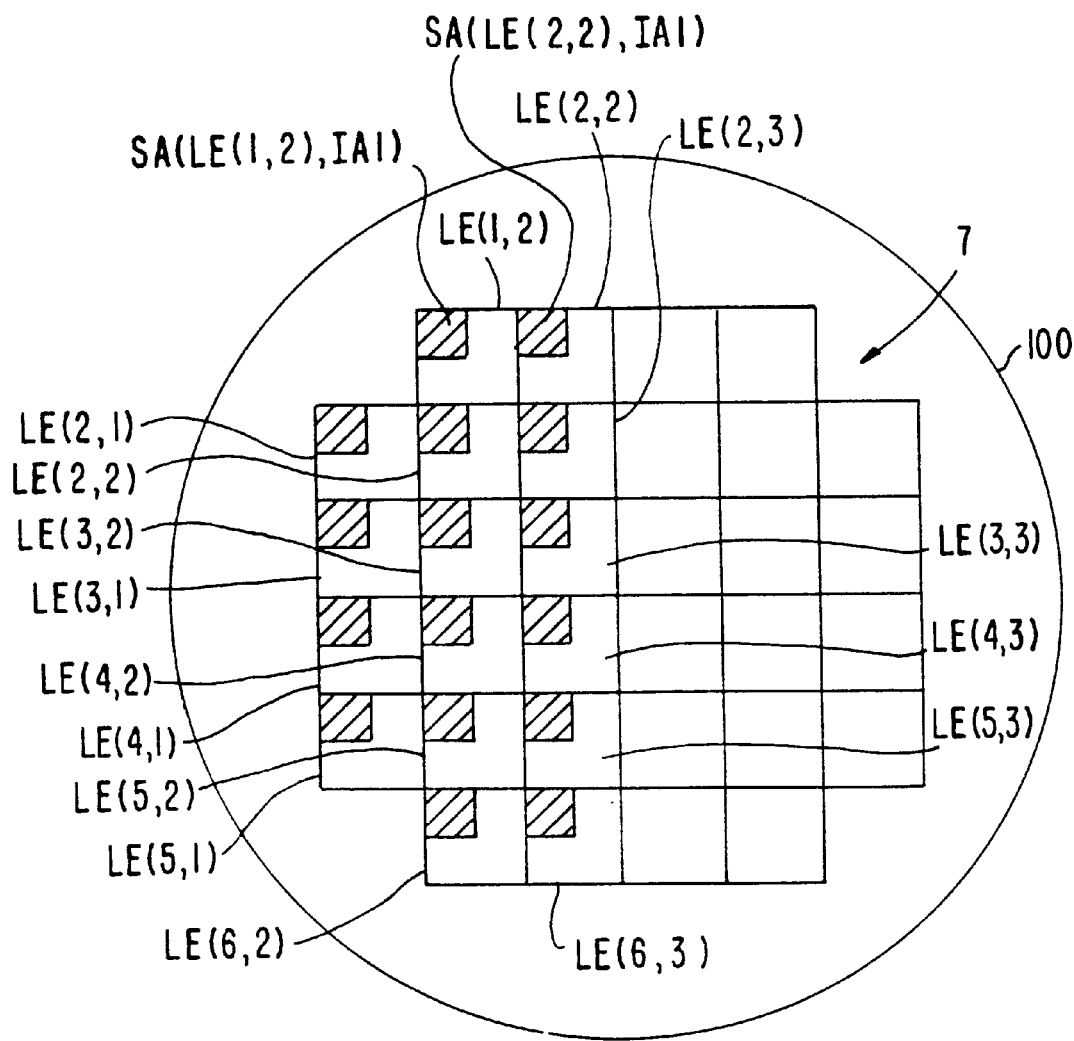
FIG. 26 shows the configuration of a filter for obtaining light intensity distribution within the aperture of a beam as shown in FIG. 25.

FIG. 26 shows the fly-eye lens 7 (of FIG. 17) as viewed through the filter 100. As shown in FIG. 26, the fly-eye lens 7 is made up of the lens elements LE(1,2), LE(1,3), LE(1,4), LE(1,5) LE(2,1), LE(2,2), LE(2,3), LE(2,4), LE(2,5), LE(2,6), LE(3,1), LE(3,2), LE(3,3), LE(3,4), LE(3,5), LE(3,6), LE(4,1), LE(4,2), LE(4,3), LE(4,4), LE(4,5), LE(4,6), LE(5,1), LE(5,2), LE(5,3), LE(5,4), LE(5,5), LE(5,6), LE(6,2,) LE(6,3), LE(6,4), and LE(6,5). For the following description, it is assumed that the optics between the filter 100 and the illuminated surface IA, which consists of the above lens elements LE(1,2) through LE(6,5) and a condenser optical system not shown in the drawings, forms an erect normal image; i.e., an image with normal lateral magnification in both X and Y directions.

Figure 27:
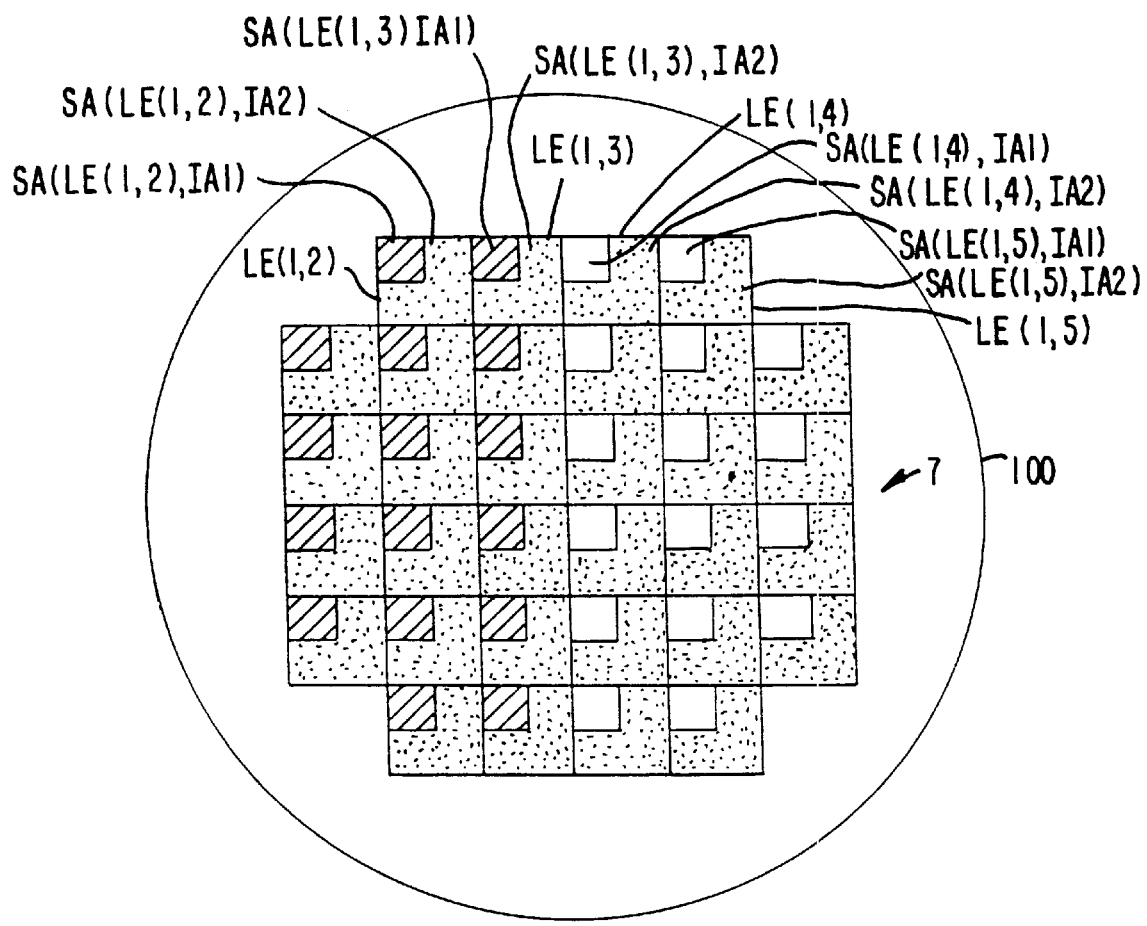
FIG. 27 shows the configuration of a filter for obtaining light intensity distribution within the aperture of a beam as shown in FIG. 25, while maintaining uniform illuminance distribution.

The light intensity of the partial beam ILL-1 of the beam IL1 incident to the area IA1 of the illuminated surface IA, can be reduced by reducing the transmissivity of the crosshatched subareas in FIG. 26, i.e., SA(LE(1,2),IA1) through SA(LE(6,3),IA1). Since this will reduce the illuminance in the area IA1 of the illuminated surface IA to less than that of the area IA2; however, the illuminance of the area IA2 will be reduced to match that of the area IA1. The illuminance in this area IA2 can be reduced by reducing the transmissivity ratio in each of the subareas SA(LE(1,2),IA2) through SA(LE(6,5),IA2) of the filter 100 corresponding to the area IA2, as shown in FIG. 27. Like FIG. 26, FIG. 27 shows the fly-eye lens 7 as viewed from its filter 100 end. FIG. 27 also uses the same coordinate system as that used in FIG. 26. In FIG. 27, T1<T2<T3, where T1 is the transmissivity of subareas SA(LE(1,2),IA1), SA(LE(1,3),IA1), SA(LE(2,1),IA1), SA(LE(2,2),IA1), SA(LE(2,3),IA1), SA(LE(3,1),IA1), SA(LE(3,2),IA1), SA(LE(3,3),IA1), SA(LE(4,1),IA1), SA(LE(4,2),IA1), SA(LE(4,3),IA1), SA(LE(5,1),IA1), SA(LE(5,2),IA1), SA(LE(5,3),IA1), SA(LE(6,2),IA1), and SA(LE(6,3),IA1); T2 is the transmissivity of subareas SA(LE(1,2),IA2) through SA(LE(6,4), IA2); and T3 is the transmissivity of SA(LE(1,4),IA1), SA(LE(1,5), SA(LE(2,4),IA1), SA(LE(2,5),IA1), SA(LE(2,6),IA1) SA(LE(3,4),IA1), SA(LE(3,5),IA1), SA(LE(3,6), IA1), SA(LE(4,4),IA1), SA(LE(4,5),IA1), SA(LE(4,6), IA1), SA(LE(5,4),IA1), SA(LE(5,5),IA1), SA(LE(5,6), IA1), SA(LE(6,4),IA1), and SA(LE(6,5),IA1).

Thus by providing a filter 100 made up of first filter elements having transmissivity T1 subareas and transmissivity T2 subareas positioned to correspond to the proper subareas of the lens elements LE(1,2), LE(1,3), LE(2,1), LE(2,2), LE(2,3), LE(3,1), LE(3,2), LE(3,3), LE(4,1), LE(4,2), LE(4,3), LE(5,1), LE(5,2), LE(5,3), LE(6,2), and LE(6,3), which correspond to the partial beam IL1-1, and second filter elements having transmissivity T2 subareas and transmissivity T3 subareas positioned to correspond to the proper subareas of the lens elements LE(1,4), LE(1,5), LE(2,4), LE(2,5), LE(2,6), LE(3,4), LE(3,5), LE(3,6), LE(4,4), LE(4,5), LE(4,6), LE(5,4), LE(5,5), LE(5,6), LE(6,4), and LE(6,5), which correspond to the partial beam IL1-2, the light intensity distribution in the apertures of only those beams incident to the area IA1 can be changed, while maintaining the illuminance in the illuminated area IA unchanged.

Next, a modified version of the first working example will be described, with reference to FIGS. 28 and 29. In this version, in addition to the configuration described above, an illumination correction filter is provided as part of the same unit that contains the filter 100. The purpose of this illumination correction filter is to establish the prescribed illumination distribution at the illuminated surface IA.

FIG. 28 illustrates the illumination distribution to be obtained in the illuminated surface IA. As shown in FIG. 28, in this version, the illuminated surface IA contains a donut-shaped area IA3 in which the illumination is less than that in the remaining area, IA4. This can be accomplished by placing, in a location conjugate to the illuminated surface IA, an illuminance correction filter having a transmissivity distribution such that the transmissivity of the area corresponding to area IA3 is higher than the transmissivity of the area corresponding to area IA4. In the filter 100, since the areas that correspond to the multiple lens elements LE(1,2) through LE(6,5) are superimposed in the illuminated area, this can be done by giving the above transmissivity distributions (transmissivity distribution in which the transmissivity of the areas that correspond to the area IA3 will be higher than the transmissivity of the areas that correspond to the area IA4) to the first and second filter elements.

Figure 29:
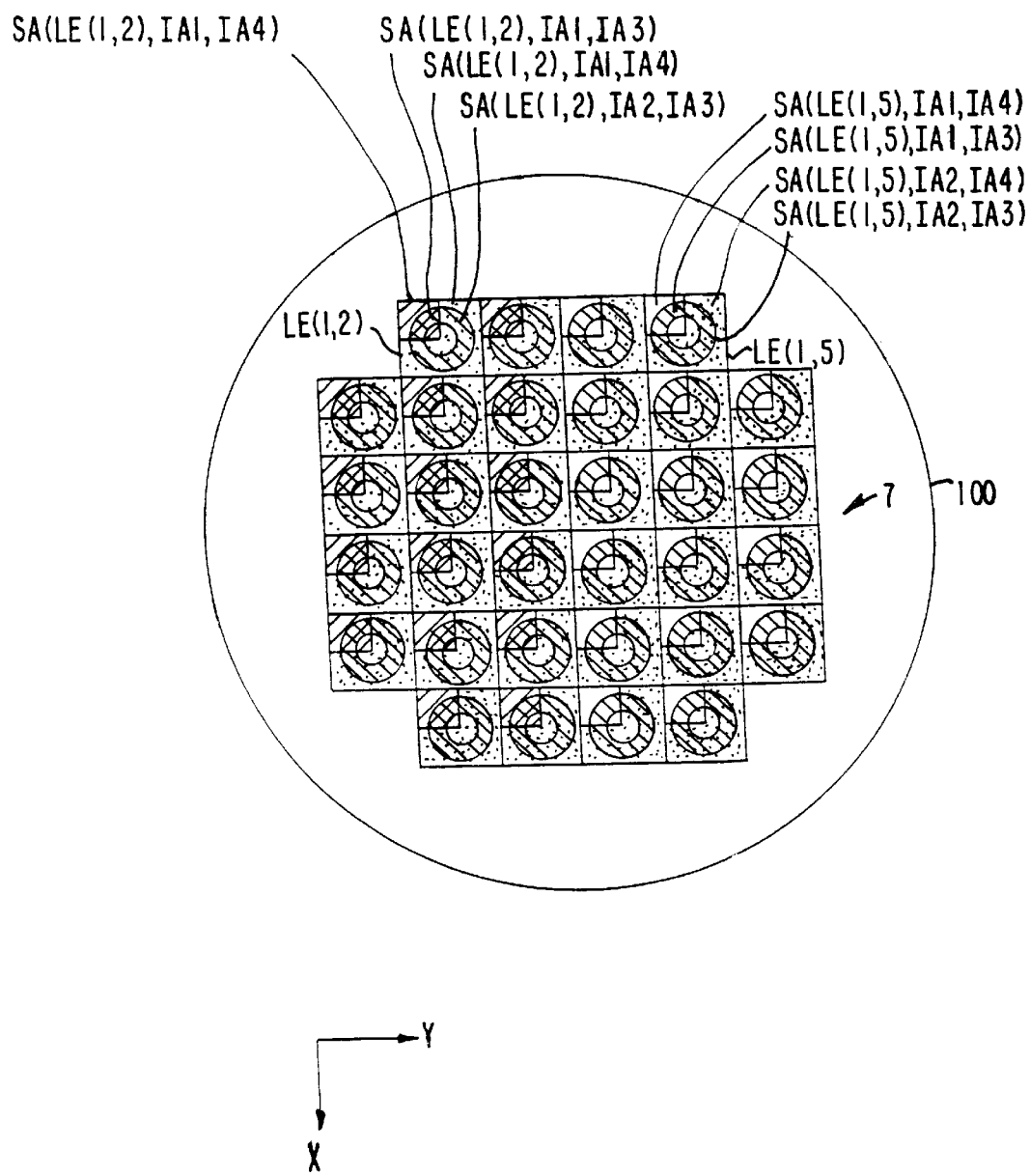
FIG. 29 illustrates the transmissivity distribution that would be required in the filter of FIG. 27, to achieve the image surface illuminance distribution shown in FIG. 28.

FIG. 29 shows the results obtained in this modified version of the first working example. FIG. 29 shows the fly-eye lens 7 as viewed from the filter 100 end. In FIG. 29, of the lens elements that constitute the fly-eye lens 7, only those portions corresponding to the lens elements LE(1,2) and LE(1,5) have their reference numbers indicated in the drawing. The portion of the filter 100 corresponding to the lens element LE(1,2), is a first filter element, and the portion of the filter 100 corresponding to the lens element LE(1,5) is a second filter element.

The first filter element at lens element LE(1,2) comprises the subarea SA(LE(1,2),IA1,IA4) having transmissivity T1, the subarea SA(LE(1,2),IA2,IA4) having transmissivity T2, the subarea SA(LE(1,2),IA1,IA3) having transmissivity T4, and the subarea SA(LE(1,2),IA2,IA4) having transmissivity T5, as shown in FIG. 29. First filter elements are placed over the lens elements that correspond to the partial beam IL1-1; i.e., LE(1,2), LE(1,3), LE(2,1), LE(2,2), LE(2,3), LE(3,1), LE(3,2), LE(3,3), LE(4,1), LE(4,2), LE(4,3), LE(5,1), LE(5,2), LE(5,3), LE(6,2), and LE(6,3).

The second filter element at lens element LE(1,5) comprises the subarea SA(LE(1,5),IA1,IA4) having transmissivity T3, the subarea SA(LE(1,5),IA2,IA4) having transmissivity T5, the subarea SA(LE(1,5),IA1,IA3) having transmissivity T6, and the subarea SA(LE(1,5),IA2,IA3) having transmissivity T7. Second filter elements are placed over the lens elements that correspond to the partial beam IL1-2; i.e., LE(1,4), LE(1,5), LE(2,4), LE(2,5), LE(2,6), LE(3,4), LE(3,5), LE(3,6), LE(4,4), LE(4,5), LE(4,6), LE(5,4), LE(5,5), LE(5,6), LE(6,4), and LE(6,5).

This makes it possible to obtain light intensity distribution in the aperture of a beam IL1 incident to the area IA1, that is different from the light intensity distribution in the apertures of beams incident to area IA2, under illumination distribution wherein, within the illuminated surface IA, the illumination of the area IA3 is reduced below that of the area IA4.

Second Working Example

Figure 30:
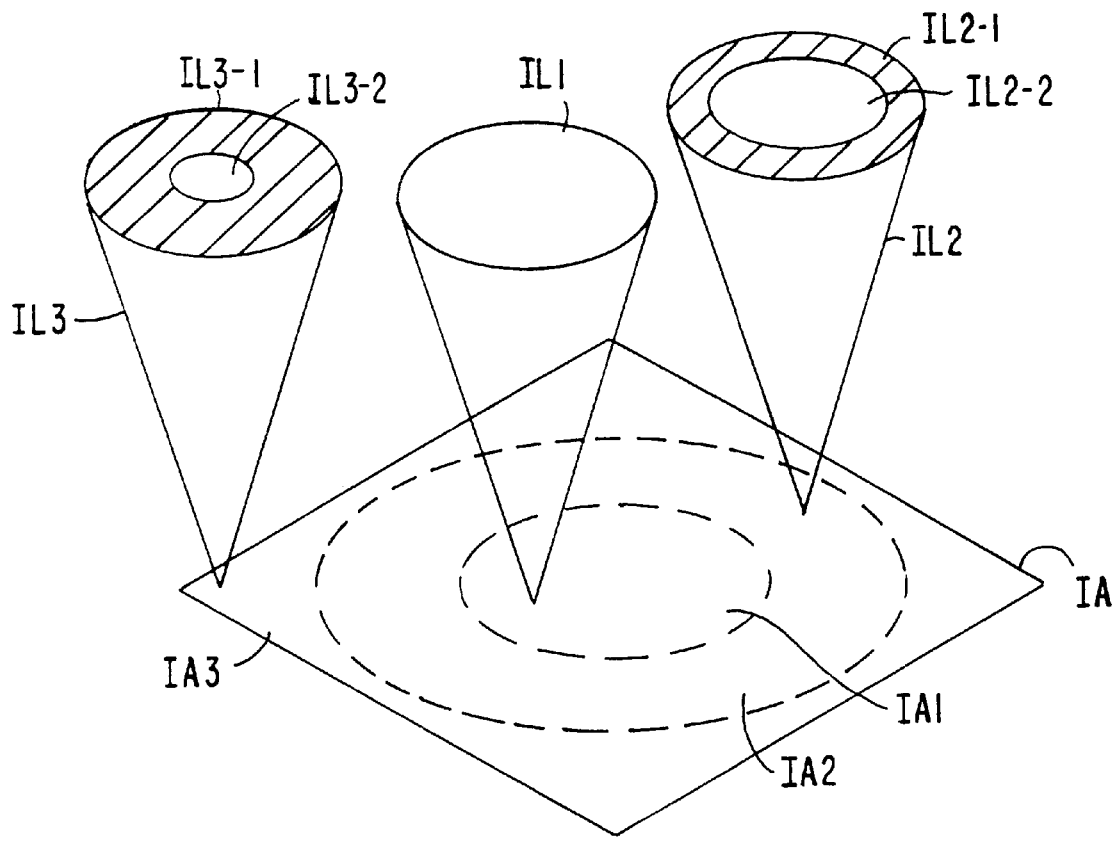
FIG. 30 is a drawing to describe the states of beams incident to the image surface.

In the second working example, as shown in FIG. 30, we will describe a case wherein the light intensity distribution within the aperture of a beam IL2 converging in an area IA2 in the intermediate portion of the illuminated surface IA is changed so as to reduce the light intensity at the outermost circumference of the beam; the light intensity distribution within the aperture of a beam IL3 converging in an area IA3 in the outer portion of an illuminated surface IA is changed so as to reduce the light intensity in an area between the intermediate portion and the outer periphery of the beam; and no change is made to the light intensity distribution within the aperture of a beam IL1 converging in an area IA1 in the center portion of an illuminated surface IA. Moreover, in this second working example, the illuminance distribution in the illuminated surface IA is maintained as is, in spite of the fact that the light intensity distributions in the apertures of the beams incident therein are changed.

In FIG. 30, the beam IL2 is made up of the partial beams IL2-1 and IL2-2. The light intensity of the partial beam IL2-1 is reduced to less than that of the partial beam IL2-2, the intensity of which is not changed. Similarly, the beam IL3 is made up of the partial beams IL3-1 and IL3-2. The light intensity of the partial beam IL3-1 is reduced to less than that of the partial beam IL3-2, the intensity of which is not changed. In the present working example, it will be assumed that the ratio by which the light intensity of the partial beam IL2-1 is reduced relative to the partial beam IL2-2 is equal to the ratio by which the light intensity of the partial beam IL3-1 is reduced relative to the partial beam IL3-2.

Figure 31:
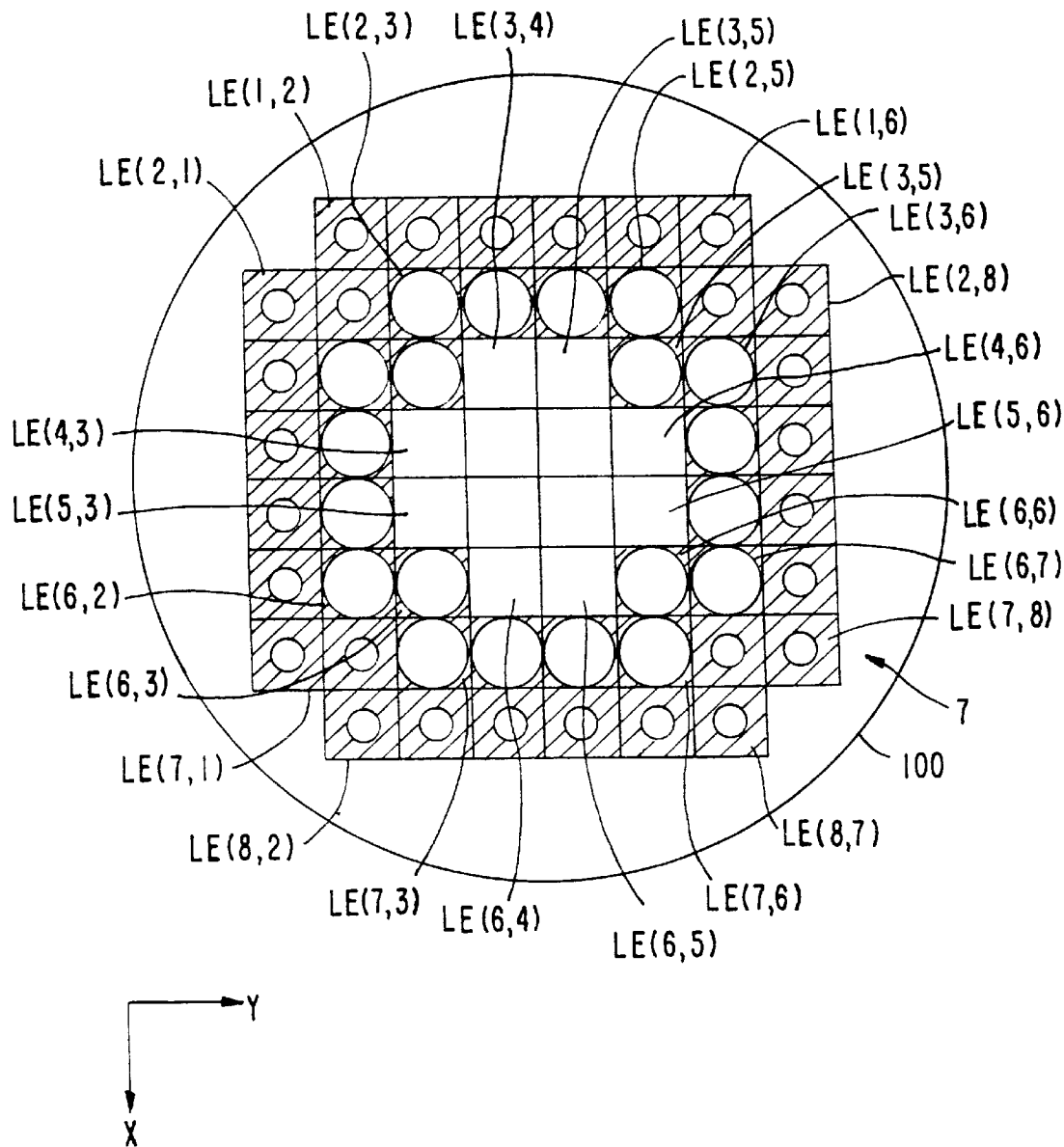
FIG. 31 illustrates the configuration of a filter for obtaining the light intensity distribution within the apertures of beams as shown in FIG. 30.

Refer to FIG. 31 for the following discussion of how the intensities of partial beams IL2-1 and IL3-1 of FIG. 30 are reduced relative to the intensities of the partial beams IL2-2, and IL3-2, respectively, of the beams IL2 and IL3. FIG. 31 shows the fly-eye lens 7 as viewed from the filter 100 end. In this second working example, the multiple lens elements that constitute the fly-eye lens 7 are lens elements LE(1,2) through LE(8,7). In the following discussion as well, it is assumed that the optics between the filter 100 and the illuminated surface IA, which consists of the above lens elements and a condenser optical system not shown in the drawings, forms an erect normal image; i.e., an image with normal lateral magnification in both X and Y directions.

In FIG. 31, of the lens elements LE(1,2) through LE(8,7), those through which the set of rays pass that form the partial beam IL2-1 are those lens elements placed in a first area, which is at the outermost periphery: LE(1,2), LE(1,3), LE(1,4.), LE(1,5), LE(1,6), LE(1,7), LE(2,1), LE(2,2), LE(2,7), LE(2,8), LE(3,1), LE(3,8), LE(4,1), LE(4,8), LE(5,1), LE(5,8), LE(6,1), LE(6,8), LE(7,1), LE(7,2), LE(7,7), LE(7,8), LE(8,2), LE(8,3), LE(8,4), LE(8,5), LE(8,6), and LE(8,7). Accordingly, in order to reduce only the intensity of the partial beam IL2-1 of the beam IL2; i.e., of those beams passing through the lens elements LE(1,2) through LE(8,7) in the above first area, and in order to reduce the intensity of only those of the beams passing through the area at the entrance surfaces of said lens elements LE(1,2) through LE(8,7) that are conjugate to the area IA2 of the illuminated surface IA, a prescribed transmissivity Ti is given to this conjugate area.

Also, of the lens elements LE(1,2) through LE(8,7), those through which the set of rays pass that form the partial beam IL3-1, are those lens elements arranged around the first area at the outermost periphery, LE(1,2), LE(1,3), LE(1,4), LE(1,5), LE(1,6), LE(1,7), LE(2,1), LE(2,2), LE(2,7), LE(2,8), LE(3,1), LE(3,8), LE(4,1), LE(4,8), LE(5,1), LE(5,8), LE(6,1), LE(6,8), LE(7,1), LE(7,2), LE(7,7), LE(7,8), LE(8,2), LE(8,3), LE(8,4), LE(8,5), LE(8,6), and LE(8,7), as well as those lens elements in a second area inside of the first area: LE,(2,3), LE(2,4), LE(2,5), LE(2,6), LE(3,2), LE(3,3), LE(3,6), LE(3,7), LE(4,2), LE(4,7), LE(5,2), LE(5,7), LE(6,2), LE(6,3), LE(6,6), LE(6,7), LE(7,3), LE(7,4), LE(7,5) and LE(7,6). Accordingly, in order to reduce only the intensity of the partial beam IL3-1 of the beam IL3; i.e., of those beams passing through the above lens elements LE(1,2) through LE(8,7), and LE(2,3) through LE(7,6), and in order to reduce the intensity of only those beams passing through the area at the entrance surfaces of said lens elements LE(1,2) through LE(8,7), and LE(2,3) through LE(7,6), that is conjugate to the area IA3 of the illuminated surface IA, a prescribed transmissivity T1 is given to this conjugate area.

Therefore, at the entrance surfaces of the lens elements placed in the first area, areas of the filter 100 corresponding to the areas IA2 and IA3 are processed to give them a transmissivity T1; and at the entrance surfaces of the lens elements placed in the second area, areas of a filter 100 corresponding to the area IA3 are processed to give them a transmissivity of T1;

When this is done, however, in the illuminated area IA, the relationship I3<I2<I1 will exist, where I1, I2, and I3, are the illuminances of the areas IA1, IA2, and IA3, respectively. To correct this (i.e. to make I1=I2=I3), transmissivity distribution at the entrance surfaces of the lens elements LE(1,2) through LE(8,7) is made such that T2<T3<T4, where:

T2 is the transmissivity of the subareas (that is, SA(LE(1,2),IA1) through SA(LE(8,7),IA1)) of a filter 100 that corresponds to areas on the lens element entrance surfaces that are conjugate to the area IA1;

T3 is the transmissivity of the subareas (that is, SA(LE(1,2),IA2) through SA(LE(8,7),IA2)) of a filter 100 that corresponds to areas on the lens element entrance surfaces that are conjugate to the area IA2; and T4 is the transmissivity of the subareas (that is, SA(LE(1,2),IA3) through SA(LE(8,7),IA3)) of a filter 100 that corresponds to areas on the lens element entrance surfaces that are conjugate to the area IA3 (i.e., such that the illuminance distribution at the illuminated surface IA will be I1=I2=I3).

Figure 32:
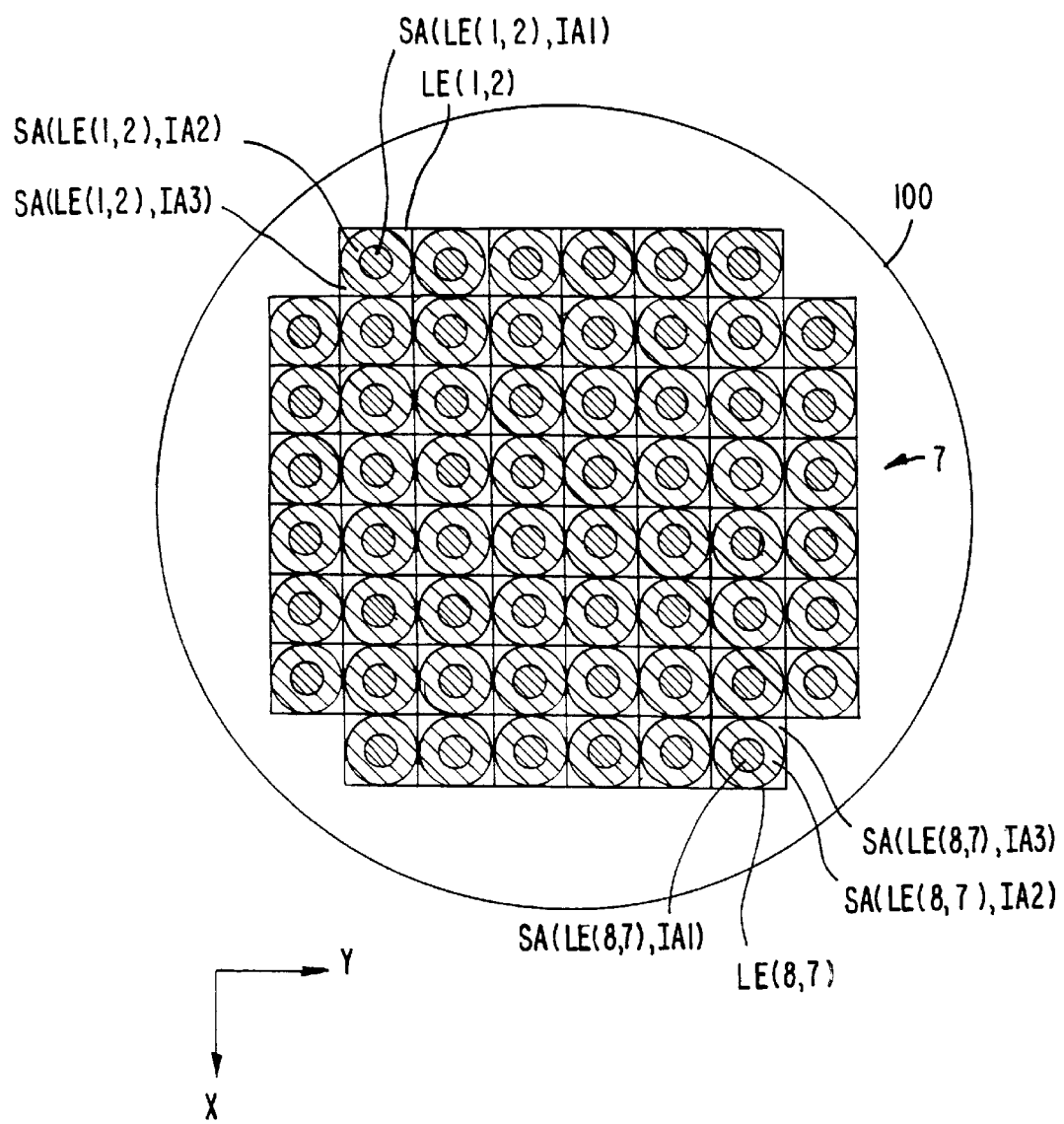
FIG. 32 shows the configuration of a filter for correcting the image surface illuminance distribution nonuniformity that would be caused by the filter in FIG. 31.
Figure 33:
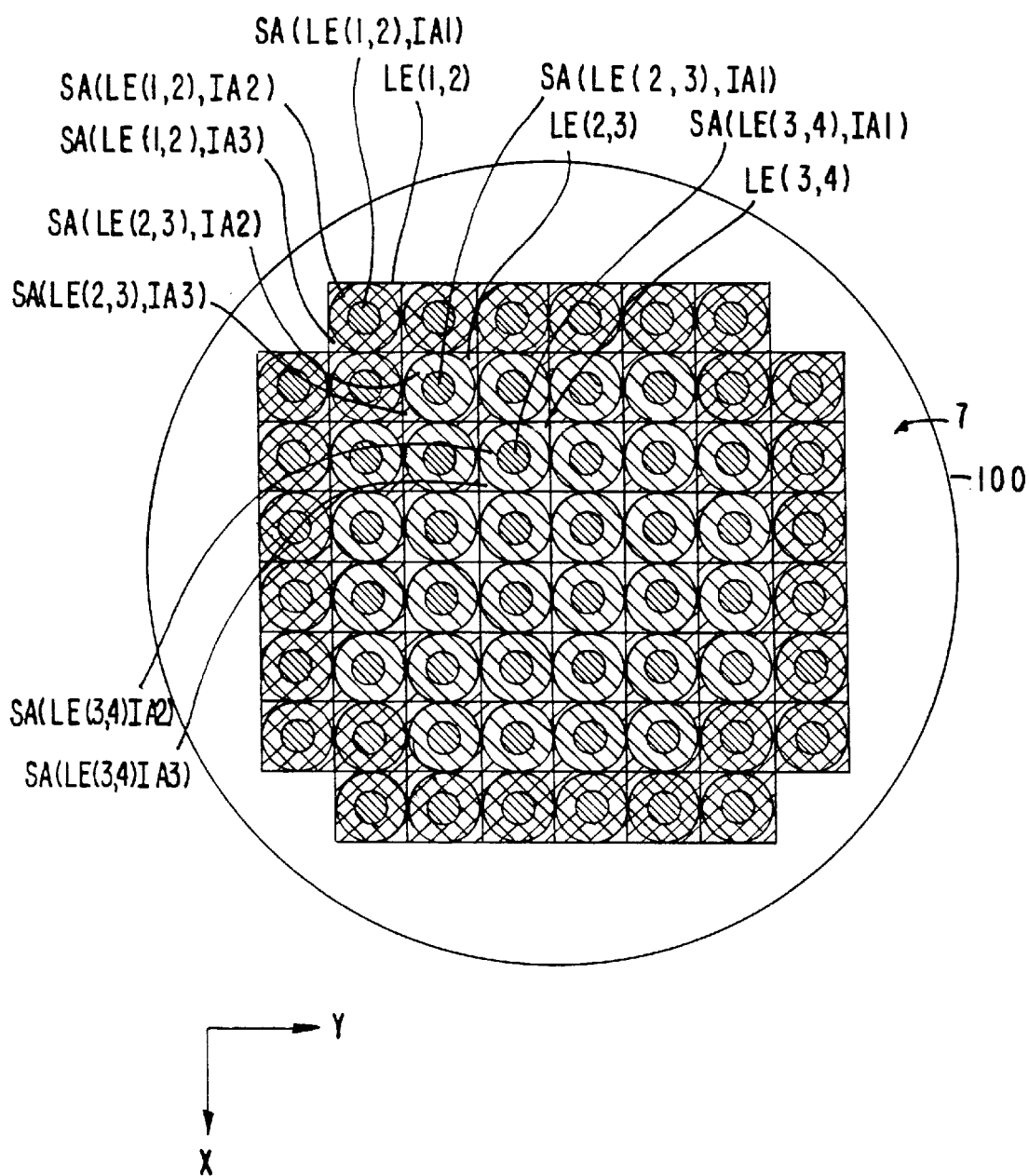
FIG. 33 shows the configuration of a filter for obtaining the light intensity distribution within the apertures of beams as shown in FIG. 30, while maintaining uniform illuminance.

The objective of the present working example can be accomplished by providing a filter 100 with transmissivity distribution corresponding to the product of the transmissivity distribution shown in FIG. 31 and the transmissivity distribution shown in FIG. 32. This distribution is illustrated in FIG. 33. FIG. 33 shows the fly-eye lens 7 as viewed from the filter 100 end. FIG. 33 also uses the same coordinate system as that used in FIGS. 31 and 32.

In FIG. 33, in the first area of the filter 100, corresponding to the lens elements LE(1,2) through LE(8,7) that are located in the first area (the outermost area), are first filter elements made up of subareas SA(LE(1,2),IA1), SA(LE(1,2),IA2), and SA(LE(1,2),IA3), placed in correspondence with their respective lens elements. In the second area of the filter 100, corresponding to the lens elements LE(2,3) through LE(7,6) that are located in the second area (the area inside the above, first area), are second filter elements made up of subareas SA(LE(2,3),IA1), SA(LE(2,3),IA2), and SA(LE(2,3),IA3), placed in correspondence with their respective lens elements. In the third area of the filter 100, corresponding to the lens elements LE(3,4) through LE(6,5) that are located in the third area (the area inside the above second area), are third filter elements made up of subareas SA(LE(3,4),IA1), SA(LE(3,4),IA2), and SA(LE(3,4),IA3), placed in correspondence with their respective lens elements.

Here, in each of the first filter elements provided in the first area, the transmissivity of the subarea SA(LE(1,2),IA1) is T2, the transmissivity of the subarea SA(LE(1,2),IA2) is T1×T3, and the transmissivity of the subarea SA(LE(1,2),IA3) is T1×T4. In each of the second filter elements provided in the second area, the transmissivity of the subarea SA(LE(2,3),IA1) is T2, the transmissivity of the subarea SA(LE(2,3),IA2) is T3, and the transmissivity of the subarea SA(LE(2,3),IA3) is T1. In each of the third filter elements provided in the third area, the transmissivity of the subarea SA(LE(3,4),IA1) is T2, the transmissivity of the subarea SA(LE(3,4),IA2) is T3, and the transmissivity of the subarea SA(LE(3,4),IA3) is T4.

In this manner, then, in the second working example as well, the light intensity distribution within the apertures of each of the beams converging in the multiple areas of the illuminated surface can be changed, while maintaining the illuminance distribution in the illuminated surface unchanged.

According to the above embodiments, the pattern line width at desired locations in the image surface can be controlled as desired, and consequently, the same line width can be obtained at any location in the image surface.

The intent in all of the above embodiments is to make the technical content of the present invention as clear as possible. The present invention is not, then, to be narrowly construed as being limited to the above embodiments. A large number of variations in the invention are certainly possible within the spirit of the invention and the scope of the patent claims.

We claim:

1. An illumination apparatus, comprising a light source system for providing a light beam along a preselected path;

an optical integrator, placed in said path of said light beam to form a plurality of light sources therefrom;

a condenser optical system, placed in the path of light beams that have passed through said plurality of light sources, said condenser optical system guiding light from said optical integrator to an illuminated surface; and a filter, placed in a location that is in an optically conjugate relationship to said illuminated surface, said filter having at least a first area corresponding to a first portion of said plurality of light sources, and a second area corresponding to a second portion of said plurality of light sources other than said first portion; wherein, said filter has at least one first filter element having a first transmissivity distribution provided over the entirety of said first area of said filter; and has at least one second filter element having a second transmissivity distribution that is the inverse of said first transmissivity distribution provided over the entirety of said second area of said filter.

2. The illumination apparatus of claim 1, wherein said optical integrator comprises a plurality of lens elements and has an entrance surface end, and said filter is placed at said entrance surface end of said optical integrator.

3. The illumination apparatus of claim 1, further comprising an auxiliary optical integrator, placed in the light path between said light source system and said optical integrator, for forming a plurality of light sources based on said light beam from said light source system; and an auxiliary condenser optical system, placed in the light path between said auxiliary integrator and said optical integrator, for guiding a light beam from said auxiliary integrator to said optical integrator.

4. The illumination apparatus of claim 3, further comprising an auxiliary filter, placed in a location that is in an optically conjugate relationship to said illuminated surface, said auxiliary filter having at least a third area corresponding to a third portion of said plurality of light sources formed by said auxiliary optical integrator and a fourth area corresponding to a fourth portion of said plurality of light sources other than said third portion; wherein, said auxiliary filter has at least one third filter element having a third transmissivity distribution provided over the entirety of said third area of said auxiliary filter; and has at least one fourth filter element having a fourth transmissivity distribution provided over the entirety of said fourth area of said auxiliary filter.

5. The illumination apparatus of claim 1, further comprising an auxiliary optical integrator, placed in the light path between said condenser optical system and said illuminated surface, for forming a plurality of light sources based on a light beam from said condenser optical system; and an auxiliary condenser optical system, placed in the light path between said auxiliary optical integrator and said illuminated surface, for guiding a light beam from said auxiliary optical integrator to said illuminated surface.

6. The illumination apparatus of claim 5, further comprising an auxiliary filter, placed in a location that is in an optically conjugate relationship to said illuminated surface, said auxiliary filter having at least a third area corresponding to a third portion of said plurality of light sources formed by said auxiliary integrator and a fourth area corresponding to a fourth portion of said plurality of light sources other than said third portion; wherein, said auxiliary filter has at least one third filter element having a third transmissivity distribution provided over the entirety of said third area of said auxiliary filter; and at least one fourth filter element having a fourth transmissivity distribution provided over the entirety of said fourth area of said auxiliary filter.

7. The illumination apparatus of claim 1, further comprising an illuminance correction filter, placed in he proximity of said filter, for making the illumination distribution on said illuminated surface uniform.

8. The illumination apparatus of claim 1, wherein said illuminated surface constitutes a plurality of microsurfaces and wherein said first and second filter elements transform the light intensity distribution in the Fourier transform planes of said microsurfaces to a prescribed light intensity distribution, independently for light converging at prescribed points on said illuminated surface, while maintaining the relative illuminance distributed over said illuminated surface.

9. The illumination apparatus of claim 8, further comprising an aperture stop with changeable aperture shape, placed in the light path between said light source system and said illuminated surface, at a location at which said plurality of light sources are formed, or at a location substantially conjugate thereto; wherein, even when said aperture shape is changed, said first and second filter elements are able to perform their transformation function.

10. A projection exposure apparatus for transferring to a substrate, a prescribed pattern provided on a mask or reticle, said apparatus comprising an illumination apparatus as recited in claim 1;

a first stage for supporting said mask or reticle;

a projection optical system for projecting said prescribed pattern onto said substrate placed at an image surface, based on light from said illumination apparatus; and a second stage for supporting said substrate; wherein said filter having said first and second filter elements is placed in a location that is conjugate to said image surface.

11. The projection exposure apparatus of claim 10, wherein said optical integrator has an entrance surface end and a plurality of lens elements, and said filter is placed at said entrance surface end of said optical integrator.

12. The projection exposure apparatus of claim 10, further comprising an auxiliary optical integrator, placed in the light path between said light source system and said optical integrator, for forming a plurality of light sources based on said light beam from said light source; and an auxiliary condenser optical system, placed in the light path between said auxiliary integrator and said optical integrator, for guiding light beams from said auxiliary integrator to said optical integrator.

13. The projection exposure apparatus of claim 12, further comprising an auxiliary filter, placed in a location that is in an optically conjugate relationship to said image surface, said auxiliary filter having at least a third area corresponding to a third portion of said plurality of light sources formed by said auxiliary optical integrator and a fourth area corresponding to a fourth portion of said plurality of light sources other than said third portion; wherein, said auxiliary filter has at least one third filter element having a third transmissivity distribution provided over the entirety of said third area of said auxiliary filter; and has at least one fourth filter element having a fourth transmissivity distribution provided over the entirety of said fourth area of said auxiliary filter.

14. The projection exposure apparatus of claim 10, further comprising an auxiliary optical integrator, placed in the light path between said condenser optical system and said first stage, for forming a plurality of light sources based on a light beam from said condenser optical system; and an auxiliary condenser optical system, placed in the light path between said auxiliary optical integrator and said first stage, for guiding a light beam from said auxiliary optical integrator to said first stage.

15. The projection exposure apparatus of claim 14, further comprising an auxiliary filter, placed in a location that is in an optically conjugate relationship to said image surface, said auxiliary filter having at least a third area corresponding to a third portion of said plurality of light sources firmed by said auxiliary optical integrator and a fourth area corresponding to a fourth portion of said plurality of light sources other than said third portion; wherein, said auxiliary filter has at least one third filter element having a third transmissivity distribution provided over the entirety of said third area of said auxiliary filter; and has at least one fourth filter element having a fourth transmissivity distribution provided over the entirety of said fourth area of said auxiliary filter.

16. The projection exposure apparatus of claim 10, further comprising an illuminance correction filter, placed in the proximity of said filter, for making the illumination distribution on said image surface uniform.

17. The projection exposure apparatus of claim 10, wherein said illuminated surface constitutes a plurality of microsurfaces and wherein said first and second filter elements transform the light intensity distribution in the Fourier transform planes of said microsurfaces to a prescribed light intensity distribution, independently for light converging at prescribed points on said image surface, while maintaining the relative illuminance distributed over said image surface.

18. The projection exposure apparatus of claim 17, further comprising an aperture stop with changeable aperture shape, placed in the light path between said light source system and said first stage, at a location at which said plurality of light sources are formed, or at a location substantially conjugate thereto; wherein, even when said aperture shape is changed, said first and second filter elements are able to perform their transformation function.

19. A device manufacturing method comprising the following steps:

a first step of coating a substrate with photosensitive material;

a second step of using the projection exposure apparatus as recited in claim 10 to project the image of said pattern of onto said substrate;

a third step of developing said photosensitive material on said substrate; and a fourth step of forming a prescribed circuit pattern on said substrate, with said photosensitive material developed in said third step as a mask.

20. An illumination apparatus comprising a light source system for supplying a light beam;

an optical integrator for forming a plurality of light sources based on said light beam from said light source;

a condenser optical system for converging beams from said plurality of light sources for illuminating an illuminated surface, said illuminated surface constituting a plurality of microsurfaces;

a filter placed in a location that is in an optically conjugate relationship to said illuminated surface, said filter having at least a first area corresponding to a first portion of said plurality of light sources, and a second area corresponding to a second portion of said plurality of light sources other than said first portion; wherein, said filter has at least one first filter element having a first transmissivity distribution provided over the entirety of said first area of said filter;

and has at least one second filter element having a second transmissivity distribution provided over the entirety of said second area of said filter; and said first and second filter elements transform the light intensity distribution in the Fourier transform planes of said microsurfaces to a prescribed light intensity distribution, independently for light converging at prescribed points on said illuminated surface, while maintaining the relative illuminance distributed over said illuminated surface.

21. The illumination apparatus of claim 20, wherein said optical integrator comprises a plurality of lens elements and has an entrance surface end, and said filter is placed at said entrance surface end of said optical integrator.

22. The illumination apparatus of claim 20, further comprising an auxiliary optical integrator, placed in the light path between said light source system and said optical integrator, for forming a plurality of light sources based on said light beam from said light source system; and an auxiliary condenser optical system, placed in the light path between said auxiliary integrator and said optical integrator, for guiding a light beam from said auxiliary integrator to said optical integrator.

23. The illumination apparatus of claim 22, further comprising an auxiliary filter, placed in a location that is in an optically conjugate relationship to said illuminated surface, said auxiliary filter having at least a third area corresponding to a third portion of said plurality of light sources formed by said auxiliary optical integrator and a fourth area corresponding to a fourth portion of said plurality of light sources other than said third portion; wherein, said auxiliary filter has at least one third filter element having a third transmissivity distribution provided over the entirety of said third area of said auxiliary filter; and has at least one fourth filter element having a fourth transmissivity distribution provided over the entirety of said fourth area of said auxiliary filter.

24. The illumination apparatus of claim 20, further comprising an auxiliary optical integrator, placed in the light path between said condenser optical system and said illuminated surface, for forming a plurality of light sources based on a light beam from said condenser optical system; and an auxiliary condenser optical system, placed in the light path between said auxiliary optical integrator and said illuminated surface, for guiding a light beam from said auxiliary optical integrator to said illuminated surface.

25. The illumination apparatus of claim 24, further comprising an auxiliary filter, placed in a location that is in an optically conjugate relationship to said illuminated surface, said auxiliary filter having at least a third area corresponding to a third portion of said plurality of light sources formed by said auxiliary integrator and a fourth area corresponding to a fourth portion of said plurality of light sources other than said third portion; wherein, said auxiliary filter has at least one third filter element having a third transmissivity distribution provided over the entirety of said third area of said auxiliary filter; and has at least one fourth filter element having a fourth transmissivity distribution provided over the entirety of said fourth area of said auxiliary filter.

26. The illumination apparatus of claim 24, further comprising an illuminance correction filter, placed in the proximity of said filter, for making the illumination distribution on said illuminated surface uniform.

27. The illumination apparatus of claim 20, having an aperture stop with changeable aperture shape, placed in the light path between said light source system and said illuminated surface, at a location at which said plurality of light sources are formed, or at a location substantially conjugate thereto; wherein, even when said aperture shape is changed, said first and second filter elements are able to perform their transformation function.

28. A projection exposure apparatus for transferring to a substrate, a prescribed pattern provided on a mask or reticle, said apparatus comprising an illumination apparatus as recited in claim 20;

a first stage for supporting said mask or reticle;

a projection optical system for projecting said prescribed pattern onto said substrate placed at an image surface, based on light from said illumination apparatus; and a second stage for supporting said substrate;

wherein said filter having said first and second filter elements is placed in a location that is conjugate to said image surface, or in the proximity of said location.

29. The projection exposure apparatus of claim 28, wherein said optical integrator has an entrance surface end and a plurality of lens elements, and said filter is placed at said entrance surface end of said optical integrator.

30. The projection exposure apparatus of claim 28, further comprising an auxiliary optical integrator, placed in the light path between said light source system and said optical integrator, for forming a plurality of light sources based on said light beam from said light source; and an auxiliary condenser optical system, placed in the light path between said auxiliary optical integrator and said optical integrator, for guiding light beams from said auxiliary optical integrator to said optical integrator.

31. The projection exposure apparatus of claim 30, further comprising an auxiliary filter, placed in a location that is in an optically conjugate relationship to said image surface, said auxiliary filter having at least a third area corresponding to a third portion of said plurality of light sources formed by said auxiliary optical integrator and a fourth area corresponding to a fourth portion of said plurality of light sources other than said third portion; wherein, said auxiliary filter has at least one third filter element having a third transmissivity distribution provided over the entirety of said third area of said auxiliary filter; and has at least one fourth filter element having a fourth transmissivity distribution provided over the entirety of said fourth area of said auxiliary filter.

32. The projection exposure apparatus of claim 28, further comprising an auxiliary optical integrator, placed in the light path between said condenser optical system and said first stage, for forming a plurality of light sources based on a light beam from said condenser optical system; and an auxiliary condenser optical system, placed in the light path between said auxiliary optical integrator and said first stage, for guiding a light beam from said auxiliary optical integrator to said first stage.

33. The projection exposure apparatus of claim 32, further comprising an auxiliary filter, placed in a location that is in an optically conjugate relationship to said image surface, said auxiliary filter having at least a third area corresponding to a third portion of said plurality of light sources formed by said auxiliary optical integrator and a fourth area corresponding to a fourth portion of said plurality of light sources other than said third portion; wherein, said auxiliary filter has at least one third filter element having a third transmissivity distribution provided over the entirety of said third area of said auxiliary filter; and has at least one fourth filter element having a fourth transmissivity distribution provided over the entirety of said fourth area of said auxiliary filter.

34. The projection exposure apparatus of claim 28, further comprising an illuminance correction filter, placed in the proximity of said filter, for making the illumination distribution on said image surface uniform.

35. The projection exposure apparatus of claim 28, having an aperture stop with changeable aperture shape, placed in the light path between said light source system and said first stage, at a location at which said plurality of light sources are formed, or at a location substantially conjugate thereto; wherein, even when said aperture shape is changed, said first and second filter elements are able to perform their transformation function.

36. A device manufacturing method comprising the following steps:

a first step of coating a substrate with photosensitive material;

a second step of using the projection exposure apparatus as recited in claim 28 to project the image of said pattern onto said substrate;

a third step of developing said photosensitive material on said substrate; and a fourth step of forming a prescribed pattern on said substrate, with said photosensitive material developed in said third step as a mask.

37. An illumination apparatus, comprising a light source system;

an optical integrator, positioned so as to be able to receive a light beam from said light source system, for forming a plurality of light sources based on said light beam;

a condenser optical system, positioned so as to be able to receive light beams that have passed through said plurality of light sources, for converging light beams from said plurality of light sources, for illuminating an illuminated surface;

a first filter, placed in a location that is in an optically conjugate relationship to said illuminated surface, said first filter having a transmissivity distribution such as to transform the light intensity distribution in the Fourier transform planes of microsurfaces constituting said illuminated surface, independently, for light converging at prescribed points on said illuminated surface, to prescribed light intensity distributions; and a second filter, placed in a location that is in an optically conjugate relationship to said illuminated surface, said second filter having transmissivity distribution for correcting at least nonuniformity of relative illumination distributed over said illuminated surface caused by the transmissivity distribution of said first filter.

38. The illumination apparatus of claim 37, wherein said first filter and said second filter are provided in a single unit.

39. A method of manufacturing a projection exposure apparatus for projecting, onto a substrate, a prescribed pattern formed on a mask or reticle, comprising the following steps:

a first step of guiding a light beam from a light source through an optical integrator for forming a plurality of light sources based on said light beam, a condenser optical system for converging light from said optical integrator, for illuminating said mask or reticle, a projection optical system for forming, on a prescribed image surface, an image of said pattern on said mask or reticle, and onto an image surface of said projection optical system;

a second step of measuring the relative illuminance distributed on said image surface, and measuring, in the Fourier transform planes of the microsurfaces that constitute said image surface, the light intensity distributions for light converging at at least two points on said image surface;

a third step of placing in a location that is in an optically conjugate relationship to said image surface, a filter having at least a first area corresponding to a first portion of said plurality of light sources, and a second area corresponding to a second portion of said plurality of light sources other than said first portion; and a fourth step of providing, over the entirety of said first area of said filter, at least one first filter element having a first transmissivity distribution, while also providing, over the entirety of said second area of said filter, at least one second filter element having a second transmissivity distribution;

wherein, in said fourth step, said first and second transmissivity distributions are set so as to maintain said relative illuminations distributed in said image surface substantially uniform, while transforming said light intensity distributions, independently, to prescribed light intensity distributions.

40. A method of manufacturing a projection exposure apparatus for projecting, onto a substrate, a prescribed pattern formed on a mask or reticle, comprising the following steps:

a first step of simulating the guiding of a light beam from a light source through
   an optical integrator for forming a plurality of light sources based on said light beam,
   a condenser optical system for converging light from said optical integrator, for illuminating said mask or reticle,
   a projection optical system for forming, on a prescribed image surface, an image of said pattern on said mask or reticle, and
   onto the image surface of said projection optical system;

a second step of computing the relative illuminations distributed in said image surface, and computing the light intensity distribution in the Fourier transform planes of the microsurfaces that constitute said image surface, for light converging at at least two points on said image surface, based on the results obtained in said simulation of said first step;

a third step of setting in a location that is in an optically conjugate relationship to said image surface, a filter having at least a first area corresponding to a first portion of said plurality of light sources, and a second area corresponding to a second portion of said plurality of light sources other than said first portion; and a fourth step of setting, over the entirety of said first area of said filter, at least one first filter element having a first transmissivity distribution, while also setting, over the entirety of said second area of said filter, at least one second filter element having a second transmissivity distribution;

wherein, in said fourth step, said first and second transmissivity distributions are set so as to maintain said relative illuminations distributed in said image surface substantially uniform, while transforming said light intensity distributions, independently, to prescribed light intensity distributions.

* * * * *